(12) United States Patent
Woo et al.

(10) Patent No.: US 10,134,606 B2
(45) Date of Patent: Nov. 20, 2018

(54) METHOD OF FORMING PATTERNS AND METHOD OF MANUFACTURING INTEGRATED CIRCUIT DEVICE USING THE SAME

(71) Applicant: Samsung Electronics Co., Ltd., Suwon-si (KR)

(72) Inventors: Sang-yoon Woo, Gwangmyeong-si (KR); Hyun-woo Kim, Seongnam-si (KR); Ju-hyung An, Hwaseong-si (KR); Jin-young Yoon, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/712,920

(22) Filed: May 15, 2015

(65) Prior Publication Data

US 2015/0340246 A1 Nov. 26, 2015

(30) Foreign Application Priority Data

May 20, 2014 (KR) ........................ 10-2014-0060484

(51) Int. Cl.

| H01L 21/027 | (2006.01) |
| H01L 21/3213 | (2006.01) |
| G03F 7/16 | (2006.01) |
| G03F 7/20 | (2006.01) |
| G03F 7/32 | (2006.01) |
| G03F 7/34 | (2006.01) |
| G03F 7/039 | (2006.01) |
| G03F 7/09 | (2006.01) |
| H01L 21/033 | (2006.01) |
| H01L 21/308 | (2006.01) |
| H01L 21/311 | (2006.01) |
| H01L 27/108 | (2006.01) |

(52) U.S. Cl.
CPC ...... *H01L 21/32139* (2013.01); *G03F 7/0392* (2013.01); *G03F 7/091* (2013.01); *G03F 7/16* (2013.01); *G03F 7/20* (2013.01); *G03F 7/2041* (2013.01); *G03F 7/32* (2013.01); *G03F 7/34* (2013.01); *H01L 21/0273* (2013.01); *H01L 21/0276* (2013.01); *H01L 21/0332* (2013.01); *H01L 21/3081* (2013.01); *H01L 21/31144* (2013.01); *H01L 27/10894* (2013.01)

(58) Field of Classification Search
CPC ............. H01L 21/0276; H01L 21/0273; H01L 21/3081; G03F 7/091
USPC ........................................................ 430/317
See application file for complete search history.

(56) References Cited

U.S. PATENT DOCUMENTS

| 6,013,547 | A * | 1/2000 | Liaw ................. H01L 21/76895 |
| | | | 257/E21.507 |
| 7,709,187 | B2 * | 5/2010 | Patel ................... G03F 7/70466 |
| | | | 430/311 |
| 8,697,338 | B2 | 4/2014 | Bae et al. |
| 2010/0190106 | A1 | 7/2010 | Tsubaki |
| 2012/0021355 | A1 | 1/2012 | Kim et al. |
| 2012/0276483 | A1 | 11/2012 | Ogihara et al. |
| 2013/0115559 | A1 | 5/2013 | Bae et al. |
| 2013/0171825 | A1 | 7/2013 | Xu |
| 2013/0189836 | A1 | 7/2013 | Brock et al. |
| 2013/0244180 | A1 | 9/2013 | Bae et al. |
| 2013/0260311 | A1 | 10/2013 | Chang |
| 2013/0280912 | A1 | 10/2013 | Ogihara et al. |

FOREIGN PATENT DOCUMENTS

| EP | 2486453 B1 * | 1/2014 | ............. G03F 7/091 |
| JP | 2008-304719 | 12/2008 | |
| JP | 2010-181892 | 8/2010 | |
| KR | 10-0907898 | 1/2009 | |
| KR | 10-2012-0126715 | 11/2012 | |

\* cited by examiner

*Primary Examiner* — Daborah Chacko-Davis
(74) *Attorney, Agent, or Firm* — Muir Patent Law, PLLC

(57) ABSTRACT

A method of forming patterns may use an organic reflection-preventing film including a polymer having an acid-liable group. A photoresist film is formed on the organic reflection-preventing film. A first area selected from the photoresist film is exposed to generate an acid in the first area. Hydrophilicity of a first surface of the organic reflection-preventing film facing the first area of the photoresist film may be increased. The photoresist film including the exposed first area is developed to remove a non-exposed area of the photoresist film. The organic reflection-preventing film and a target layer are anisotropically etched by using the first area of the photoresist film as an etch mask.

37 Claims, 28 Drawing Sheets

METHOD OF FORMING PATTERNS AND METHOD OF MANUFACTURING INTEGRATED CIRCUIT DEVICE USING THE SAME

CROSS-REFERENCE TO RELATED APPLICATION

This application claims the benefit of Korean Patent Application No. 10-2014-0060484, filed on May 20, 2014, in the Korean Intellectual Property Office, the disclosure of which is incorporated herein in its entirety by reference.

BACKGROUND

The present disclosure relates to a method of forming patterns and a method of manufacturing an integrated circuit device, and in particular, to a method of forming a fine pattern by using a photolithography process using a reflection-preventing film, and a method of manufacturing an integrated circuit device by using the method.

Various exposing technologies and patterning technologies for forming fine patterns have been introduced to a process of manufacturing ultra large scale integrated semiconductor devices. As semiconductor devices are more highly integrated and a design rule is more reduced, reducing an exposure wavelength and/or increasing a resolution may make it difficult to form a plurality of fine patterns that are repeatedly formed in a fine pitch in a limited area.

SUMMARY

The present disclosure provides a method of manufacturing semiconductor devices. The method may comprise forming patterns such as a plurality of fine patterns that are repeatedly formed in a fine pitch in a limited area.

The present disclosure also provides a method of manufacturing an integrated circuit device including a plurality of fine patterns that are repeatedly formed in a fine pitch in a limited area, wherein an adhesive force of a resist pattern, which is used as an etch mask in forming a plurality of fine patterns, with respect to a film disposed thereunder is improved so that fine patterns having a desired shape are obtained without the collapse of the resist pattern.

According to an aspect of the present disclosure, there is provided a method of forming patterns. In some examples, the method comprises forming an organic reflection-preventing film including a polymer having an acid-labile group on a to-be-etched film. A photoresist film including a photoacid generator (PAG) may be formed on the organic reflection-preventing film. A first area selected from the photoresist film is exposed to generate an acid in the first area. Hydrophilicity of a first surface of the organic reflection-preventing film facing the first area of the photoresist film may be increased by using the acid. The photoresist film having the exposed first area may be developed to remove a non-exposed area therefrom. The organic reflection-preventing film and the to-be-etched film are anisotropically etched by using the first area of the photoresist film as an etch mask.

The increasing hydrophilicity of the first surface may include deprotecting the polymer by removing the acid-labile group in the first surface of the organic reflection-preventing film by using an acid generated from the PAG.

In the developing, a negative tone developer may be used to remove the non-exposed area of the photoresist film.

After the developing, a surface of the photoresist film has a first contact angle with respect to deionized water and a surface of the organic reflection-preventing film has a second contact angle with respect to deionized water, wherein a difference between the first contact angle and the second contact angle may be in a range of −5° to +5° or in the range of −3° to +3°.

The polymer of the organic reflection-preventing film may include a repeating unit including an acrylate derivative having an acid-labile group.

The polymer of the organic reflection-preventing film may include at least one repeating unit having an acid-labile group, and an amount of the at least one repeating unit having the acid-labile group may be in a range of 1 to 40 mol % based on a total amount of the polymer. The acid-labile group may be selected from the group consisting of tert-butoxycarbonyl (t-BOC), isonorbornyl, 2-methyl-2-adamantyl, 2-ethyl-2-adamantyl, 3-tetrahydrofuranyl, 3-oxocyclohexyl, γ-butyllactone-3-yl, mavaloniclactone, γ-butyrolactone-2-yl, 3-methyl-γ-butyrolactone-3-yl, 2-tetrahydropyranyl, 2-tetrahydrofuranyl, 2,3-propylenecarbonate-1-yl, 1-methoxyethyl, 1-ethoxyethyl, 1-(2-methoxyethoxy)ethy), 1-(2-acetoxyethoxy)ethyl, t-butoxycarbonylmethyl, methoxymethyl, ethoxymethy), trimethoxysily), and triethoxysilyl.

The organic reflection-preventing film may include a polymer having a protecting group substituted with fluorine.

The organic reflection-preventing film may be comprised, for example, of at least one of a polymer having a first repeating unit having an acid-labile group, a polymer having a second repeating unit having an acrylate derivative substituent, a polymer having a third repeating unit having a protecting group substituted with a fluorine, and a polymer having a fourth repeating unit having a chromophore group having an aromatic group. The organic reflection-preventing film may be comprised of at least one selected from a cross-linking agent, an acid generator, and a base.

The exposing may be performed by immersion lithography or at various exposure wavelengths.

In the developing of the photoresist film, at least a portion of a portion of the organic reflection-preventing film exposed by the removal of the non-exposed area of the photoresist film may not be removed by the developing.

After the developing of the photoresist film, prior to the anisotropic etching of the organic reflection-preventing film and the to-be-etched film, a portion of the organic reflection-preventing film remains to cover the to-be-etched film at least enough to keep an upper surface of the to-be-etched film from being exposed to the outside.

According to another aspect of the present disclosure, there is provided a method of forming patterns. In the method, an organic reflection-preventing film including a polymer having an acid-labile group and having a first contact angle with respect to deionized water is formed on a to-be-etched film. A photoresist film having a second contact angle with respect to deionized water is formed on the organic reflection-preventing film. Hydrophilicity of a first surface of the organic reflection-preventing film facing a first area selected from the photoresist film is increased by exposing the first area of the photoresist film. An opening exposing the organic reflection-preventing film is formed by removing a non-exposed area of the photoresist film.

The increasing of hydrophilicity in the first surface may include deprotecting the polymer by removing the acid-labile group from the polymer included in the organic reflection-preventing film. The increasing of hydrophilicity of the first surface may result in a hydrophilicity similar to that of the first area of the photoresist film.

The organic reflection-preventing film may include a polymer represented by

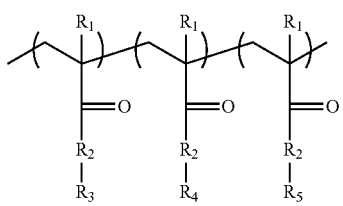

and a polymer represented by

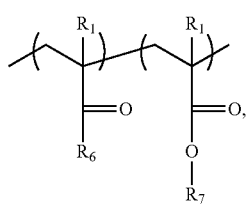

wherein R₁ may be a hydrogen (H) or a methyl group (—CH₃),

R₂ may be sulfur (S), O, or NH,
R₃ may be a heterocyclic group including S,
R₄ may be a hydroxyl group (—OH),
R₅ may be a phenyl group,
R₆ may be a hydroxyl group (—OH) or a methoxy group (—OCH₃), and
R₇ may be a deprotecting group.

The organic reflection-preventing film may further include a polymer represented by

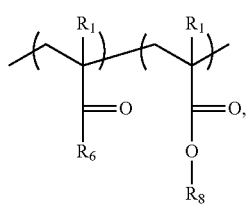

wherein R₈ may be a fluoro group.

The organic reflection-preventing film may include a polymer obtained from at least one of monomers represented by

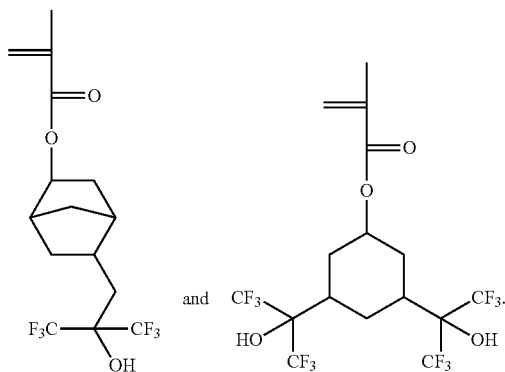 [SMILES: C=C(C)C(=O)OC1CC2CC1CC2CC(O)(C(F)(F)F)C(F)(F)F ; C=C(C)C(=O)OC1CC(C(O)(C(F)(F)F)C(F)(F)F)CC(C(O)(C(F)(F)F)C(F)(F)F)C1]

The polymers may be prepared to form an organic reflection-preventing film, the preparation comprising three different reaction processes. Thereafter, a product of the first reaction process, a product of the second reaction process, and a product of the third reaction process may be polymerized to obtain the polymers.

An amount of the polymer including the acid-labile group in the organic reflection-preventing film may be in a range of 1 to 40 mol % based on a total polymer amount of the organic reflection-preventing film. In this range and after the forming of the opening exposing the organic reflection-preventing film, the normalized thickness of the organic reflection-preventing film may have a value above 0.58 in a dose range between at least 3 to 13 mJ/cm².

In the forming of the opening, a negative tone developer is used to remove a non-exposed area of the photoresist film, and the organic reflection-preventing film has a first solubility with respect to the negative tone developer, and the first solubility may be smaller than a second solubility of the photoresist film with respect to the negative tone developer.

According to another aspect of the present disclosure, there is provided a method of forming patterns. In the method, an organic reflection-preventing film including an acid-labile group is formed on a to-be-etched film. A photoresist film covering the organic reflection-preventing film is formed. Hydrophilicity of a first surface of a first portion of the organic reflection-preventing film may be changed in such a way that the hydrophilicity of the first surface is different from hydrophilicity of a second surface of a second portion of the organic reflection-preventing film, by exposing a portion of the photoresist film. A non-exposed area of the photoresist film may be removed by using a developer to form an opening exposing the organic reflection-preventing film. The organic reflection-preventing film and the to-be-etched film may be anisotropically etched through the opening In the changing of hydrophilicity of the first surface, hydrophilicity of the first surface may be increased.

The changing of hydrophilicity of the first surface may include deprotecting the polymer by removing the acid-labile group in the first surface of the organic reflection-preventing film by using an acid generated from the photoresist film by exposing the photoresist film. The photoresist film may be formed of a positive-type photoresist and include a resin of which polarity increases due to the action of the acid.

According to another aspect of the present disclosure, there is provided a method of manufacturing an integrated circuit device. In the method, a to-be-etched film may be formed on a substrate having an active area. A mask layer may be formed on the to-be-etched film. A reflection-preventing film is formed on the mask layer. A photoresist film may be formed on the reflection-preventing film. Hydrophilicity of a first surface of a first portion of the reflection-preventing film may be changed in such a way that the hydrophilicity of the first surface may be different from hydrophilicity of a second surface of a second portion of the organic reflection-preventing film by exposing a first area of the photoresist film. A non-exposed area of the photoresist film may be removed by using a developing solution to form a photoresist pattern exposing the reflection-preventing film. A fine pattern from the to-be-etched film may be formed by anisotropically etching the exposed reflection-preventing film and the to-be-etched film by using the photoresist pattern as an etch mask.

The photoresist film may include a photoacid generator (PAG), and the reflection-preventing film may include an organic reflection-preventing film including a polymer having an acid-labile group. An inorganic reflection-preventing film further may further be disposed beneath the organic reflection-preventing film.

The changing of hydrophilicity of the first surface may include increasing hydrophilicity of the first surface by deprotecting the polymer by removing the acid-labile group in the first surface by using an acid generated in the first area by exposing the photoresist film.

In the forming of the fine pattern, a conductive fine pattern having a line-and-space pattern shape may be formed.

The forming of the fine pattern may include forming the conductive fine pattern having a hole exposing the active area, and after the formation of the conductive fine pattern, the hole may be filled with a conductive layer to form a contact connected to the active area.

DETAILED DESCRIPTION OF THE EMBODIMENTS

Figure 1A:
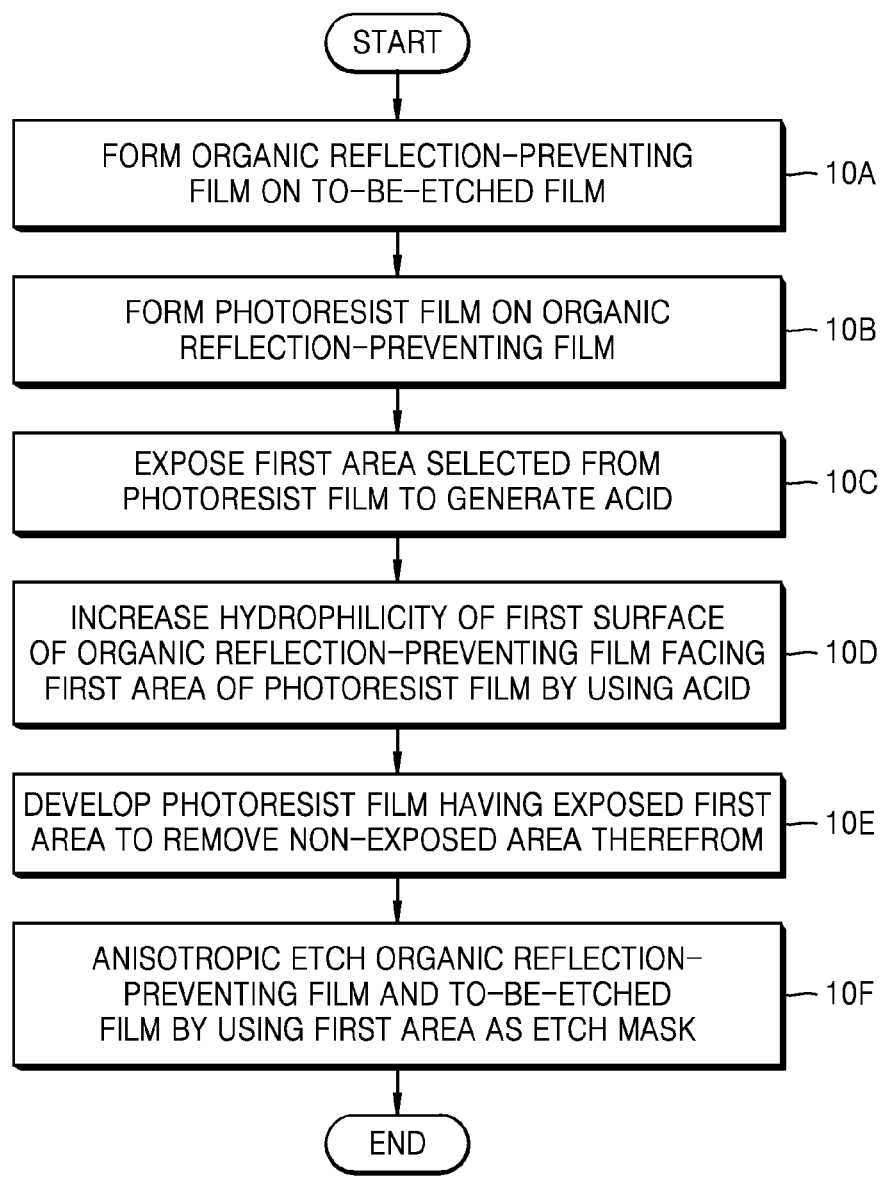
FIG. 1A is a flowchart illustrating an exemplary method of forming patterns according to an embodiment of the present disclosure.

The inventive concept will now be described more fully hereinafter, for example with reference to the accompanying drawings. The same reference numerals are used to denote the same elements in the drawings, and repeated descriptions thereof are omitted.

This invention may be, however, embodied in different forms and should not be construed as limited to the embodiments set forth herein.

It will be understood that, although the terms first, second, etc. may be used herein to describe various elements, areas, layers, portions, and/or constituents, these elements, areas, layers, portions, and/or constituents should not be limited by these terms. These terms do not refer to specific orders, up/down positions, or superiority/inferiority but are only used to distinguish one element, area, portion, or constituent, from another element, area, portion, or constituent. Thus, a first element, area, portion, or constituent discussed below could be termed a second element, area, portion, or constituent without departing from the teachings of the present disclosure. For example, without departing from the scope of the present disclosure, a first constituent may be named as a second constituent, and similarly, the second constituent may be named as the first constituent.

Unless otherwise defined, all terms (including technical and scientific terms) used herein are to be interpreted as is customary in the art to which this invention belongs. It will be further understood that terms in common usage should also be interpreted as is customary in the relevant art and not in an overly formal sense unless expressly so defined herein.

It should also be noted that in some alternative implementations, operations may be performed out of the sequences depicted in the flowcharts. For example, two operations shown in the drawings to be performed in succession may in fact be executed substantially concurrently or even in reverse of the order shown, depending upon the functionality/acts involved.

As such, variations from the shapes of the illustrations as a result, for example, of manufacturing techniques and/or tolerances, are to be expected. Thus, embodiments of the present disclosure should not be construed as limited to the particular shapes of areas illustrated herein but are to include deviations in shapes that result, for example, from manufacturing.

FIG. 1A is a flowchart illustrating a method of forming patterns according to an embodiment of the present disclosure.

Referring to FIG. 1A, in process 10A, an organic reflection-preventing film is formed on a target layer, such as a to-be-etched film.

In some embodiments, the target layer may be a semiconductor substrate. In some embodiments, the target layer may include a semiconductor substrate and a conductive film, a dielectric film, an insulating film, or a combination which is disposed on the semiconductor substrate. For example, the target layer may comprise a film of, e.g. metal, alloy, metal carbide, metal nitride, metal oxynitride, metal oxycarbide, semiconductor, polysilicon, oxide, nitride, oxynitride, or a combination thereof, but the inventive concept is not limited thereto. The to-be-etched film may also be referred to as a target layer.

The organic reflection-preventing film may control scattering of light emitted from a light source used in an exposing process for manufacturing an integrated circuit device. In some embodiments, the organic reflection-preventing film may absorb light reflected by a substrate disposed thereunder. It will be recognized that some light reflected by the substrate may not be absorbed by the organic reflection-preventing film. For example, in some embodiments approximately 99% or more of the light may be absorbed by the organic reflection-preventing film.

In some embodiments, the organic reflection-preventing film may include a polymer having a first repeating unit having an acid-labile group.

The acid-labile group may be selected from the group consisting of tert-butoxycarbonyl (t-BOC), isonorbornyl, 2-methyl-2-adamantyl, 2-ethyl-2-adamantyl, 3-tetrahydrofuranyl, 3-oxocyclohexyl, γ-butyllactone-3-yl, mavalonic-lactone, γ-butyrolactone-2-yl, 3-methyl-γ-butyrolactone-3-yl, 2-tetrahydropyranyl, 2-tetrahydrofuranyl, 2,3-propylenecarbonate-1-yl, 1-methoxyethyl, 1-ethoxyethyl, 1-(2-methoxyethoxy)ethy), 1-(2-acetoxyethoxy)ethyl, t-butoxycarbonylmethyl, methoxymethyl, ethoxymethy), trimethoxysily), and triethoxysilyl.

The first repeating unit may be included in an amount of about 1 to about 40 mol % based on a total polymer amount of the organic reflection-preventing film.

In the organic reflection-preventing film, the first repeating unit having the acid-labile group may increase hydrophobicity of the organic reflection-preventing film.

In some embodiments, the organic reflection-preventing film may include a polymer having a second repeating unit having an acrylate derivative substituent containing a hydroxyl group (—OH). In some embodiments, the second repeating unit may be included in the same polymer that includes the first repeating unit.

In some embodiments, the organic reflection-preventing film may include a polymer having a third repeating unit having a protecting group substituted with a fluorine. In some embodiments, the third repeating unit may be included in the same polymer that includes the first and/or second repeating unit.

In some embodiments, the organic reflection-preventing film may include a polymer having a fourth repeating unit having a chromophore group having an aromatic group. For example, the chromophore group of the fourth repeating unit may be phenyl, chrysene, pyrene, fluoroanthrene, anthrone, benzophenone, thioxanthone, or anthracene. In some embodiments, the fourth repeating unit may be included in the same polymer that includes the first, second and/or third repeating unit. In some embodiments, the second, third, and fourth repeating units may be included in the same polymer that includes the first repeating unit. Alternatively, each of the first, second, third and fourth repeating units may be included in different respective polymers.

The organic reflection-preventing film may further include a cross-linking agent, a surfactant, or the like.

The cross-linking agent may be linked to a backbone of a polymer included in the organic reflection-preventing film. The cross-linking agent may include a material that allows cross-linking of a polymer in the presence of an acid. In some embodiments, the cross-linking agent may include a $C_4$ to $C_{50}$ hydrocarbon compound having two or more double bonds at an end thereof. For example, the cross-linking agent may be selected from a resin containing at least one of melamine, methylols, glycoluril, polymeric glycolurils, benzoguanamine, urea, hydroxyl alkyl amide, epoxy, epoxy amine resin, blocked isocyanates, and divinyl monomers, but the inventive concept is not limited thereto. In some embodiments, the cross-linking agent may include a fluorine-containing or fluorine-free organic alcohol, or an epoxide substituent.

An amount of the first repeating unit having the acid-labile group in the organic reflection-preventing film may be controlled such that when in the subsequent process 10E, a previously exposed photoresist film may be developed in a negative-tone manner to remove a non-exposed area of the photoresist film. At least a portion of the organic reflection-preventing film disposed under the non-exposed area of the photoresist film may remain without being developed. For example, an amount of the first repeating unit in the organic reflection-preventing film may be in a range of about 1 to about 40 mol % based on the total polymer amount of the organic reflection-preventing film.

To form the organic reflection-preventing film according to the process 10A of FIG. 1A, a composition for forming the organic reflection-preventing film is provided on the to-be-etched film, and then, heated to induce a cross-linking reaction of polymers included in the composition.

In some embodiments, the composition may include a polymer having the first repeating unit including an acid-labile group, a polymer having the second repeating unit having an acrylate derivative substituent having a hydroxyl group (—OH), a cross-linking agent, an acid generator, and a solvent.

In some embodiments, the composition may further include at least one of a polymer having the third repeating unit having a protecting group substituted with a fluorine, and a polymer having the fourth repeating unit including a chromophore group.

The cross-linking agent may include at least one selected from the above-described materials.

The acid generator may include a thermoacid generator (TAG) or a photoacid generator (PAG).

The TAG may include an aliphatic compound or an alicyclic compound. For example, the TAG may include at least one compound selected from carbonate ester, sulfonate ester, and phosphate ester. The TAG may include at least one compound selected from cyclohexyl nonafluorobutanesulfonate, norbornyl nonafluorobutanesulfonate, tricyclodecanyl nonafluorobutanesulfonate, adamantyl nonafluorobutanesulfonate, cyclohexyl nonafluorobutane carbonate, norbornyl nonafluorobutanecarbonate, tricyclodecanyl nonafluorobutane carbonate, adamantyl nonafluorobutane carbonate, cyclohexyl nonafluorobutanephosphonate, norbornyl nonafluorobutanephosphonate, tricyclodecanyl nonafluorobutanephosphonate, and adamantyl nonafluorobutanephosphonate.

The PAG may generate an acid when exposed to light emitted from at least one selected from a KrF eximer laser (248 nm), a ArF eximer laser (193 nm), a $F_2$ eximer laser (157 nm), an extreme ultraviolet (EUV) light machine (13.5 nm), and the like. The PAG may be selected from, for example, triarylsulfonium salts, diaryliodonium salts, sulfonates, and mixtures thereof. For example, the PAG may be selected from triphenylsulfonium triflate, triphenylsulfonium antimonate, diphenyliodonium triflate, diphenyliodonium antimonate, methoxydiphenyliodonium triflate, di-t-butyldiphenyliodonium triflate, 2,6-dinitrobenzyl sulfonate, pyrogallol tris(alkylsulfonates), N-hydroxysuccinimide triflate, norbornene-dicarboximidetriflate, triphenylsulfonium nonaflate, diphenyliodonium nonaflate, methoxydiphenyliodonium nonaflate, di-t-butyldiphenyliodonium nonaflate, N-hydroxysuccinimide nonaflate, norbornene-dicarboximidenonaflate, triphenylsulfonium perfluorobutanesulfonate, triphenylsulfonium perfluorooctanesulfonate (PFOS), diphenyliodonium (PFOS), methoxydiphenyliodonium (PFOS), di-t-butyldiphenyliodonium triflate, N-hydroxysuccinimide (PFOS), norbornene-dicarboximide (PFOS), and a mixture thereof.

The solvent may include either an organic solvent that may typically be used in a resist composition, or a mixture including the organic solvent. In some embodiments, the solvent may include at least one selected from ether, alcohol, glycolether, an aromatic hydrocarbon compound, ketone, and ester. For example, the solvent may be selected from ethyleneglycolmonomethylether, ethyleneglycolmonoethylether, methylcellosolveacetate, ethylcellosolve acetate, diethyleneglycolmonomethylether, diethyleneglycolmonoethylether, propyleneglycol, propyleneglycolmonomethylether, propyleneglycolmonomethyletheracetate, propyleneglycolmonoethylether, propyleneglycolmonoethyletheracetate, propyleneglycolpropyletheracetate, propyleneglycolmonobutylether, propyleneglycolmonobutyletheracetate, toluene, xylene, methylethylketone, cyclopentanone, cyclohexanone, 2-hydroxyethylpropionate, 2-hydroxy-2-methylethylpropionate, ethoxyethylacetate, hydroxyethylacetate, 2-hydroxy-3-methylmethylbutanate, 3-methoxymethylpropionate, 3-methoxyethyl propionate, 3-ethoxyethylpropionate, 3-ethoxymethylpropionate, methylpyruvate, ethyl pyruvate, ethylacetate, butylacetate, ethyllactoate, butyllactoate, and the like. These solvents may be used alone or in combination of two or more of these.

In some embodiments, an amount of a solvent may be controlled such that the solid content in the composition used to prevent the reflection is in a range of about 3 to about 20 wt. %.

In some embodiments, the composition may further include at least one selected from a base and a surfactant.

The base may include aromatic amine, aliphatic amine, or cyclic aliphatic amine. In some embodiments, the base may further include at least one of primary amine, secondary amine, and tertiary amine. For example, the base may include triethanol amine, triethyl amine, tributyl amine, tripropyl amine, hexamethyl disilazan, or a combination thereof, but the inventive concept is not limited thereto.

In some embodiments, the organic reflection-preventing film may include at least one polymer selected from a polymer represented by Formula 1, a polymer represented by Formula 2, and a polymer represented by Formula 3:

[Formula 1]

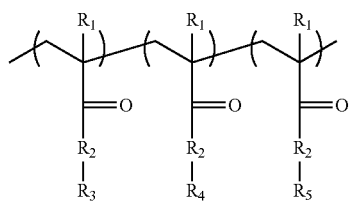

In Formula 1, $R_1$ is a hydrogen (H) or a methyl group (—$CH_3$), $R_2$ is S, O, or NH, $R_3$ is a heteroring-containing sulfur (S), $R_4$ is a group containing a hydroxyl group (—OH), and $R_5$ is a group containing a phenyl group.

$R_3$ in Formula 1 may have any one of structures illustrated below:

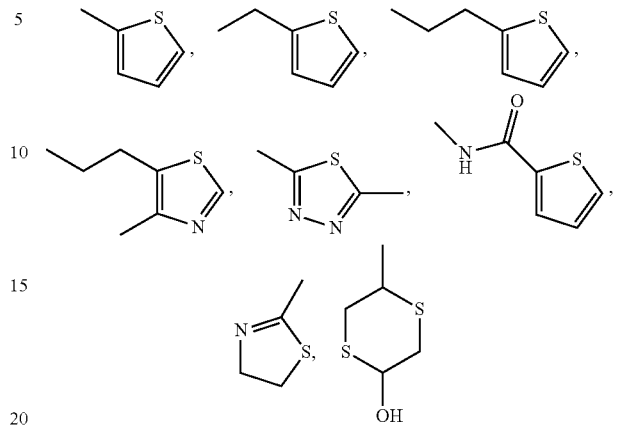

$R_4$ in Formula 1 may have any one of structures illustrated below:

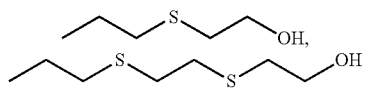

$R_5$ in Formula 1 may have any one of structures illustrated below:

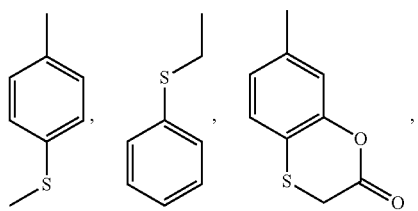

[Formula 2]

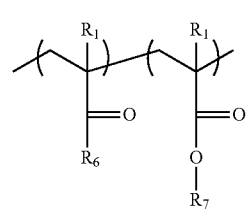

In Formula 2, $R_1$ is hydrogen (H) or a methyl group (—$CH_3$), $R_6$ is a hydroxyl group (—OH) or a methoxy group (—$OCH_3$), and $R_7$ is a deprotecting group.

Examples of an unsaturated ethylene monomer of a compound having $R_7$ in the polymer represented by Formula 2 are as follows:

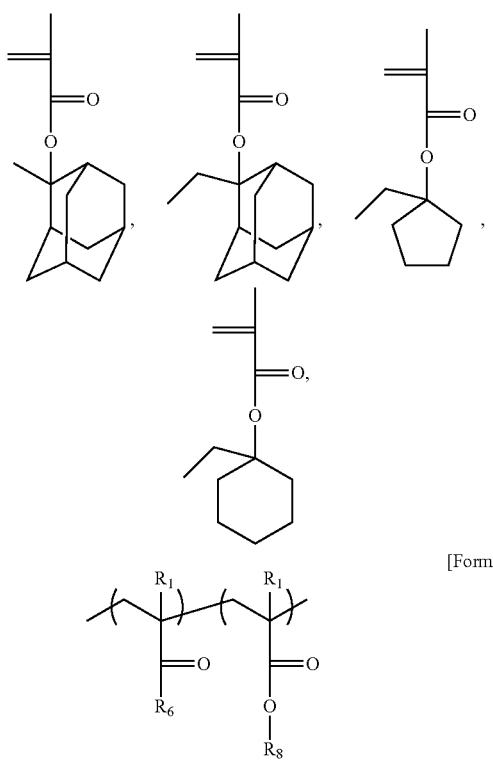

[Formula 3]

In Formula 3, $R_1$ is hydrogen (H) or a methyl group (—$CH_3$), $R_6$ is a hydroxyl group (—OH) or a methoxy group (—$OCH_3$), and $R_8$ is a fluoro group.

Examples of an unsaturated ethylene monomer of a compound having $R_8$ in the polymer represented by Formula 3 are as follows:

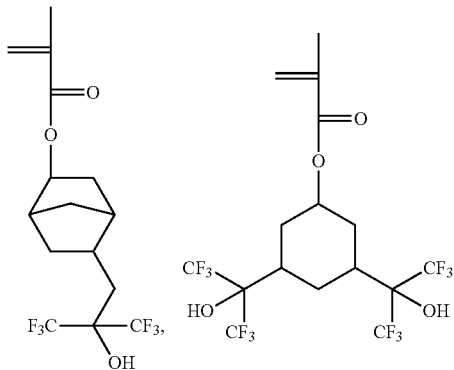 [SMILES: C=C(C)C(=O)OC1CC2CC1CC2CC(O)(C(F)(F)F)C(F)(F)F ; C=C(C)C(=O)OC1CC(C(O)(C(F)(F)F)C(F)(F)F)CC(C(O)(C(F)(F)F)C(F)(F)F)C1]

In process 10B of FIG. 1, a photoresist film is formed on the organic reflection-preventing film.

The photoresist film may include a positive-type photoresist. For example, the photoresist film may include a resin containing an acid-labile group, and a chemical amplification-type photoresist containing a photo-acid generator (PAG).

In some embodiments, the positive-type photoresist may be a resist for a KrF eximer laser (248 nm), a resist for a ArF eximer laser (193 nm), or a resist for a $F_2$ eximer laser (157 nm), or a resist for an EUV light machine (13.5 nm). The positive-type photoresist may be formed of, for example, a (meth)acrylate-based polymer. The (meth)acrylate-based polymer may be an aliphatic (meth)acrylate-based polymer, and may include, for example, polymethylmethacrylate (PMMA), poly(t-butylmethacrylate), poly(methacrylic acid), poly(norbornylmethacrylate), a di- or tri-polymer of repeating units of these (meth)acrylate-based polymers, or a combination thereof. Also, these materials may be substituted with various acid-labile groups. The acid-labile group herein may be, e.g. the same as explained in connection with the acid-labile group ($R_2$) of Formula 1 in process 10A.

In process 10C, an area of the photoresist film formed in process 10B, that is referred to as a first area, is exposed to generate an acid in the first area. This process may also expose a portion of the organic reflection-preventing film under the first area of the photoresist film. When the organic reflection-preventing film comprises a PAG, the portion of the organic reflection-preventing film under the first area of the photoresist film may also generate an acid.

The exposing process may use irradiation rays having various exposure wavelengths. For example, the exposing process may be performed by using an i-line (365 nm), a KrF eximer laser (248 nm), a ArF eximer laser (193 nm), a $F_2$ eximer laser (157 nm), or an EUV light machine (13.5 nm). In some embodiments, when an exposure wavelength of 193 nm is used, immersion lithography may be used. When immersion lithography is used, to prevent a direct contact between an immersion solution and the photoresist film and leaching of components constituting the photoresist film into the immersion solution, prior to the exposing process, a topcoat layer may be further formed to cover the photoresist film. In some embodiments, when immersion lithography is used, the topcoat layer may be omitted.

In process 10D, the acid which is generated by the photoresist film (and/or the organic reflection-preventing film), is used to increase hydrophilicity of a first surface of the organic reflection-preventing film which faces the first area.

In detail, due to the acid generated from the photoresist film (and/or the organic reflection-preventing film), in the first surface of the organic reflection-preventing film, which faces the first area or an area adjacent thereto, the polymer having the first repeating unit with an acid-labile group ($R_2$) of Formula 1 may be deprotected. For example, in the first surface of the organic reflection-preventing film, selectively, the acid-labile group ($R_2$) in —$OR_2$ is removed to expose —OH, and as a result, due to the presence of —OH in the first surface of the organic reflection-preventing film (e.g., at side chains of the polymer having the first repeating unit), hydrophilicity of the first surface of the organic reflection-preventing film may increase.

On the other hand, in the surface opposite from the first surface of the organic reflection-preventing film (opposite the surface that faces the photoresist film), may remain on the polymer having the first repeating unit (e.g. the polymer (and its side chains having the —$OR_2$ first repeating unit may remain without deprotection). Accordingly, the other surface of the reflection-preventing film may have higher hydrophobicity than the first surface. In other embodiments, the PAG in the organic reflection-preventing film may generate acid effective to deprotect the polymer having the first repeating unit throughout (including both upper and lower surfaces).

In process 10E, the exposed photoresist film is developed to selectively remove the non-exposed area of the photoresist film.

The selective removing of the non-exposed area may be performed by using a negative tone developer. The non-exposed area may refer to either an area that is not exposed to light at all, or an area of which an exposure amount is small enough that any acid generated due to the exposure does not change the polarity of the photoresist film sufficiently enough such that it is removed by the negative tone developer. The area of the photoresist film that is not exposed to light, (including the area of the photoresist film of which an exposure amount is so small that polarity does not significantly occur) may be selectively removed by using a negative tone developer that is formed of an organic solvent. The exposed area of photoresist film of which polarity increases due to the exposure may remain after the use of the negative tone developer formed of the organic solvent.

The negative tone developer may include a non-polar solvent. In some embodiments, the negative tone developer may include aromatic hydrocarbon, such as benzene, toluene, or xylene; cyclohexane, cyclohexanone; a non-ring type or ring type ethers, such as dimethylether, diethylether, ethyleneglycol, propyleneglycol, hexyleneglycol, ethyleneglycol monomethylether, ethyleneglycol monoethylether, ethyleneglycol methylethylether, diethyleneglycol monomethylether, diethyleneglycol monoethylether, diethyleneglycol dimethylether, propyleneglycol methylether, propyleneglycol ethylether, propyleneglycol propylether, propyleneglycol butylether, tetrahydrofurane, dioxane, and so on; acetates, such as methyl acetate, ethyl acetate, propyl acetate, butyl acetate, methyl hydroxy acetate, ethyl hydroxy acetate, propyl hydroxy acetate, butyl hydroxy acetate, methylmethoxy acetate, ethylmethoxy acetate, propylmethoxy acetate, butylmethoxy acetate, methylethoxy acetate, ethylethoxy acetate, propylethoxy acetate, butylethoxy acetate, methylpropoxy acetate, ethylpropoxy acetate, propylpropoxy acetate, butylpropoxy acetate, methylbutoxy acetate, ethylbutoxy acetate, propylbutoxy acetate, butylbutoxy acetate, propyleneglycol methylether acetate, propyleneglycol ethylether acetate, propyleneglycol propylether acetate, propyleneglycol butylether acetate, methyl cellosolve acetate, ethyl cellosolve acetate, and so on; propionates, such as methyl 3-hydroxy propionate, ethyl 3-hydroxy propionate, propyl 3-hydroxy propionate, butyl 3-hydroxy propionate, methyl 2-methoxy propionate, ethyl 2-methoxy propionate, propyl 2-methoxy propionate, butyl 2-methoxy propionate, methyl 2-ethoxypropionate, ethyl 2-ethoxypropionate, propyl 2-ethoxypropionate, butyl 2-ethoxypropionate, methyl 2-butoxypropionate, ethyl 2-butoxypropionate, propyl 2-butoxypropionate, butyl 2-butoxypropionate, methyl 3-methoxypropionate, ethyl 3-methoxypropionate, propyl 3-methoxypropionate, butyl 3-methoxypropionate, methyl 3-ethoxypropionate, ethyl 3-ethoxypropionate, propyl 3-ethoxypropionate, butyl 3-ethoxypropionate, methyl 3-propoxypropionate, ethyl 3-propoxypropionate, propyl 3-propoxypropionate, butyl 3-propoxypropionate, methyl 3-butoxypropionate, ethyl 3-butoxypropionate, propyl 3-butoxypropionate, butyl 3-butoxypropionate, propyleneglycol methylether propionate, propyleneglycol ethylether propionate, propyleneglycol propylether propionate, propyleneglycol butylether propionate, and so on; butyrates, such as oxyisobutyrate ester, for example, methyl-2-hydroxyisobutyrate, methyl α-methoxyisobutyrate, ethyl methoxyisobutyrate, methyl α-ethoxyisobutyrate, ethyl α-ethoxyisobutyrate, methyl β-methoxyisobutyrate, ethyl β-methoxyisobutyrate, methyl β-ethoxyisobutyrate, ethyl β-ethoxyisobutyrate, methyl β-isopropoxyisobutyrate, ethyl β-isopropoxyisobutyrate, isopropyl β-isopropoxyisobutyrate, butyl β-isopropoxyisobutyrate, methyl β-butoxyisobutyrate, ethyl β-butoxyisobutyrate, butyl β-butoxyisobutyrate, methyl α-hydroxyisobutyrate, ethyl α-hydroxyisobutyrate, isopropyl α-hydroxyisobutyrate, butyl α-hydroxyisobutyrate, and the like; lactates, such as methyl lactate, ethyl lactate, propyl lactate, butyl lactate, and so on; or a combination thereof. For example, the negative tone developer may be an n-butyl acetate.

In process 10E, at least a portion of the organic reflection-preventing film which is exposed due to the selective removal of the non-exposed area from the photoresist film by using the negative tone developer may remain, not being removed by using the negative tone developer. For example, portions of the organic reflection-preventing film under the non-exposed area of the photoresist may be exposed by removal of the non-exposed area of the photoresist film, and these exposed portions of the organic reflection-preventing film may have some upper parts removed. However, at least about 60% of the total thickness of the exposed portion of the organic reflection-preventing film may remain, e.g., not be removed by using the negative tone developer.

In process 10F, the organic reflection-preventing film and the to-be-etched film are anisotropically-etched by using the first area of the photoresist film exposed in process 10C as an etch mask.

To anisotropically-etch the organic reflection-preventing film and the to-be-etched film, dry etching, wet etching, or a combination thereof may be used. When wet etching is used, an etchant that includes other components than the negative tone developer used in process 10E may be used as a wet etchant.

Also contemplated with reference to FIG. 1A is a double patterning technique, disclosed in Korean Patent Application No. 10-2014-0072349, filed on Jun. 13, 2014, the disclosure of which is incorporated herein in its entirety by reference. The incorporated disclosure may use an organic reflection-preventing film and a photoresist film like that disclosed herein. A positive tone developer may be used to remove exposed portions of the photoresist film to expose the organic reflection-preventing film under the exposed portions of the photoresist film. A capping layer may adhere to sidewalls of openings in the patterned photoresist film. Acid (such as a TAG) in the capping layer may diffuse into portions of the photoresist pattern adjacent the sidewalls, and may also diffuse to the upper surface of the organic reflection-preventing film under such portions. The acid may act to deprotect polymers of the photoresist portions at the sidewalls and the organic reflection-preventing film under such portions, increasing corresponding hydrophilicity of both to increase their adhesion to each other. The remaining photoresist (not adjacent the sidewalls) may be removed with a negative tone developer, while the photoresist adjacent the sidewalls remains due to its change in polarity (increased hydrophilicity due to deprotected polymers). The double patterning technique disclosed in 10-2014-0072349 may benefit from including the organic reflection-preventing film of the present invention.

Figure 1B:
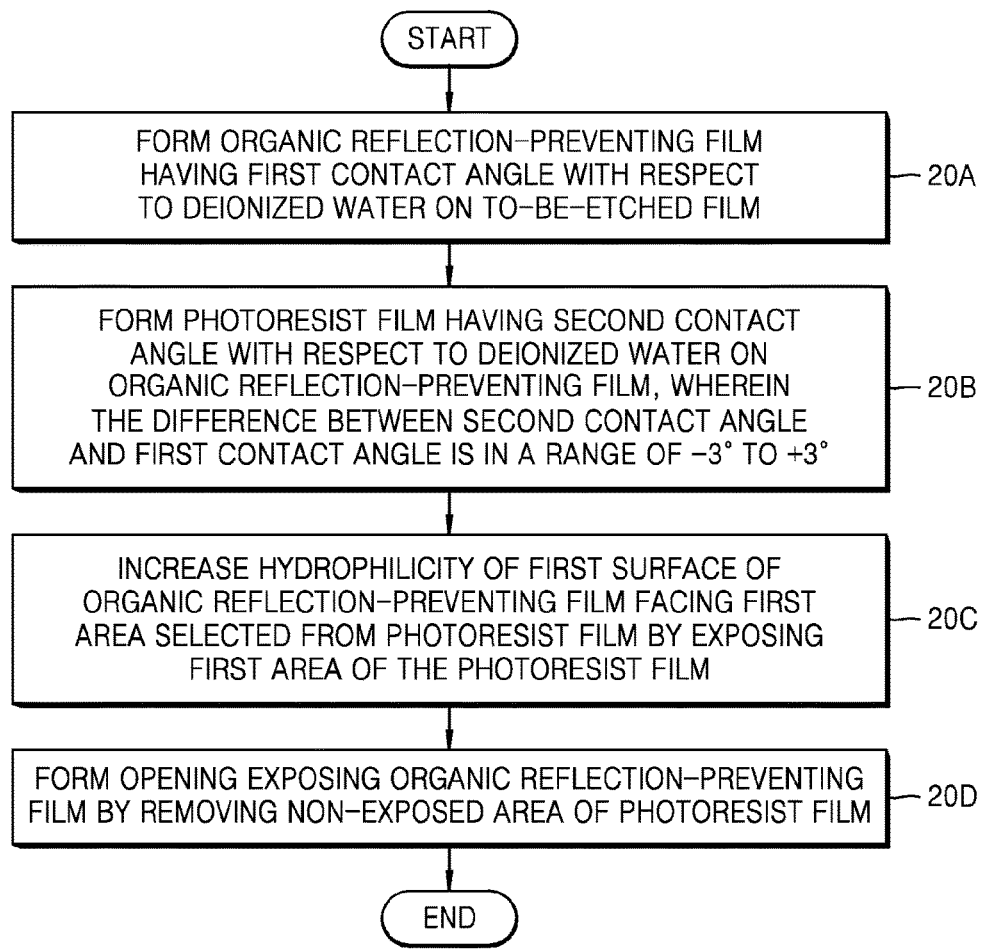
FIG. 1B is a flowchart illustrating an exemplary method of forming patterns according to another embodiment of the present disclosure.

FIG. 1B is a flowchart illustrating a method of forming patterns according to another embodiment of the present disclosure.

Referring to FIG. 1B, in process 20A, an organic reflection-preventing film having a first contact angle with respect to deionized water is formed on a substrate.

The first contact angle may be selected from a range, for example, from between about 70° to 90°, but the inventive concept is not limited thereto.

The forming of the organic reflection-preventing film may be the same as explained in connection with process 10A of FIG. 1A.

The organic reflection-preventing film may include a polymer having an acid-labile group.

In some embodiments, the organic reflection-preventing film may include a first repeating unit having an acrylate derivative substituent represented by Formula 1, and a second repeating unit having an acrylate derivative substituent represented by Formula 2.

In some embodiments, the organic reflection-preventing film may include a first repeating unit having an acrylate derivative substituent represented by Formula 1, a second repeating unit having an acrylate derivative substituent represented by Formula 2, and a third repeating unit having a protecting group substituted with fluorine.

In some embodiments, the organic reflection-preventing film may further include at least one selected from a cross-linking agent, an acid generator, and a base.

An amount of the first repeating unit in the organic reflection-preventing film may be in a range of 1 to 40 mol % based on a total polymer amount of the organic reflection-preventing film.

In process 20B, a photoresist film having a second contact angle with respect to deionized water is formed on the organic reflection-preventing film. A difference between the second contact angle and the first contact angle may be (or may be made to be) in a range of −3° to +3°.

The forming of the photoresist film may be the same as explained in connection with process 10B of FIG. 1A.

The second contact angle may be selected from a range, for example, from between about 70° to 90°, but the inventive concept is not limited thereto.

In process 20C, a first area of the photoresist film is exposed to increase hydrophilicity of a first surface of the organic reflection-preventing film facing the first area.

As described in connection with process 10A of FIG. 1A, the organic reflection-preventing film may include a polymer having an acid-labile group, for example, a polymer having the first repeating unit represented by Formula 1. The acid-labile group of the polymer included in the organic reflection-preventing film may be removed to increase hydrophilicity of the first surface of the organic reflection-preventing film.

In some embodiments, to increase hydrophilicity of the first surface of the organic reflection-preventing film, as explained in connection with process 10C of FIG. 1A, the first area of the photoresist film may be exposed to generate an acid from the first area, and as described in connection with process 10D of FIG. 1A, due to the acid generated from the photoresist film, the first surface of the organic reflection-preventing film facing the first area may have increased hydrophilicity.

In process 20D, a non-exposed area of the photoresist film may be removed to form an opening that exposes the organic reflection-preventing film.

To form an opening by removing the non-exposed area of the photoresist film, a negative tone developer may be used to remove the non-exposed area of the photoresist film.

The organic reflection-preventing film may have a first solubility with respect to the negative tone developer, and the photoresist film may have a second solubility with respect to the negative tone developer. The first solubility may be less than the second solubility. Accordingly, at least a portion of the organic reflection-preventing film, which is exposed due to the selective removal of the non-exposed area from the photoresist film by using the negative tone developer, may remain, i.e. not removed by using the negative tone developer. For example, after the non-exposed area is removed from the photoresist film, at least about 60% of the total thickness of the exposed portion of the organic reflection-preventing film may remain, not being removed by using the negative tone developer.

Figure 1C:
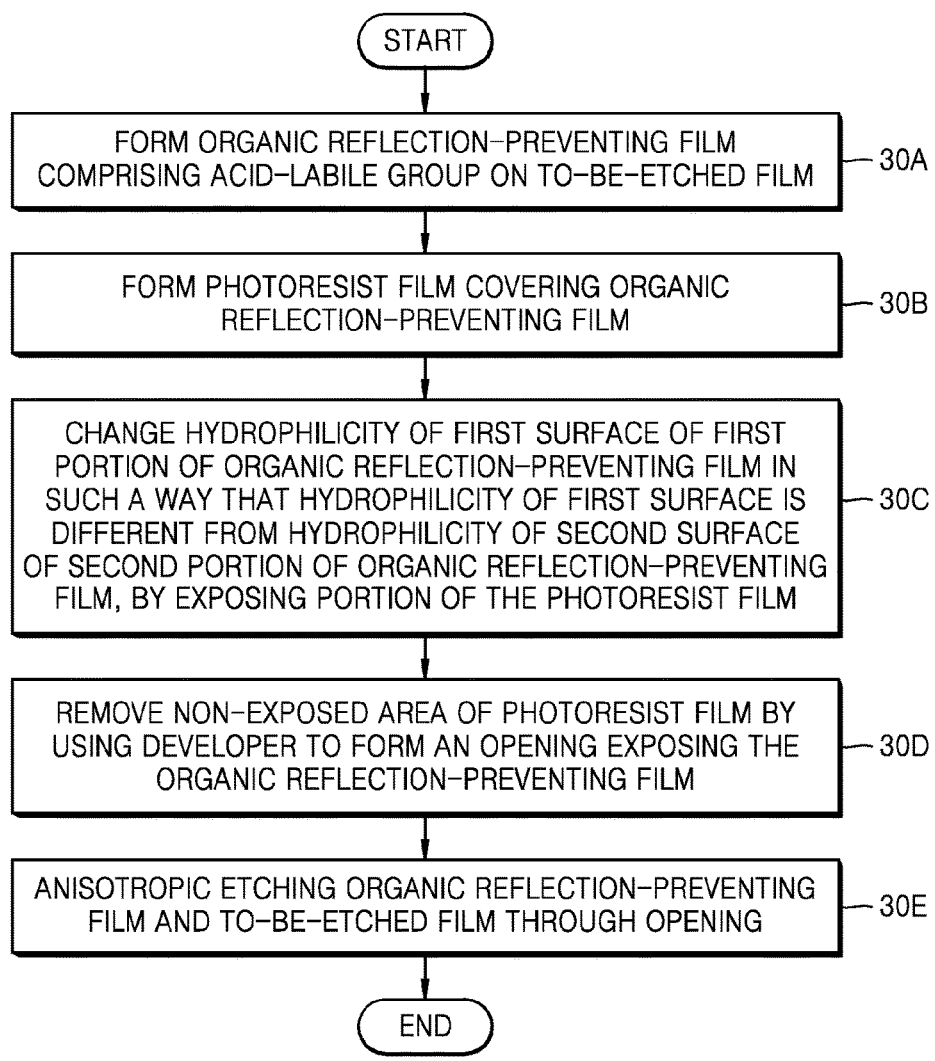
FIG. 1C is a flowchart illustrating an exemplary method of forming patterns according to another embodiment of the present disclosure.

FIG. 1C is a flowchart illustrating a method according to another embodiment of the present disclosure.

Referring to FIG. 1C, in process 30A, an organic reflection-preventing film having an acid-labile group is formed on a to-be-etched film.

The forming of the organic reflection-preventing film may be the same as explained in connection with process 10A of FIG. 1A and process 20A of FIG. 1B.

In process 30B, a photoresist film is formed to cover the organic reflection-preventing film.

The forming of the photoresist film may be the same as explained in connection with process 10B of FIG. 1A.

In process 30C, by exposing a portion of the photoresist film, hydrophilicity of a first surface of a first portion of the organic reflection-preventing film is changed in such a way that the hydrophilicity of the first surface differs from that of a second surface of a second portion of the organic reflection-preventing film.

The changing of hydrophilicity of the first surface of the organic reflection-preventing film may include increasing hydrophilicity of the first surface. To increase hydrophilicity of the first surface, an acid generated from the photoresist film resulting from the exposure of the photoresist film is used to deprotect the polymer by removing the acid-labile group in the first surface of the organic reflection-preventing film.

In process 30D, a non-exposed area of the photoresist film is removed by using a developing solution to form an opening exposing the organic reflection-preventing film.

The removal of the non-exposed area from the photoresist film may be performed by using a negative tone developer.

In process 30E, the organic reflection-preventing film and the to-be-etched film may be anisotropically-etched through the opening.

To anisotropically-etch the organic reflection-preventing film and the to-be-etched film, dry etching, wet etching, or a combination thereof may be used. When wet etching is used, for use as a wet etchant, an etchant that includes other components than the negative tone developer used in process 30D may be used.

FIGS. 2A to 2G are cross-sectional views to explain examples of the method of forming patterns explained in connection with FIGS. 1A to 1C, and in particular, cross-sectional views illustrated according to a process sequence to explain a method of forming patterns according to embodiments of the present disclosure.

Figure 2A:
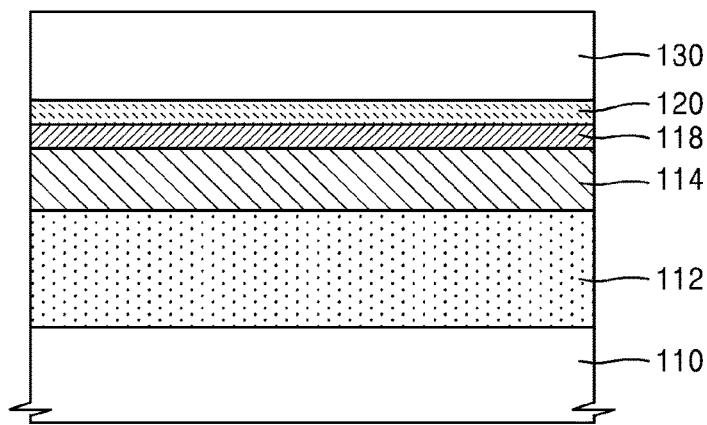
FIGS. 2A to 2G are cross-sectional views illustrated according to a process sequence to explain an exemplary method of forming patterns according to embodiments of the present disclosure.

Referring to FIG. 2A, a to-be-etched film 112 and a hard mask layer 114 are sequentially formed on a substrate 110. An inorganic reflection-preventing film 118, an organic reflection-preventing film 120, and a photoresist film 130 are sequentially formed on the hard mask layer 114 in this stated order.

The substrate 110 may be a semiconductor substrate. In some embodiments, the substrate 110 may be formed of a semiconductor, such as Si or Ge. In some embodiments, the substrate 110 may include a compound semiconductor, such as SiGe, SiC, GaAs, InAs, or InP. In some embodiments, the substrate 110 may have a silicon-on-insulator (SOI) structure. The substrate 110 may have a conductive area, for example, an impurity-doped well or an impurity-doped structure. In some embodiments, the substrate 110 may have various device isolation structures, such as a shallow trench isolation (STI) structure.

The to-be-etched film 112 may be an insulating film or a conductive film. For example, the to-be-etched film 112 may be formed of metal, alloy, metal carbide, metal nitride, metal oxynitride, metal oxycarbide, semiconductor, polysilicon, oxide, nitride, oxynitride, or a combination thereof, but the inventive concept is not limited thereto. When a final pattern is embodied in the substrate 110, the to-be-etched film 112 may be omitted.

The hard mask layer 114 may be formed of various films according to the to-be-etched film 112. For example, the hard mask layer 114 may be formed of a carbon-containing film, such as an oxide film, a nitride film, a SiCN film, a polysilicon film, an amorphous carbon layer (ACL), or a spin-on hardmask (SOH). The SOH may be formed of an organic compound having a relatively high carbon content of about 85 to 99 wt % based on a total weight thereof. The organic compound may be formed of a hydrocarbon compound or a derivative thereof, each including an aromatic ring, such as phenyl, benzene, or naphthalene.

In some embodiments, the inorganic reflection-preventing film 118 may have a thickness, e.g. of about 20 to 150 nm, but the inventive concept is not limited thereto. In some embodiments, the inorganic reflection-preventing film 118 may be formed of an inorganic material, such as titanium, titanium dioxide, titanium nitride, chromium oxide, carbon, silicon nitride, silicon oxynitride, or amorphous silicon. In some embodiments, the inorganic reflection-preventing film 118 may be omitted.

The organic reflection-preventing film 120 may have a thickness, e.g. of 20 to 150 nm, but the inventive concept is not limited thereto. The organic reflection-preventing film 120 may be the organic reflection-preventing film described in connection with process 10A of FIG. 1A.

In some embodiments, the organic reflection-preventing film 120 may be formed of a material that is not soluble with respect to a negative tone developer or that has a relatively low solubility with respect to the negative tone developer. The first repeating unit including the acid-labile group may be included in a relatively low amount in the organic reflection-preventing film 120. For example, an amount of the first repeating unit in the organic reflection-preventing film 120 may be in a range of about 1 to 40 mol % based on a total polymer amount of the organic reflection-preventing film 120.

To form the organic reflection-preventing film 120, the composition for forming an organic reflection-preventing film, which has been explained in connection with process 10A of FIG. 1A, may be applied on the inorganic reflection-preventing film 118, or when the inorganic reflection-preventing film 118 is omitted, on the hard mask layer 114, and then heat treated to induce a cross-linking reaction of polymers included in the composition.

The photoresist film 130 may be formed of a positive-type photoresist. The photoresist film 130 may include a resin of which polarity increases due to the action of an acid. For example, the photoresist film 130 may include a resin including an acid-labile group, and a chemically amplified photoresist including PAG. The photoresist film 130 may include a resist for a KrF eximer laser (248 nm), a resist for a ArF eximer laser (193 nm), a resist for a $F_2$ eximer laser (157 nm), or a resist for an EUV light machine (13.5 nm). The photoresist film 130 may be formed by spin coating.

In some embodiments, a material for the organic reflection-preventing film 120 and a material for the photoresist film 130 may be selected in such a way that after the exposing and developing processes, the difference between a contact angle of the organic reflection-preventing film 120 with respect to deionized water and a contact angle of the photoresist film 130 with respect to deionized water is in a range of about −3° to +3°. The inventors of the present application found that smaller contact angle differences between the organic reflection-preventing film 120 and the photoresist film 130 after the exposing and developing processes result in a fine pattern having a fine width that may be more easily obtained. This will be described in detail in connection with FIG. 9.

Figure 2B:
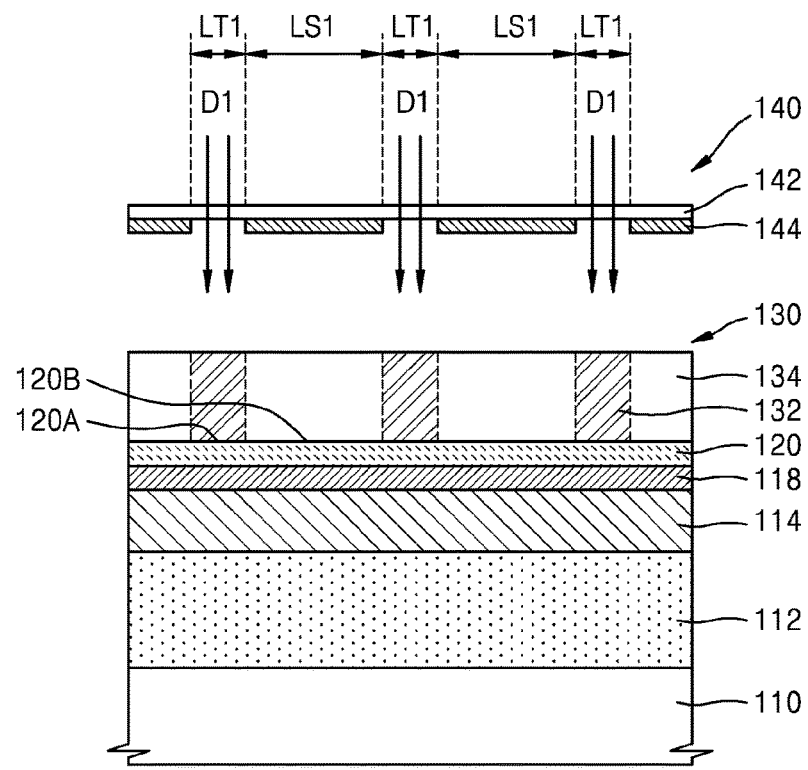

Referring to FIG. 2B, an exposing process is performed as follows: a photomask 140 including a plurality of light shielding areas LS1 and a plurality of light-transmitting areas LT1 are aligned over a predetermined location of the substrate 110, and through the light-transmitting areas LT1 of the photomask 140, a first area 132 of the photoresist film 130 is exposed at a dose D1.

In the first area 132 of the photoresist film 130, due to an acid generated by the exposing process, the acid-labile group is removed and polarity of the first area 132 may be greater than that of other portions of the photoresist film 130. The size of the first area 132 may be controllable by adjusting the dose D1.

The photomask 140 includes a transparent substrate 142, and a plurality of light shielding patterns 144 formed on the transparent substrate 142 in the light shielding areas LS1. The transparent substrate 142 may be formed of quartz. The light shielding patterns 144 may be formed of Cr. The light shielding patterns 144 may define the light-transmitting areas LT1.

The light-transmitting areas LT1 may be aligned in line patterns so that the light-transmitting areas LT1 are parallel to each other.

The exposing process may use irradiation rays having various exposure wavelengths. For example, the exposing process may be performed by using an exposure wavelength of i-line (365 nm), 248 nm, 193 nm, EUV (13.5 nm), or 157 nm. In some embodiments, when an exposure wavelength of 193 nm is used, immersion lithography may be used. When immersion lithography is used, to prevent a direct contact between an immersion solution and the photoresist film 130 and leaching of components of the photoresist film 130 to the immersion solution, prior to the exposing process, a topcoat layer may be further formed to cover the photoresist film. In some embodiments, even when immersion lithography is used, the topcoat layer may be omitted. In this case, the photoresist film 130 may include a fluorine-containing additive.

The dose D1 may be determined according to a width WP of a photomask pattern 130P (see FIG. 2C), which is to be formed from the photoresist film 130 in the exposing process. The smaller width WP the photomask pattern 130P has, the greater set value the dose D1 may have. The greater width WP the photomask pattern 130P has, the smaller set value the dose D1 may have.

Figure 3:
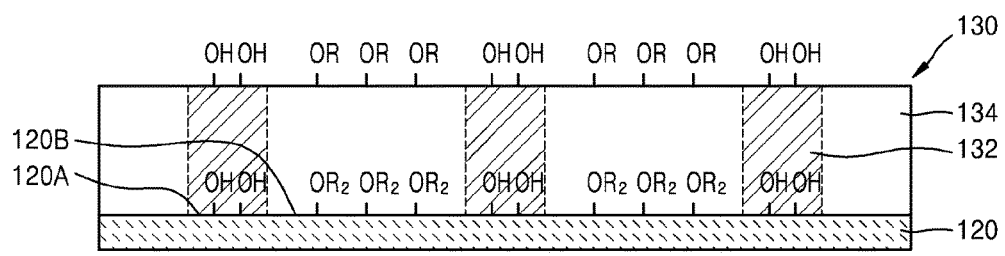
FIG. 3 is an enlarged schematic cross-sectional view of an organic reflection-preventing film and a photoresist film to explain a surface state change of each film in an exposed area and a non-exposed area after an exposing process, explained in connection with FIG. 2B.

FIG. 3 is an enlarged schematic cross-sectional view of the organic reflection-preventing film 120 and the photoresist film 130 to explain a surface state change of each film in an exposed area and a non-exposed area after the exposing process explained in connection with FIG. 2B.

Referring to FIGS. 2B and 3, due to the exposing process explained in connection with FIG. 2B, an acid may be generated in the exposed first area 132 of the photoresist film 130. Due to the acid generated in the first area 132 of the photoresist film 130, an acid-labile group (R) may be removed in the first area 132 of the photoresist film 130. That is, in the first area 132, the acid-labile group (R) of —OR is removed to expose, for example, a hydrophilic group, such as —OH, and as a result, the first area 132 may have increased surface hydrophilicity.

In some embodiments, in a first surface 120A of the organic reflection-preventing film 120 facing the exposed first area 132 of the photoresist film 130, the acid-labile group included in the organic reflection-preventing film 120 is removed to expose, for example, a hydrophilic group, such as —OH, and as a result, hydrophilicity of the first surface 120A may increase.

On the other hand, in a surface of a non-exposed portion 134 of the photoresist film 130, —OR including the acid-labile group (R) remains without the deprotection. Similarly, even in a second surface 120B of the organic reflection-preventing film 120 facing the non-exposed portion 134 of the photoresist film 130, the acid-labile group may remain without the deprotection, and thus, the second surface 120B may have higher hydrophobicity than the first surface 120A.

Accordingly, hydrophilicity of the first surface 120A of the organic reflection-preventing film 120 may be similar to that of the first area 132 of the photoresist film 130 facing the first surface 120A, and adhesiveness between the first surface 120A and the first area 132 may improve. Thus, even when a photoresist pattern 130P (see FIG. 2C) obtained from the first area 132 of the photoresist film 130 remaining after a subsequent negative tone developing process has a relatively high aspect ratio and a relatively fine pattern width, due to the improved adhesiveness of the photoresist pattern 130P with the organic reflection-preventing film 120, collapse of the photoresist pattern 130P may be prevented.

Figure 2C:
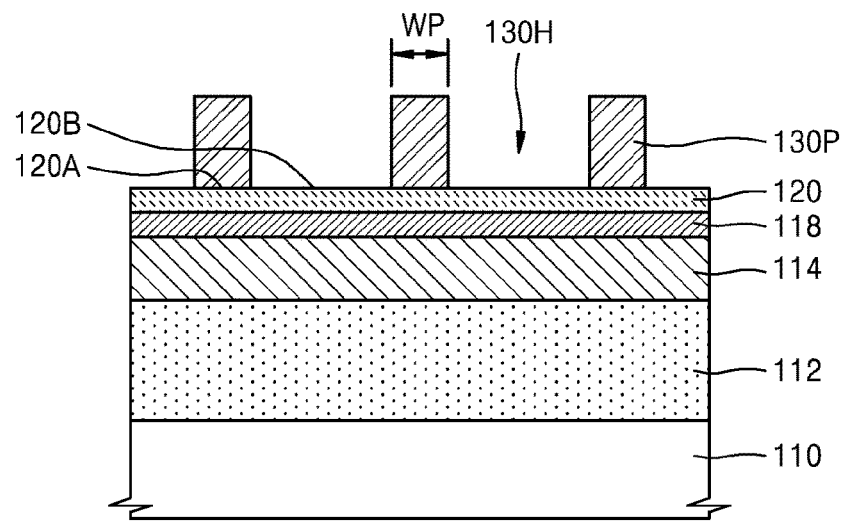

Referring to FIG. 2C, as illustrated in FIG. 2B, the exposed photoresist film 130 is developed to selectively remove the non-exposed area 134 of the photoresist film 130 to form the photoresist pattern 130P constituted of the exposed first area 132.

Once the photoresist pattern 130P is formed, the organic reflection-preventing film 120 is exposed through an opening 130H passing through the photoresist pattern 130P.

The selective removing of the non-exposed area 134 may be performed by using a negative tone developer. The non-exposed area 134 may refer to either an area that is not exposed to light at all, or an area of which an exposure amount is so small that even when an acid generated due to the exposure hardly changes polarity of the photoresist film 130. Accordingly, the first area 132 with increased polarity may remain without being removed by using the negative tone developer, and the non-exposed area 134 may be easily removed by using the negative tone developer formed of an organic solvent.

The negative tone developer may be the same as explained in connection with process 10E of FIG. 1A.

As described in connection with FIGS. 2B and 3, since hydrophilicity of the first surface 120A of the organic reflection-preventing film 120 is similar to hydrophilicity of the surface of the photoresist pattern 130P facing the first surface 120A, adhesiveness between the first surface 120A and the surface of the photoresist pattern 130P may be improved. Accordingly, even when the photoresist pattern 130P has a relatively high aspect ratio and a relatively fine width WP (see FIG. 2C), due to the improved adhesiveness of the photoresist pattern 130P with the organic reflection-preventing film 120, the collapse of the photoresist pattern 130P may be prevented.

As described in connection with process 10A of FIG. 1A, the first repeating unit including the acid-labile group may be included in a relatively low amount in the organic reflection-preventing film 120. For example, an amount of the first repeating unit in the organic reflection-preventing film 120 may be in a range of about 1 mol % to about 40 mol % based on the total polymer amount of the organic reflection-preventing film 120. Accordingly, the solubility of the organic reflection-preventing film 120 with respect to a negative tone developer may be relatively low. Therefore, in the structure illustrated in FIG. 2C obtained by selectively removing the non-exposed area 134 (see FIG. 2B) of the photoresist film 130 by using a negative tone developer, even when the second surface 120B of the organic reflection-preventing film 120 is exposed through the opening 130H of the photoresist pattern 130P, the organic reflection-preventing film 120 may not be removed at all or only a portion thereof is removed, thereby allowing at least a portion of the organic reflection-preventing film 120 to remain even when the negative tone developer is used.

As a comparative example, for example, when the photoresist film 130 is developed, a portion of the organic reflection-preventing film 120 exposed by the opening 130H of the photoresist pattern 130P may also be developed and removed from the photoresist film 120, thereby forming a stack structure of an organic reflection-preventing film pattern and a photoresist pattern. In this structure, the thickness of the organic reflection-preventing film pattern may contribute to an increase in the aspect ratio. Such an increase in the aspect ratio of the photoresist pattern 130P may not occur in other embodiments of the present disclosure, where during developing, the organic reflection-preventing film 120 is not removed but remains. Accordingly, the obtained aspect ratio of the photoresist pattern 130P may be smaller than that of the structure of the comparative example. Due to a relatively low solubility of the organic reflection-preventing film 120 with respect to a negative tone developer, only a step due to etching the photoresist pattern 130P may be formed and a step due to etching of the organic reflection-preventing film 120 may not be formed, and the collapse of a pattern due to the increased aspect ratio may be prevented.

Figure 2D:
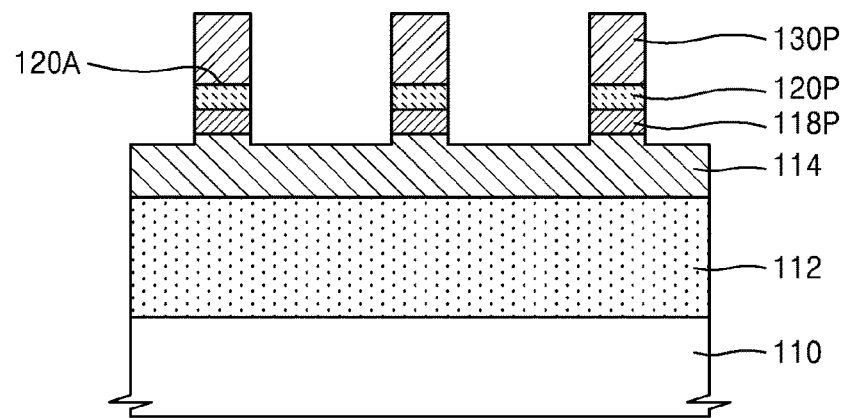

Referring to FIG. 2D, the organic reflection-preventing film 120 and the inorganic reflection-preventing film 118 are sequentially anisotropically-etched by using the photoresist pattern 130P as an etch mask to form an organic reflection-preventing film pattern 120P and an inorganic reflection-preventing film pattern 118P.

Even when anisotropic-etching is performed to form the organic reflection-preventing film pattern 120P and the inorganic reflection-preventing film pattern 118P, a portion of a top surface of the hard mask layer 114 may be etched and at least a portion of the photoresist pattern 130P may be removed so that the thickness of the photoresist pattern 130P is decreased.

Organic reflection-preventing film 120 and the inorganic reflection-preventing film 118 may be anisotropically-etched by dry etch, wet etch, or a combination thereof.

Figure 2E:
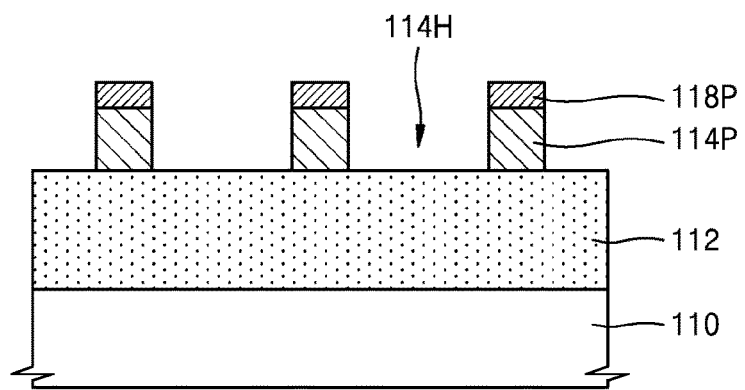

Referring to FIG. 2E, the hard mask layer 114 is anisotropically-etched by using the inorganic reflection-preventing film pattern 118P as an etch mask to form a hard mask pattern 114P having an opening 114H. The opening 114H of the hard mask pattern 114P may expose the to-be-etched film 112.

To anisotropically-etch the hard mask layer 114, dry etching, wet etching, or a combination thereof may be used.

Once the hard mask pattern 114P is formed, the films disposed on the inorganic reflection-preventing film pattern 118P used as an etch mask may be partially or completely consumed so that thicknesses thereof may decrease or may not exist, respectively.

Figure 2F:
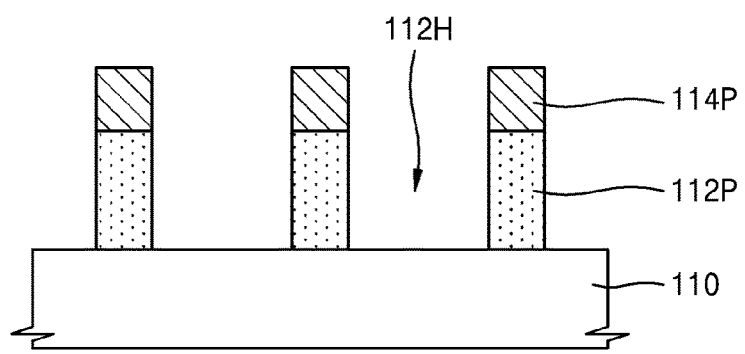

Referring to FIG. 2F, the to-be-etched film 112 is etched by using the hard mask pattern 114P as an etch mask to form a fine pattern 112P having an opening 112H.

Figure 2G:
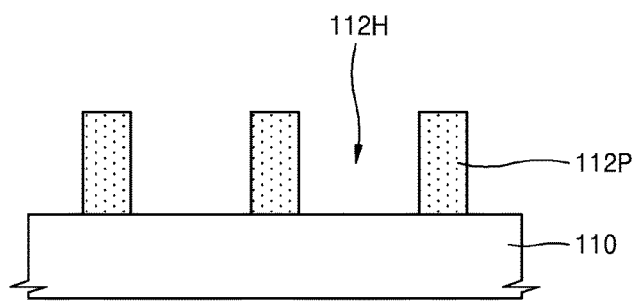

Referring to FIG. 2G, the hard mask pattern 114P remaining on the fine pattern 112P may be removed to expose a top surface of the fine pattern 112P.

As described in connection with FIGS. 2A to 2G, in the method of forming patterns according to embodiments of the present disclosure, the organic reflection-preventing film 120 and the photoresist film 130 are formed such that the difference in surface contact angles of the organic reflection-preventing film 120 and the photoresist film 130 after the exposing and developing processes is as small as possible, and accordingly, hydrophilicity of the organic reflection-preventing film 120 may be similar to that of the photoresist pattern 130P formed by exposing and developing the photoresist film 130, and thus, at an interface therebetween, adhesiveness of the organic reflection-preventing film 120 and the photoresist pattern 130P may improve. Accordingly, even when the photoresist pattern 130P has a relatively high aspect ratio and a relatively fine width, due to the improved adhesiveness of the photoresist pattern 130P and the organic reflection-preventing film 120, the collapse of the photoresist pattern 130P may be prevented.

Figure 4:
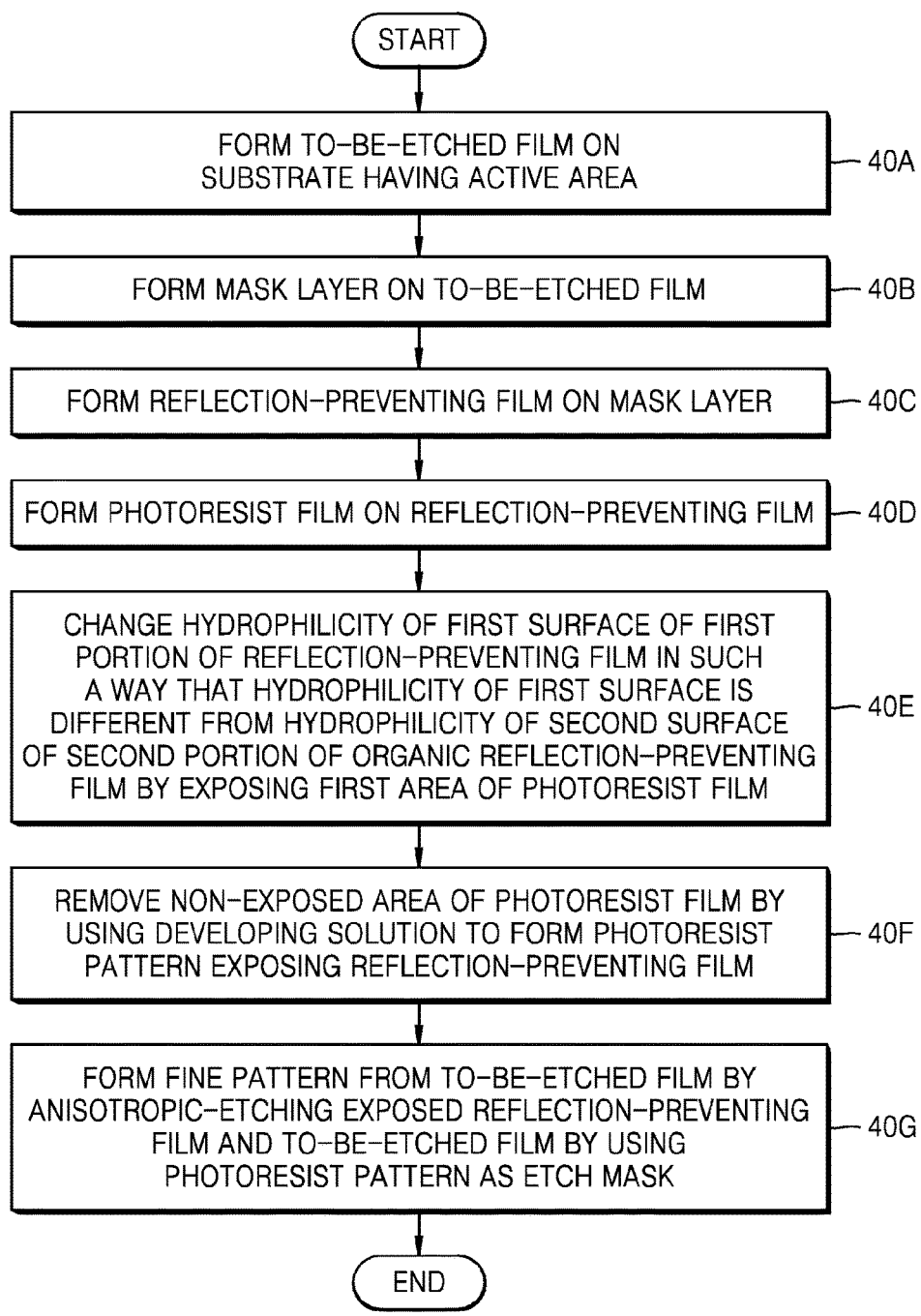
FIG. 4 is a flowchart illustrating an exemplary method of manufacturing an integrated circuit device according to an embodiment of the present disclosure.

FIG. 4 is a flowchart illustrating a method of manufacturing an integrated circuit device according to an embodiment of the present disclosure.

Referring to FIG. 4, in process 40A, a to-be-etched film is formed on a substrate having an active area.

The to-be-etched film formed on the substrate may be a conductive film, a dielectric film, an insulating film, or a combination thereof. The to-be-etched film may be the same as explained in connection with process 10A of FIG. 1A.

In process 40B, a mask layer is formed on the to-be-etched film.

The mask layer may be formed of a material that has an etch selectivity with respect to the to-be-etched film. In a subsequent process, the mask layer may be used as a layer for forming an etch mask pattern that is used as an etch mask when the to-be-etched film is etched.

The mask layer may be formed of polysilicon, silicon oxide, silicon nitride, ACL, SOH, or a combination thereof.

In process 40C, a reflection-preventing film may be formed on the mask layer.

In some embodiments, the reflection-preventing film may include an organic reflection-preventing film, an inorganic reflection-preventing film, or a combination thereof. In some embodiments, the reflection-preventing film may include an organic reflection-preventing film including a polymer having an acid-labile group. The organic reflection-preventing film may be the same as explained in connection with process 10A of FIG. 1A.

In process 40D, a photoresist film is formed on the reflection-preventing film.

The photoresist film may be the same as explained in connection with process 10B of FIG. 1A.

In process 40E, a first area of the photoresist film is exposed to change hydrophilicity of a first surface of a first portion of the reflection-preventing film in such a way that the hydrophilicity of the first surface is different from hydrophilicity of a second surface of a second portion of the organic reflection-preventing film.

The photoresist film may include PAG, and the reflection-preventing film may include an organic reflection-preventing film including a polymer having an acid-labile group. In this regard, the changing of hydrophilicity of the first surface of the reflection-preventing film may include increasing hydrophilicity of the first surface. To increase hydrophilicity of the first surface, the acid-labile group in the first surface of the reflection-preventing film may be removed due to an acid that is generated from the photoresist film when the photoresist film is exposed.

In process 40F, a non-exposed area of the photoresist film is removed by using a developing solution to form a photoresist pattern exposing the reflection-preventing film.

The non-exposed area of the photoresist film may be removed by using a negative tone developer.

In process 40G, by using the photoresist pattern as an etch mask, the exposed reflection-preventing film and the to-be-etched film are anisotropically-etched to form a fine pattern of the to-be-etched film.

The fine pattern may be a conductive fine pattern having a line-and-space pattern shape.

In some embodiments, the conductive fine pattern may constitute a plurality of bit lines disposed on a cell array area of an integrated circuit device. In some embodiments, the conductive fine pattern may constitute a plurality of conductive lines disposed on a core area of an integrated circuit device.

In some embodiments, the fine pattern may be constituted of a conductive fine pattern having a hole that exposes the active area of the substrate. After the conductive fine pattern is formed, the hole is filled with a conductive material to form a contact connected to the active area. For example, the conductive fine pattern may include a plurality of bit lines disposed on a cell array area of an integrated circuit device, and the contact may be a direct contact for connecting the bit lines to the active area FIG. 5 shows a block diagram of an integrated circuit device 200 which may be embodied by using the exemplary method of manufacturing an integrated circuit device explained in connection with FIG. 4.

Figure 5:
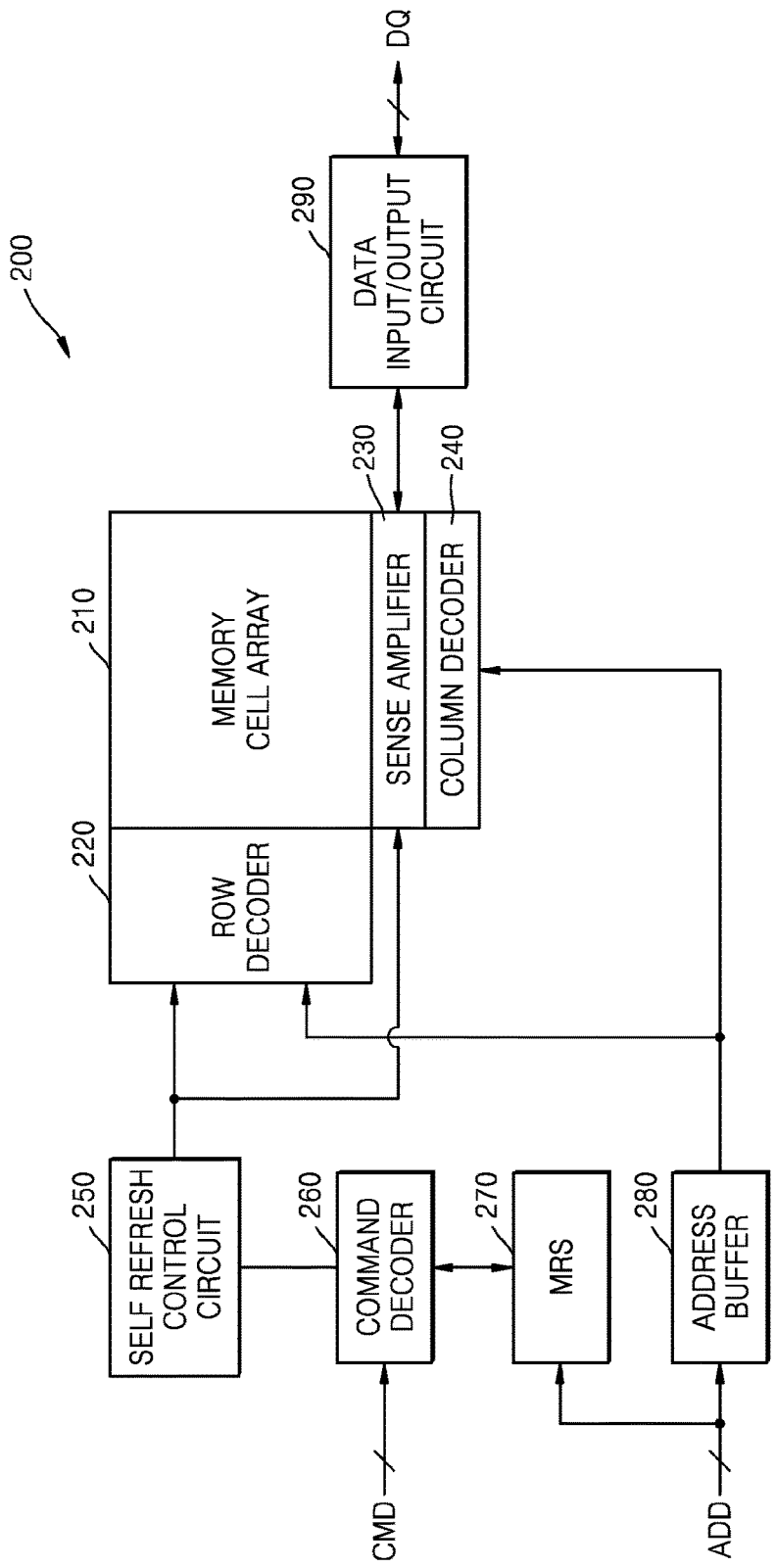
FIG. 5 is a block diagram of an integrated circuit device which is embodied by using a method of manufacturing an integrated circuit device according to embodiments of the present disclosure.

Referring to FIG. 5, the integrated circuit device 200 includes a memory cell array 210, a row decoder 220, a sense amplifier 230, a column decoder 240, a self refresh control circuit 250, a command decoder 260, a mode register set/extended mode register set (MRS) circuit 270, an address buffer 280, and a data input/output circuit 290. Each of the parts of the integrated circuit device 200 and/or their interconnection may be manufactured by using a method similar to or identical with the flowcharts of FIGS. 1A, 1B, 1C, and 4.

In the memory cell array 210, a plurality of memory cells for storing data are arranged in a row direction and a column direction. Each of the memory cells, for example, may be formed of a cell capacitance and an access transistor. The gate of the access transistor may be connected to a corresponding word line of a plurality of word lines arranged in the row direction, one of the source and the drain of the access transistor may be connected to a bit line (BL) or complementary bit line (/BL) arranged in the column direction, and the other of the source and the drain may be connected to the cell transistor.

The sense amplifier 230 senses data of a memory cell and amplifies the sensed data, and writes the amplified data to the memory cell. The sense amplifier 230 may be a cross-coupled amplifier that is connected between a bit line BL and a complementary bit line (/BL).

Data DQ input via the data input/output circuit 290 is written to the memory cell array 210 based on an address signal ADD, and data DQ read from the memory cell array 210 based on the address signal ADD is output to the outside via the data input/output circuit 290. The address signal ADD is input to the address buffer 280 to designate a memory cell to which data is to be written or from which data is to be read. The address buffer 280 temporally stores the address signal ADD inputted from the outside.

The row decoder 220 decodes a row address of the address signal ADD output from the address buffer 280 to designate a word line connected to a memory cell to which data is to be inputted or from which data is to be outputted. That is, in a data write or read mode, the row decoder 220 decodes the row address output from the address buffer 280 to enable a corresponding word line. In a self refresh mode, the row decoder 220 decodes a row address generated from an address counter to enable a corresponding word line.

The column decoder 240 decodes a column address of the address signal ADD outputted from the address buffer 280 to designate a bit line connected to a memory cell to which data is to be inputted or from which data is to be outputted.

The memory cell array 210 outputs data from a memory cell designated by the row address and the column address or writes data to the memory cell.

The command decoder 260 receives a command signal CMD that is applied from the outside, and decodes the command signal CMD to internally generate a decoded command signal, e.g., a self refresh entry command or a self refresh exit command.

The MRS circuit 270 sets an internal mode register in response to an MRS command for designating an operation mode of the integrated circuit device 200 and an address signal ADD.

Although not illustrated in FIG. 5, the integrated circuit device 200 may further include a clock circuit for generating a clock signal and a power circuit that receives a power supply voltage applied from the outside, generates an internal voltage, and distributes the generated internal voltage.

The self refresh control circuit 250 controls a self refresh operation of the integrated circuit device 200 in response to a command that is outputted from the command decoder 260.

The command decoder 260 may include an address counter, a timer, and a core voltage generator. The address counter may generate a row address for designating a memory cell corresponding to a self refresh target in response to the self refresh entry command that is output from the command decoder 260, and may apply the generated row address to the row decoder 220. The address counter may discontinue a counting operation in response to the self refresh exit command that is outputted from the command decoder 260. The row decoder may therefore decode externally received addresses ADD as well as addresses provided from the self refresh control circuit 250.

Figure 6:
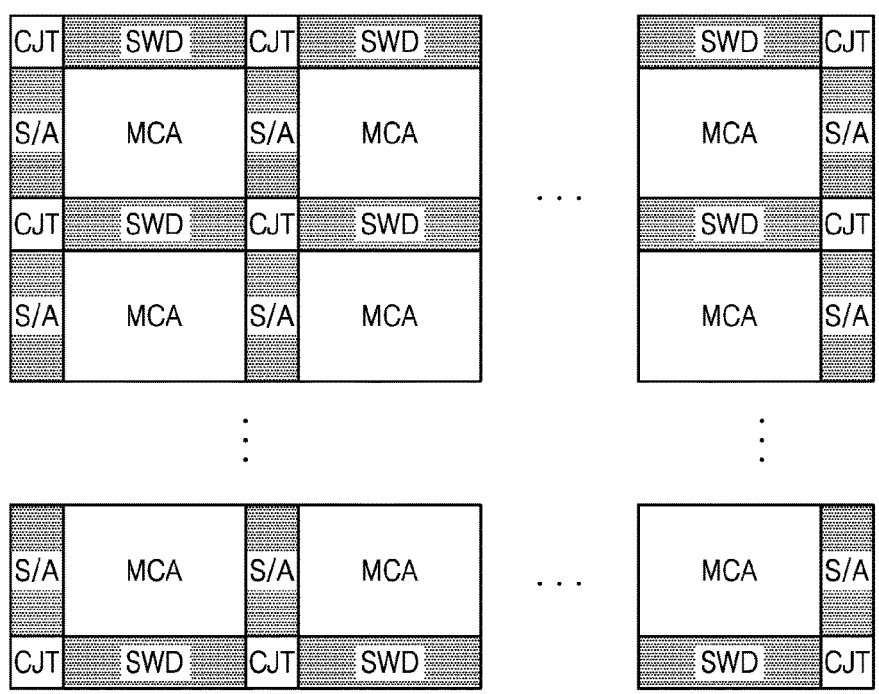
FIG. 6 is a diagram illustrating a layout of a memory core unit including a memory cell array and a sense amplifier, which are illustrated in FIG. 5.

The memory cell array 210 and the sense amplifier 230 may constitute a memory core unit 232 illustrated in FIG. 6.

FIG. 6 is a diagram illustrating a layout of the memory core unit 232 including the memory cell array 210 and the sense amplifier 230, which are illustrated in FIG. 5.

Referring to FIG. 6, the memory core unit 232 may include a plurality of memory cell array blocks MCA. The memory cell array blocks MCA may constitute the memory cell array 210 of FIG. 5.

A plurality of sub-word line driver blocks SWD may be arranged in the direction of word lines (i.e. in rows) of the memory cell array blocks MCA, and a plurality of sense amplifier blocks S/A may be arranged in the direction of bit lines (i.e. in columns) of the memory cell array blocks MCA.

A plurality of bit line sense amplifiers may be disposed in each of the sense amplifier blocks S/A.

A conjunction block CJT may be arranged at an intersection of each sub-word line driver block SWD and each sense amplifier block S/A. Power drivers and ground drivers for driving bit line sense amplifiers may be alternately disposed in the conjunction block CJT.

Figure 7:
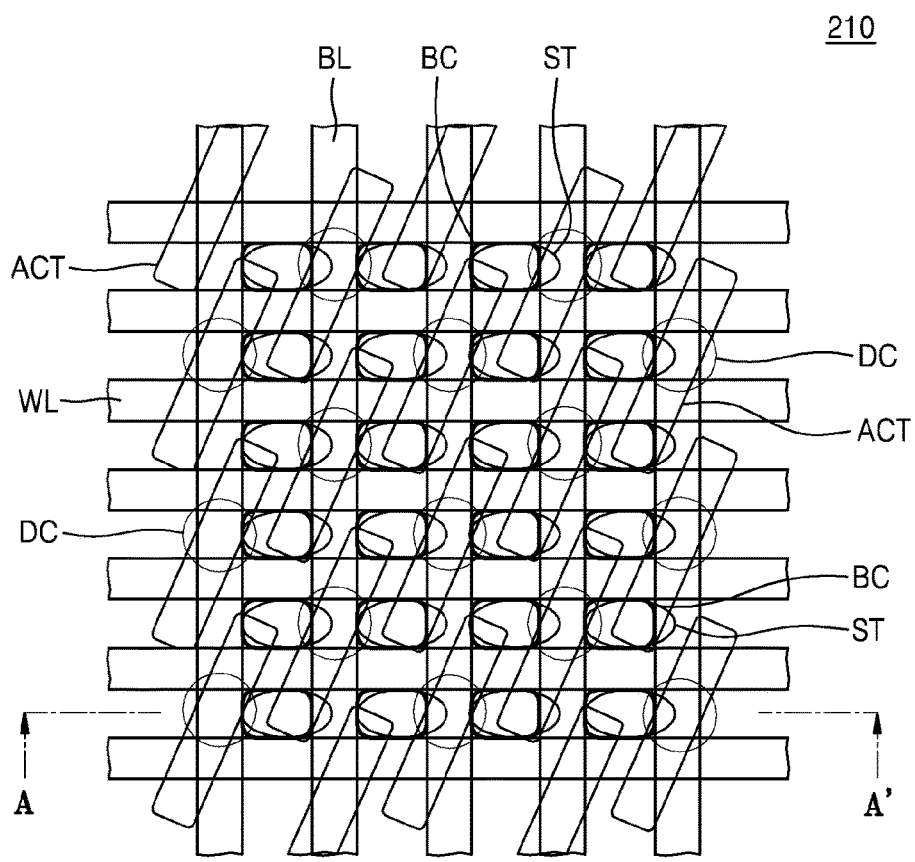
FIG. 7 shows an exemplary plane layout of some elements of a memory cell array illustrated in FIG. 5.

FIG. 7 is an exemplary plane layout of some elements of the memory cell array 210 illustrated in FIG. 5. The layout illustrated in FIG. 7 may correspond to the configuration of the memory cell array block MCA of FIG. 6.

In some embodiments, the layout of the memory cell array 210 illustrated in FIG. 7 is applicable to a memory cell having a unit cell size of $6F^2$ in a semiconductor memory device. Herein, "F" denotes a minimum lithographic feature size (e.g., 22 nm or 14 nm, although the feature size may be less than 22 nm or less than 14 nm).

Referring to FIG. 7, the memory cell array 210 includes a plurality of active areas ACT. A plurality of word lines WL run across the active areas ACT and extend parallel to one another in a first direction (i.e., the X direction of FIG. 7). The word lines WL may be disposed at regular intervals. A plurality of bit lines BL are disposed on the word lines WL and extend parallel to one another in a second direction (i.e., the Y direction of FIG. 7) orthogonal to the first direction.

The bit lines BL are connected to the active areas ACT via a plurality of direct contacts DC.

In some embodiments, the bit lines BL may be disposed parallel to one another at a pitch of 3F. In some embodiments, the word lines WL may be disposed parallel to one another at a pitch of 2F.

A plurality of buried contacts BC may each be formed of a contact structure extending from an area between two adjacent bit lines BL of the bit lines BL to the top of any one of the two adjacent bit lines. In some embodiments, the buried contacts BC may be arranged in lines in the first direction and the second direction. In some embodiments, the buried contacts BC may be disposed at regular intervals in the second direction. Each of the buried contacts BC may electrically connect a lower electrode ST of a capacitor to a corresponding active area ACT.

Figure 8A:
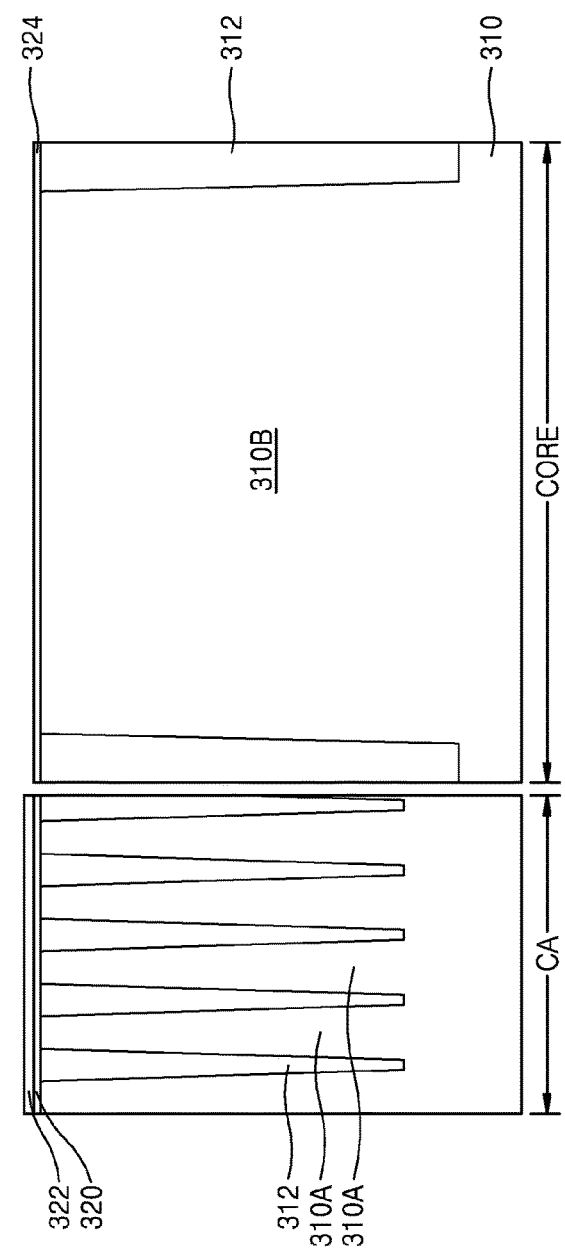
FIGS. 8A to 8O are cross-sectional views illustrated according to a process sequence to explain an exemplary method of manufacturing an integrated circuit device which is embodied according to the present disclosure.

FIGS. 8A to 8O are views to explain examples of the method of manufacturing an integrated circuit device explained in connection with FIG. 4, and in particular, cross-sectional views illustrated according to a process sequence to explain a method of manufacturing an integrated circuit device 300 (see, e.g. FIG. 8O) according to embodiments of the present disclosure.

In FIGS. 8A to 8O and 2A to 2G, like reference numerals denote like reference elements. Accordingly, explanation of these elements will be omitted.

In the current embodiment, a process of simultaneously forming an interconnection structure, formed in a core area CORE, and some elements of a memory cell of the memory cell array block MCA, illustrated in FIG. 6, is described.

In FIGS. 8A through 8O, a part "CA" is a cross-sectional view illustrating a portion of a cell array area CA of the integrated circuit device 300, e.g., a portion corresponding to a cross-portion taken along line A-A' of FIG. 7, and a part "CORE" is a cross-sectional view illustrating a portion of a core area CORE of the integrated circuit device 300. In some embodiments, the cell array area CA of FIGS. 7, 8A through 8O may be a portion of the memory cell array block MCA of FIG. 6. The core area CORE of FIGS. 8A through 8O may be, e.g. a portion of the sense amplifier block S/A of FIG. 6, a portion of the word line driver block SWD of FIG. 6, and/or a portion of the row decoder 220 and/or column decoder 240 of FIG. 5. However, the inventive concept is not limited thereto.

Referring to FIG. 8A, a plurality of active areas 310A and 310B are defined in the cell array area CA and the core area CORE by forming a device isolation layer 312 in a substrate 310.

Each of the active areas 310A and 310B may have a relatively long island shape having a minor axis and a major axis as the active area ACT illustrated in FIG. 7. Other details of the substrate 310 are the same as those of the substrate 110 described with reference to FIGS. 2A through 2G.

The device isolation layer 312 may include, e.g. an oxide layer, a nitride layer, or a combination thereof. However, the inventive concept is not limited thereto. The device isolation layer 312 may include a single layer including one insulating layer or a multi-layered structure including a combination of at least three kinds of insulating layers.

In the cell array area CA, a plurality of word line trenches (not shown) is formed in the substrate 310. The word line trenches may extend parallel to one another in the X direction of FIG. 7, and may have line shapes intersecting the active areas 310A, respectively. A plurality of gate dielectric layers, a plurality of word lines WL (refer to FIG. 7), and a plurality of buried insulating layers are sequentially formed within the word line trenches. Upper surfaces of the buried insulating layers may be disposed at about the same level as an upper surface of the substrate 310.

In some embodiments, after the word lines WL are formed, impurity ions may be implanted into the substrate 310 on both sides of the word lines WL to form source and drain areas in and around top surfaces of the active areas 310A. In some other embodiments, before the word lines WL are formed, an ion implantation process for forming source and drain areas may be performed.

After a first insulating film 320 and a second insulating film 322 are sequentially formed on the substrate 310 in the cell array area CA and the core area CORE (see FIG. 8A), portions of the first insulating film 320 and the second insulating film 322 corresponding to the core area CORE are removed to expose the active area 310B of the substrate 310 again. Thereafter, a gate dielectric film 324 is formed on the substrate 310 in the core area CORE while a mask pattern (not shown) covers the cell array area CA.

The first insulating film 320 may include, e.g. an oxide film, and the second insulating film 322 may include a nitride film. However, the inventive concept is not limited thereto.

The gate dielectric film 324 may include at least one selected from the group of a silicon oxide film, a silicon nitride film, a silicon oxynitride film, an oxide/nitride/oxide (ONO) film, and a high-k dielectric film having a higher dielectric constant than a silicon oxide film. In some embodiments, the gate dielectric film 324 may have a dielectric constant of about 10 to about 25. In some embodiments, the gate dielectric film 324 may include at least one selected from the group consisting of hafnium oxide (HfO), hafnium silicate (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), and lead scandium tantalum oxide (PbScTaO). For example, the gate dielectric film 324 may include $HfO_2$, $Al_2O_3$, $HfAlO_3$, $Ta_2O_3$, or $TiO_2$.

Figure 8B:
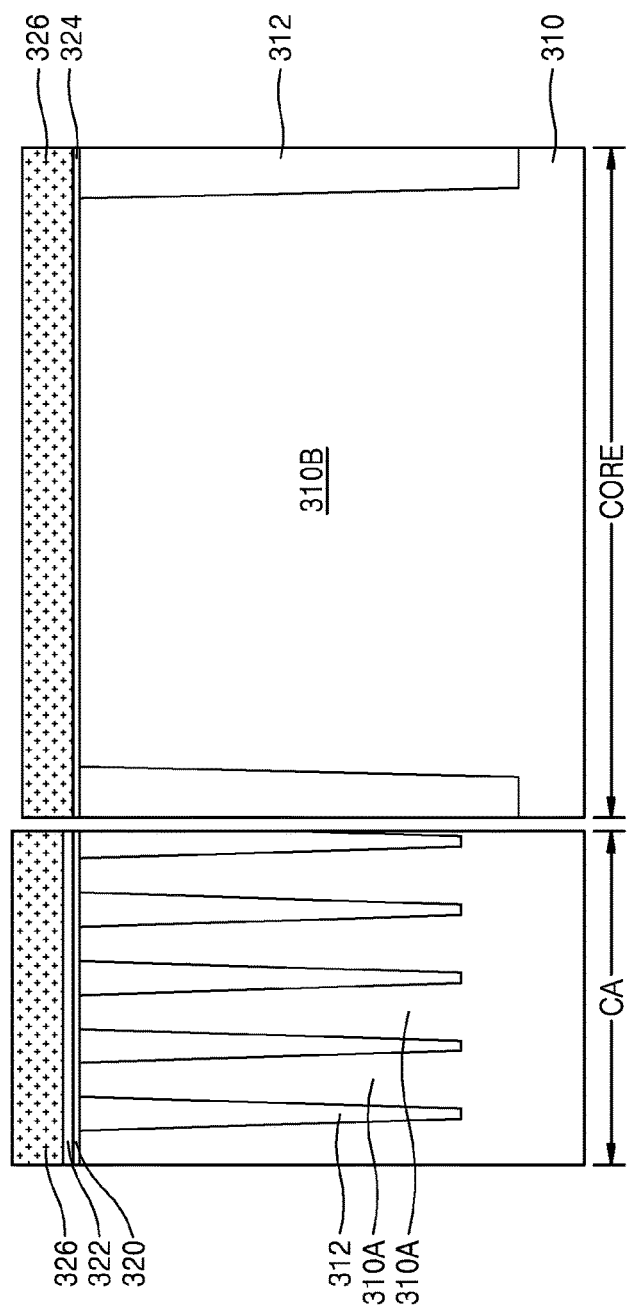

Referring to FIG. 8B, a first conductive layer 326 may be formed on the substrate 310 in the cell array area CA and the core area CORE.

The first conductive layer 326 may be formed, e.g. of doped polysilicon. However, the inventive concept is not limited thereto.

Figure 8C:
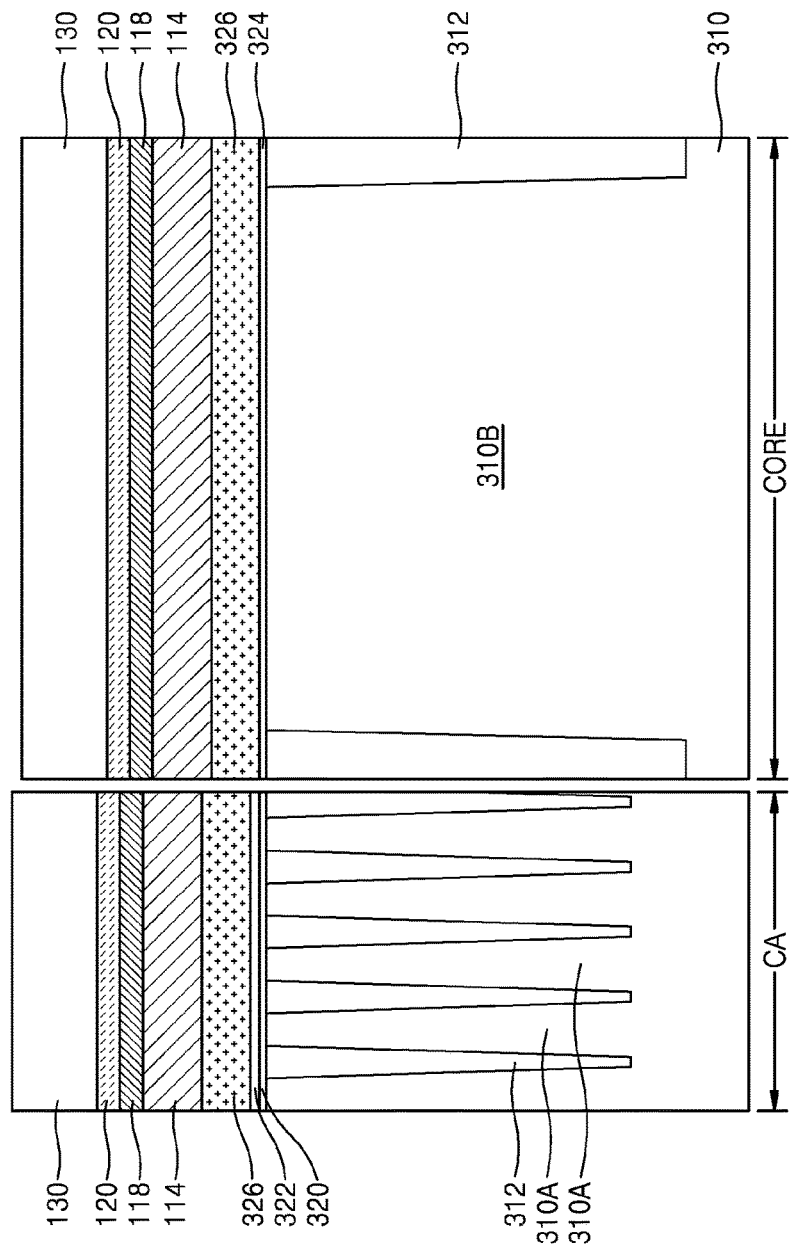

Referring to FIG. 8C, in a manner similar to that explained in connection with FIG. 2A, the hard mask layer 114, the inorganic reflection-preventing film 118, the organic reflection-preventing film 120, and the photoresist film 130 may be sequentially formed on the first conductive layer 326 in the cell array area CA and the core area CORE.

Figure 8D:
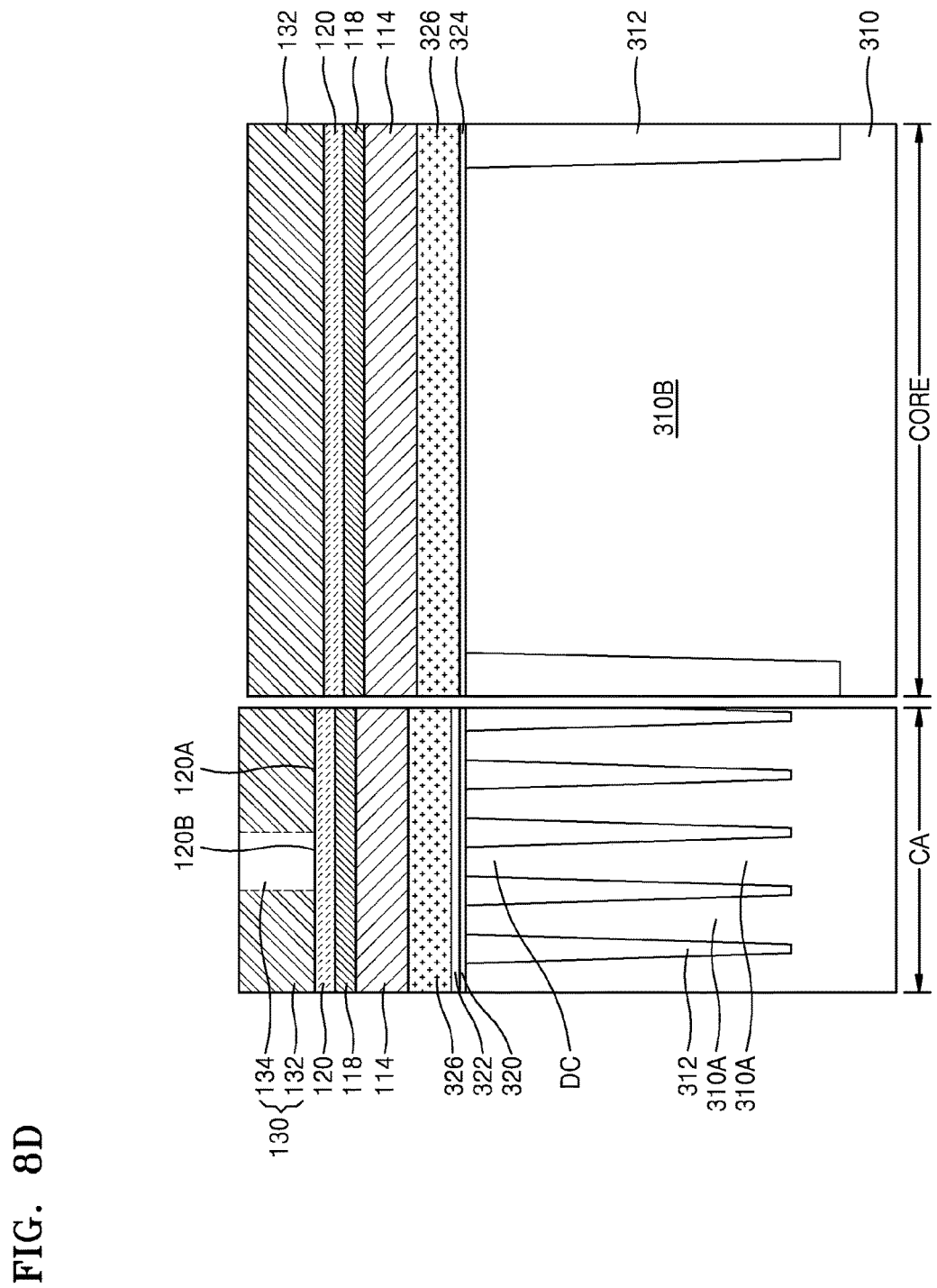

Referring to FIG. 8D, the first area 132 of the photoresist film 130 is exposed by using a photomask having a plurality of light shielding areas and a plurality of light-transmitting areas, for example, a photomask that has a structure similar to the photomask 140 illustrated in FIG. 2B.

The non-exposed area 134 of the photoresist film 130 may be used, for example, to form a direct contact DC of the integrated circuit device 300 as will be described in the present embodiment.

Due to the exposing process, as described in connection with FIG. 3, an acid is generated in the exposed first area 132 of the photoresist film 130. Due to the acid generated in the first area 132 of the photoresist film 130, in the first area 132 of the photoresist film 130, an acid-labile group (R) in —OR is removed to expose a hydrophilic group, such as —OH. Thus, a surface of the first area 132 has higher hydrophilicity.

In some embodiments, in the first surface 120A of the organic reflection-preventing film 120 facing the exposed first area 132 of the photoresist film 130, an acid-labile group included in the organic reflection-preventing film 120 is removed to expose a hydrophilic group, such as —OH, and thus, hydrophilicity of the first surface 120A may increase.

However, in the second surface 120B of the organic reflection-preventing film 120 facing the non-exposed portion 134 of the photoresist film 130, an acid-labile group is not removed so that the second surface 120B has higher hydrophobicity than the first surface 120A.

Accordingly, hydrophilicity of the first surface 120A of the organic reflection-preventing film 120 may be similar to that of the first area 132 of the photoresist film 130 facing the first surface 120A, and thus, adhesiveness between the first surface 120A and the first area 132 may improve.

Figure 8E:
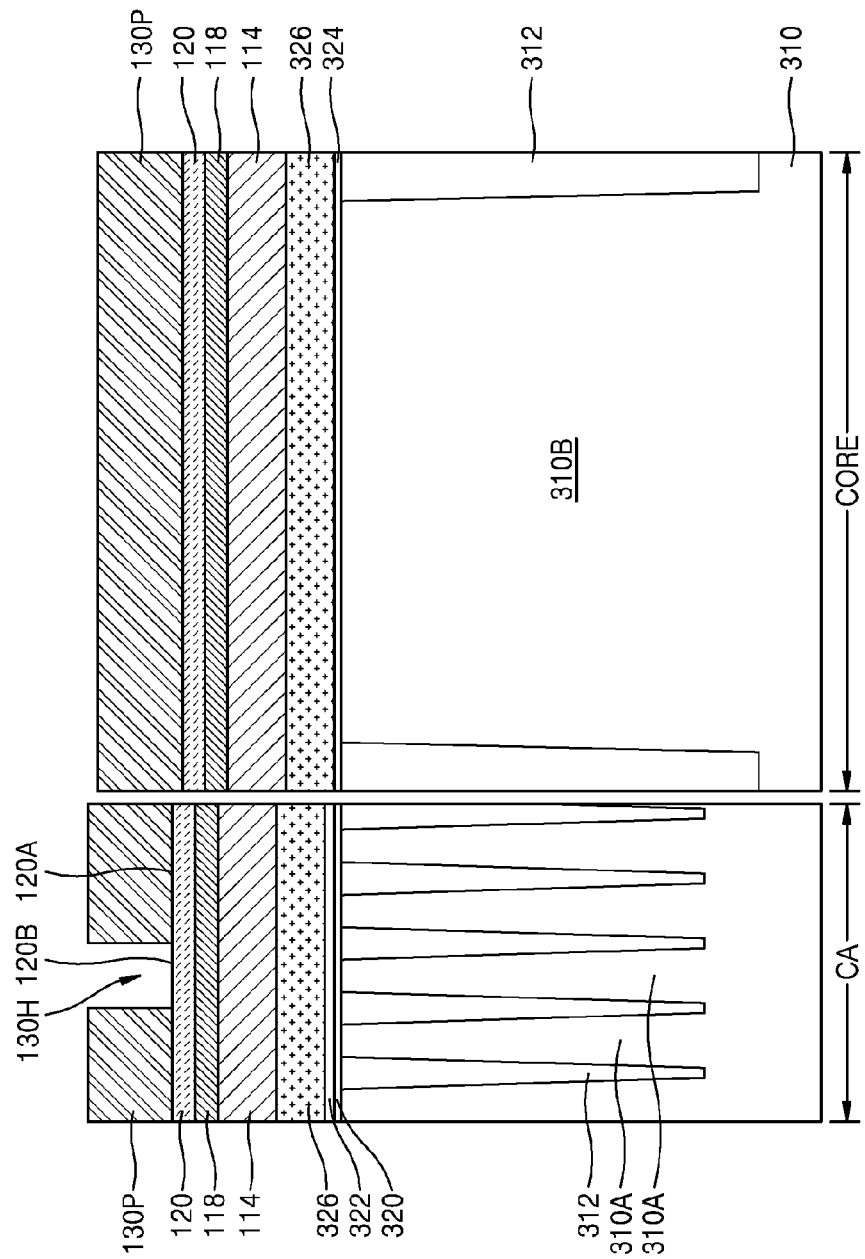

Referring to FIG. 8E, in a manner similar to that explained in connection with FIG. 2C, the exposed photoresist film 130 is developed by using a negative tone developer to selectively remove the non-exposed area 134 of the photoresist film 130 to form the photoresist pattern 130P constituted of the exposed first area 132.

Since hydrophilicity of the first surface 120A of the organic reflection-preventing film 120 is similar to hydrophilicity of the surface of the photoresist pattern 130P facing the first surface 120A and due to the similar hydrophilicity, adhesiveness between the organic reflection-preventing film 120 and the photoresist pattern 130P improves. Even when in the example cell array area CA, the photoresist pattern 130P may have a relatively high aspect ratio and a relatively fine width, due to the improved adhesiveness between the photoresist pattern 130P and the organic reflection-preventing film 120. The collapse of the photoresist pattern 130P may therefore be prevented.

Also, due to a low solubility of the organic reflection-preventing film 120 with respect to the negative tone developer, the first repeating unit represented by Formula 1 may be included in a relatively small amount in the organic reflection-preventing film 120, for example, in an amount of about 1 mol % to about 40 mol % based on a total polymer amount of the organic reflection-preventing film 120. As a result of selective removing of the non-exposed area 134 (see, e.g. FIG. 2B) of the photoresist film 130 by using a negative tone developer, even when the second surface 120B of the organic reflection-preventing film 120 is exposed to the negative tone developer through the opening 130H of the photoresist pattern 130P, at least a portion of the organic reflection-preventing film 120 may remain, i.e. not removed by the negative tone developer, and an additional step formed by etching the organic reflection-preventing film 120 may not be formed. Thus, the collapse of a pattern due to an increased aspect ratio during a development process may be prevented.

Figure 8F:
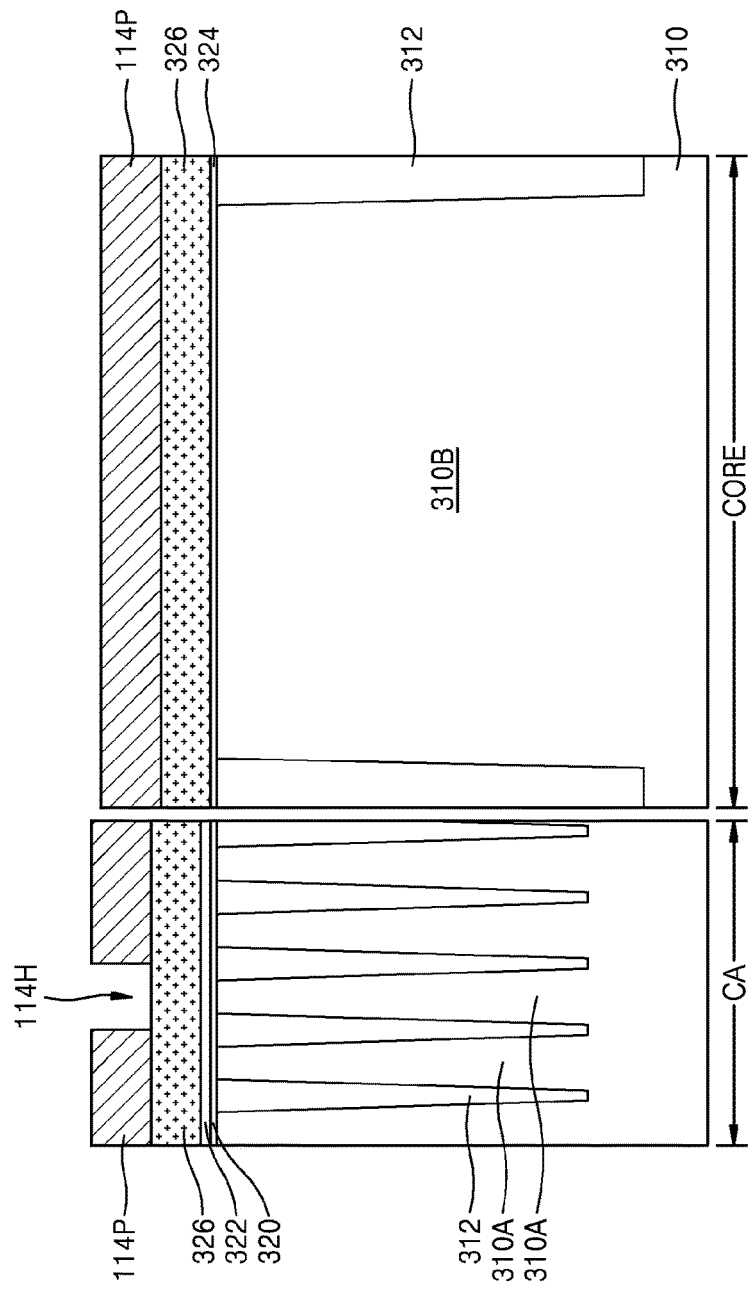

Referring to FIG. 8F, in a manner similar to that explained in connection with FIGS. 2C to 2E, underlying films are sequentially and anisotropically-etched by using the photoresist pattern 130P as an etch mask to form the hard mask pattern 114P having the opening 114H.

In the cell array area CA, a portion of the first conductive layer 326 may be exposed by the opening 114H. The core area CORE may not be exposed to the outside due to the coverage of the hard mask pattern 114P.

In FIG. 8F, films covering a top surface of the hard mask pattern 114P are not illustrated. However, the residual of the inorganic reflection-preventing film 118, the organic reflection-preventing film 120, and the photoresist film 130 illustrated in FIG. 8E may remain.

Figure 8G:
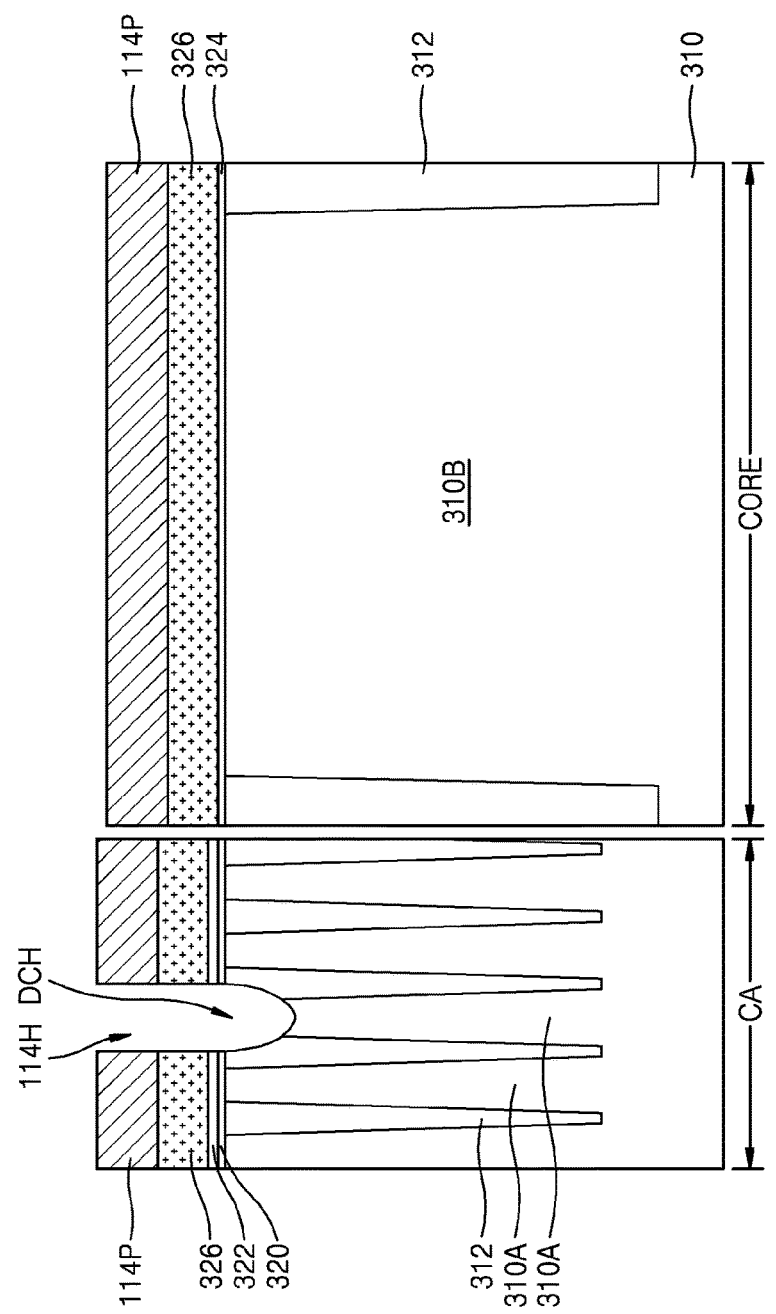

Referring to FIG. 8G, the first conductive layer 326 is etched via the opening 114H of the hard mask pattern 114P to expose the substrate 310 and the device isolation film 312, and the exposed portion of the substrate 310 and the exposed portion of the device isolation film 312 are etched to form a direct contact hole (DCH) exposing the active area 310A of the substrate 310 in the cell array area CA.

Figure 8H:
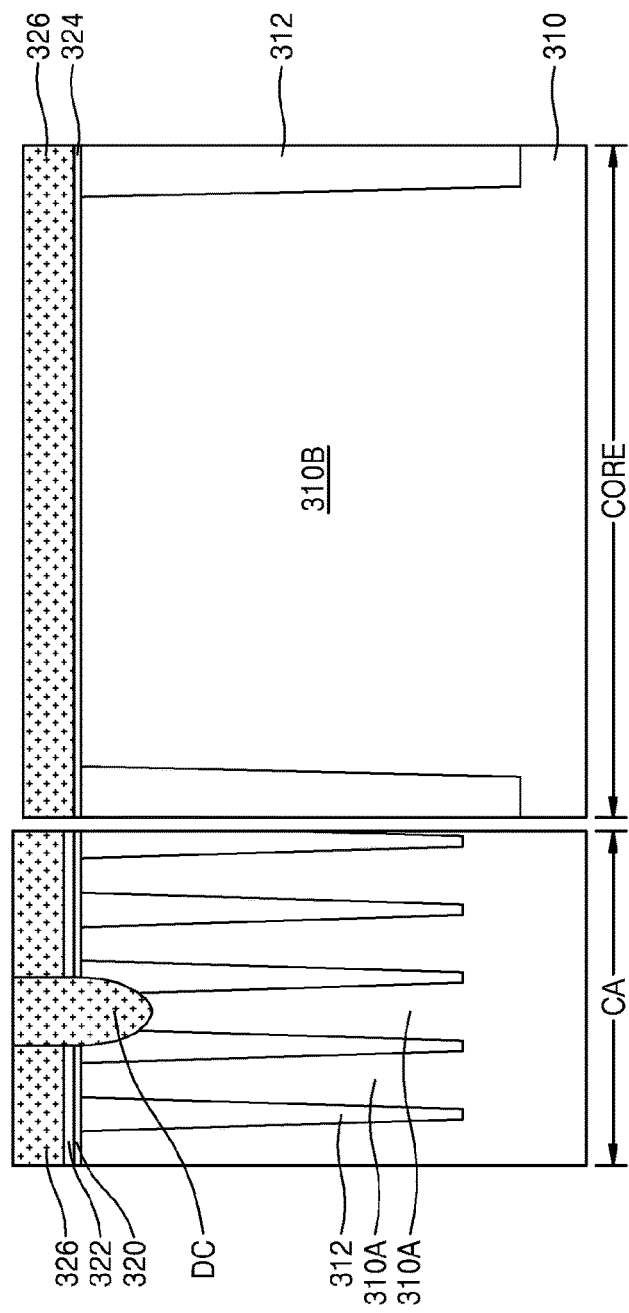

Referring to FIG. 8H, after removing the hard mask pattern 114P, a second conductive layer (not shown) having a thickness sufficient for filling the direct contact hole DCH is formed in the direct contact hole DCH and on the first conductive layer 326. Next, the second conductive layer is etched back in such a way that the second conductive layer remains only within the direct contact hole DCH. The remaining second conductive layer constitutes a direct contact DC.

The second conductive layer may be formed, e.g., of doped polysilicon. However, the inventive concept is not limited thereto.

Figure 8I:
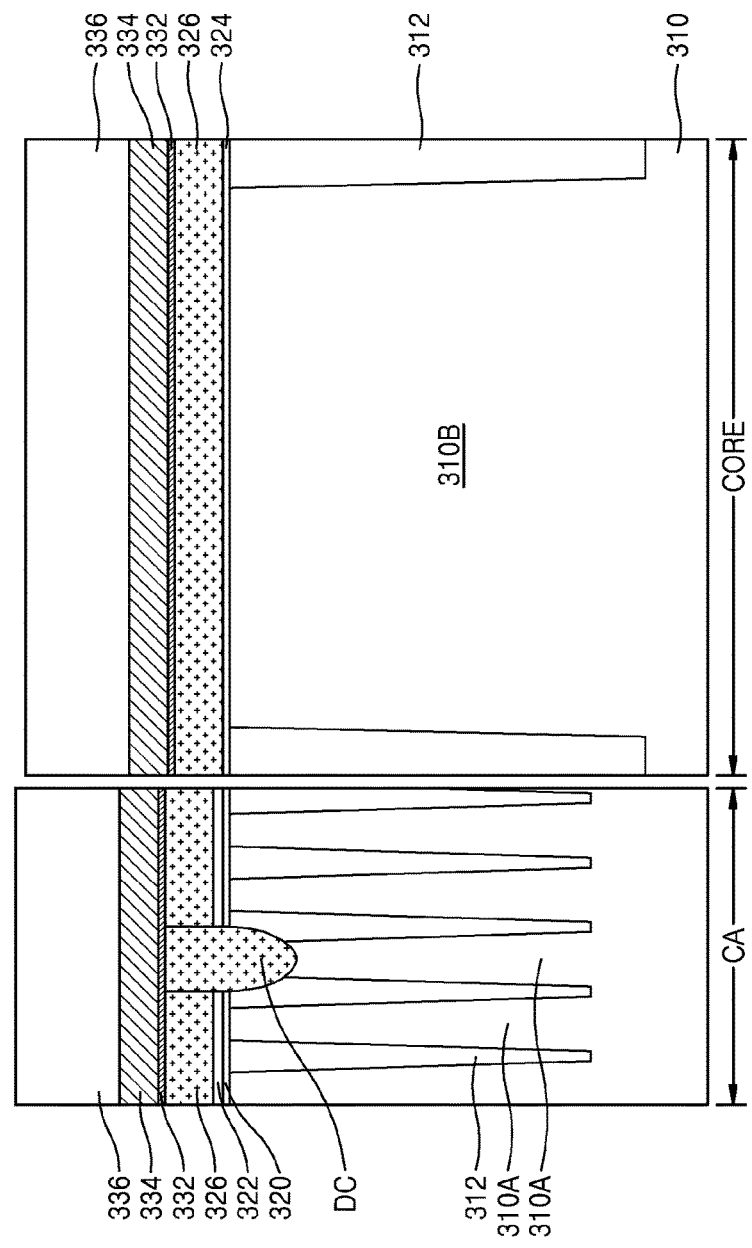

Referring to FIG. 8I, in the cell array area CA and the core area CORE, a third conductive layer 332, a fourth conductive layer 334, and a capping layer 336 are sequentially formed on the first conductive layer 326 and the direct contact DC.

The third conductive layer 332 and the fourth conductive layer 334 may each be formed, e.g. of TiN, TiSiN, W, tungsten silicide, or a combination thereof. However, the inventive concept is not limited thereto. In some embodiments, the third conductive layer 332 may be formed of TiSiN, and the fourth conductive layer 334 may be formed of W.

The capping layer 336 may include, e.g., a silicon nitride film.

Figure 8J:
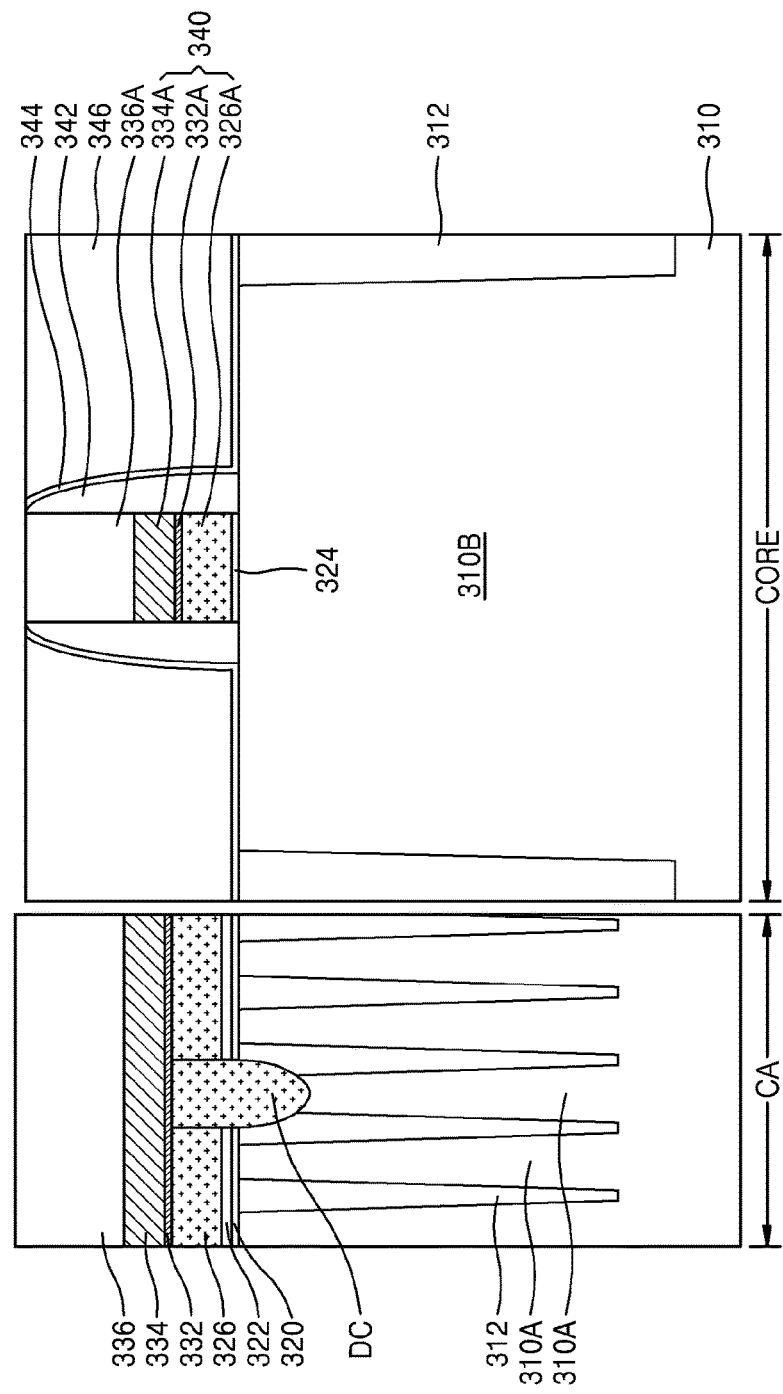

Referring to FIG. 8J, in the core area CORE, the gate dielectric film 324, the first conductive layer 326, the third conductive layer 332, the fourth conductive layer 334, and the capping layer 336 may be patterned while the cell array area CA is covered with a mask pattern (not shown). As a result, a gate electrode 340 for an electrical circuit, e.g. a peripheral circuit, which includes a first conductive pattern 326A, a third conductive pattern 332A, and a fourth conductive pattern 334A, may be formed on the gate dielectric film 324. The gate electrode 340 may be covered by a capping pattern 336A.

After forming an insulating spacer 342 at both side walls of a gate structure having a stack structure including the gate dielectric layer 324, the gate electrode 340, and the capping pattern 336A, an insulating thin film 344 may be formed on the whole surface of the core area CORE to cover the gate structure.

The insulating spacer 342 may be formed, e.g. of oxide, nitride, or a combination thereof, and the insulating thin film 344 may be formed, e.g. of nitride. However, the inventive concept is not limited thereto.

Next, an interlayer insulating layer 346, which is planarized and covers the gate structure and the insulating thin film 344, may be formed. The interlayer insulating layer 346 may include, e.g., a silicon oxide layer formed by using high density plasma (HDP) or flowable chemical vapor deposition (FCVD). However, the inventive concept is not limited thereto.

Figure 8K:
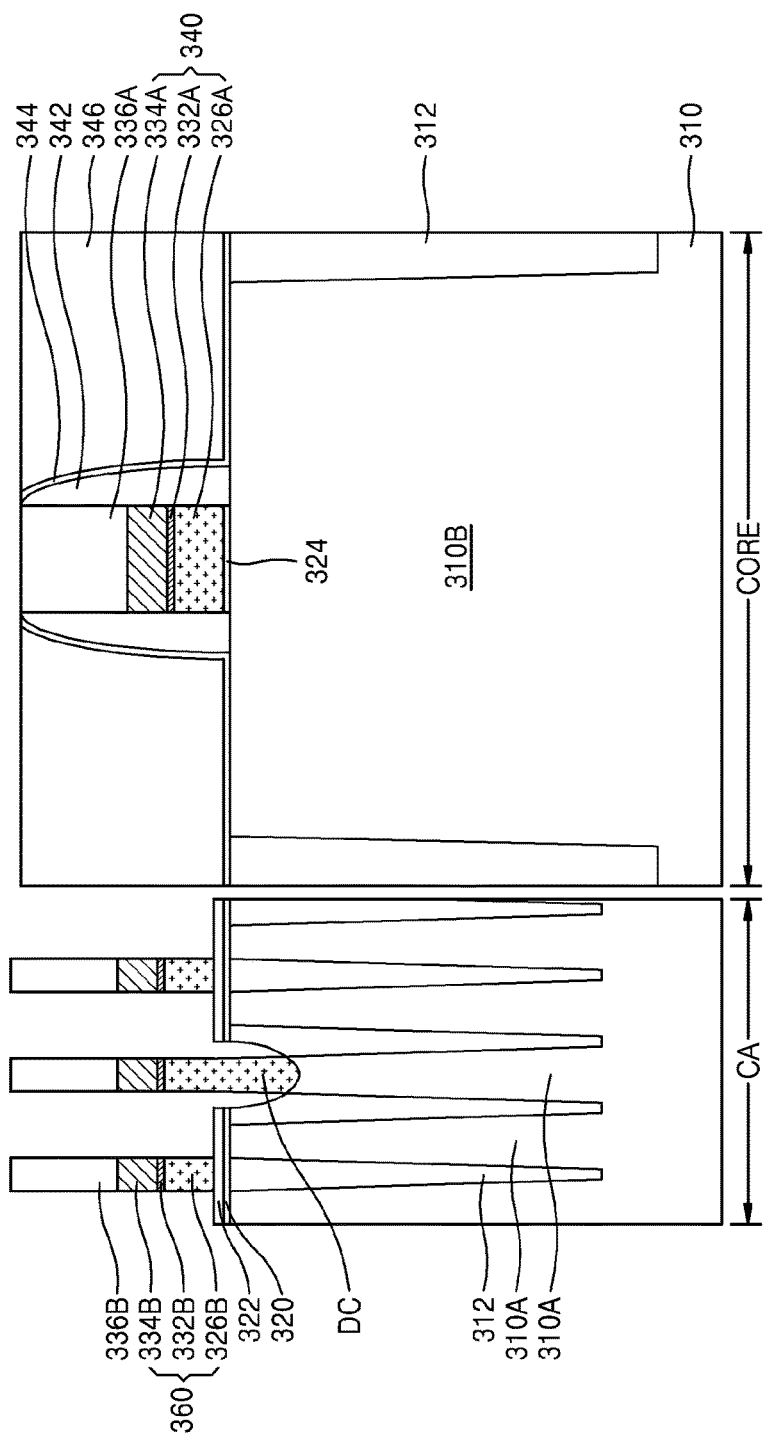

Referring to FIG. 8K, by using a photolithography process, a portion of the capping layer 336 in the cell array area CA is patterned to form a capping pattern 336B, and a portion of the underlying structure is etched by using the capping pattern 336B as an etch mask to form a plurality of bit lines 360 in the cell array area CA.

In detail, in the cell array area CA, by using the capping pattern 336B as an etch mask, portions of the fourth conductive layer 334, the third conductive layer 332, the first conductive layer 326, and the direct contact DC are sequentially etched to form a plurality of bit lines 360 each including a first conductive pattern 326B, a third conductive pattern 332B, and a fourth conductive pattern 334B. The bit lines 360 may be connected to the active area 310A of the substrate 310 through the direct contact DC.

In forming the bit lines 360, the formation of the capping pattern 336B by using a photolithography process may be performed by using the method explained in connection with the hard mask pattern 114P illustrated in FIGS. 8C to 8F. In this regard, by using the method of forming patterns according to embodiments of the present disclosure, the adhesiveness between a photoresist pattern and an organic reflection-preventing film is increased so that collapse of the photoresist pattern is prevented, and the capping pattern 336B and the bit lines 360 may be formed without pattern defects.

Figure 8L:
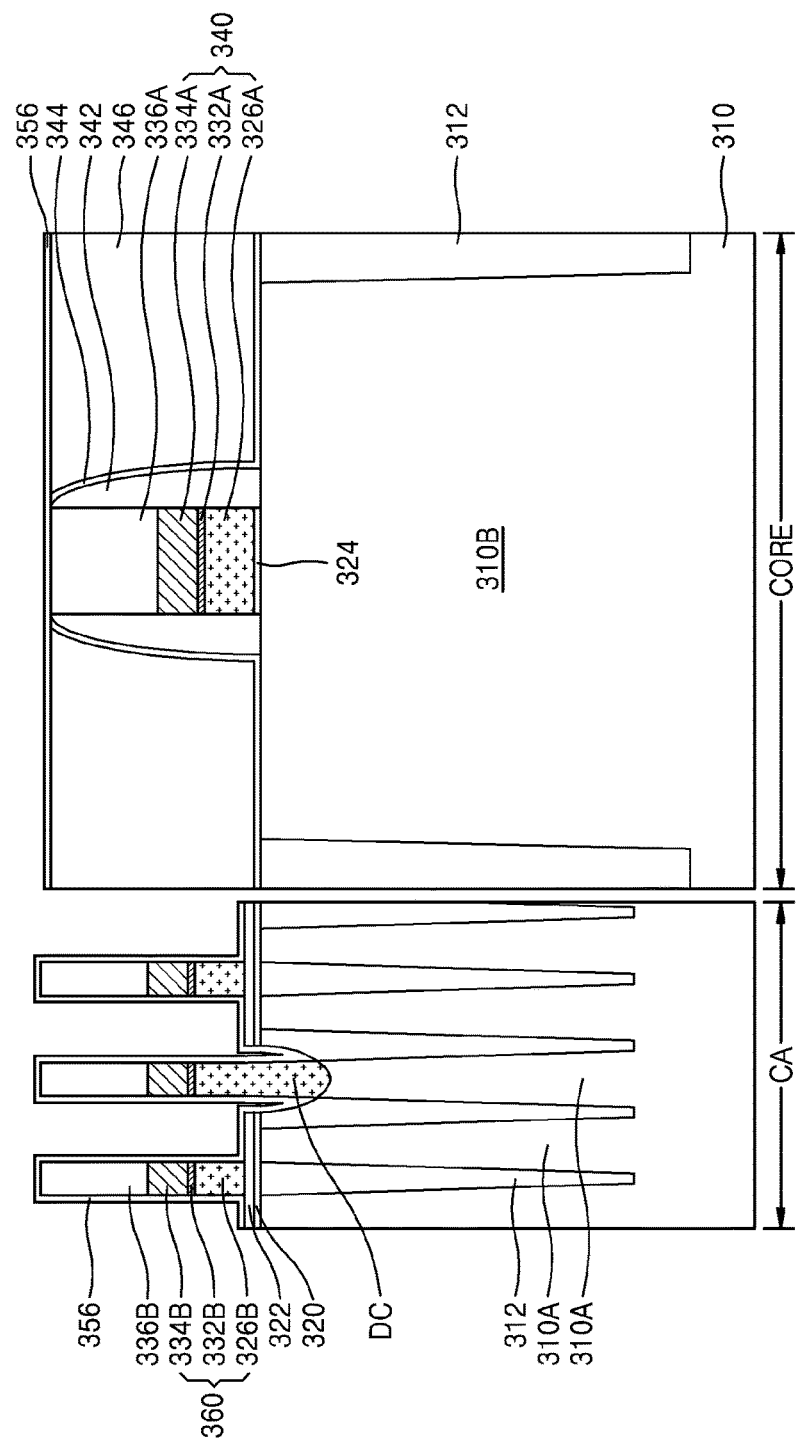

Referring to FIG. 8*l*, an insulating liner 356 is formed on an exposed upper surface of the resultant structure including the bit lines 360 in the cell array area CA and the core area CORE.

The insulating liner 356 may include, e.g., a nitride film, but the inventive concept is not limited thereto.

Figure 8M:
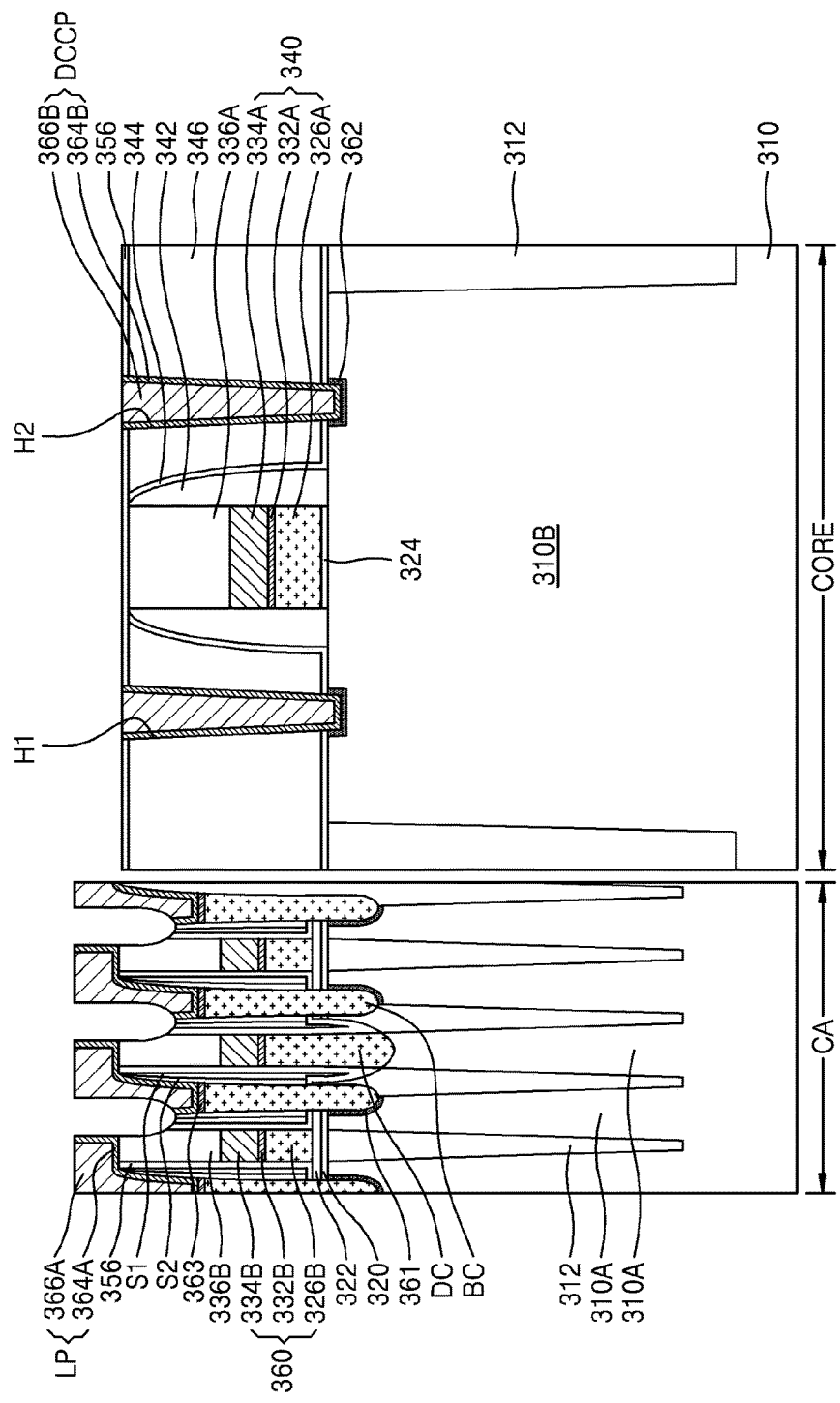

Referring to FIG. 8M, in a portion of the resultant structure of FIG. 8I corresponding to the cell array area CA, a plurality of buried contacts BC (see FIG. 7) and a plurality of conductive landing pads LP connected to the buried contacts BC are formed in the space between the bit lines 360, and in a portion of the resultant structure of FIG. 8I corresponding to the core area CORE, a plurality of direct contact plugs DCCP connected to the active area 310B is formed.

In detail, after forming insulating spacers S1 and S2, which cover the insulating liner 356 at side walls of each of the bit lines 360, and a plurality of insulating patterns (not shown in the cross-sectional view of FIG. 8L), which define a plurality of holes for forming a plurality of buried contacts BC (refer to FIG. 7) in the space between the bit lines 360, in the cell array area CA of the resultant structure of FIG. 8L, the active area 310A of the substrate 310 is exposed through the holes and a metal silicide film 361 is formed on the surface of the exposed active area 310A. Then, the buried contacts BC that are connected to the active area 310A are formed by filling a lower portion of the inside of each hole with a conductive layer.

In some embodiments, the metal silicide film 361 may be formed, e.g. of cobalt silicide. However, the inventive concept is not limited thereto, and the metal silicide film 361 may be formed of a material selected from various kinds of metal silicides. In some embodiments, the buried contacts BC may be formed of doped polysilicon. In some embodiments, the metal silicide film 361 may be omitted.

In some embodiments, the insulating spacers S1 and S2 may be formed, e.g. of silicon oxide, silicon nitride, air, or a combination thereof. In the current embodiment, an insulating spacer may be formed as a double layer (including the insulating spacers S1 and S2), the inventive concept is not limited thereto. In another embodiment, the insulating spacer may be formed as a single layer or a triple layer. The insulating patterns may include a nitride layer, an oxide layer, or a combination thereof.

Next, a metal silicide film 363 is formed on the buried contacts BC in the holes between the bit lines 360. In some embodiments, the metal silicide film 363 may be formed, e.g. of cobalt silicide. However, the inventive concept is not limited thereto, and the metal silicide layer 363 may be formed of a material selected from various kinds of metal silicides. In some embodiments, the metal silicide film 363 may be omitted.

In the core area CORE, portions of the insulating liner 356 and the interlayer insulating film 346 are etched to form a plurality of contact holes H1 and H2 exposing the active area 310B of the substrate 310.

A metal silicide film 362 may be formed on a surface of the active area 310B that is exposed by the contact holes H1 and H2. In some embodiments, the metal silicide layer 362 may be formed of cobalt silicide. However, the inventive concept is not limited thereto, and the metal silicide layer 362 may be formed of a material selected from various kinds of metal silicides. In some embodiments, the metal silicide layer 362 may be omitted.

Next, in the cell array area CA and the core area CORE, a conductive barrier film and a conductive layer are formed and are etched back to expose the interlayer insulating layer 346. As a result, in the cell array area CA, a portion of the conductive barrier layer and a portion of the conductive layer respectively remain as a first conductive barrier layer 364A and a first conductive layer 366A which fill the inside of the plurality of holes and cover the plurality of bit lines 260 on the metal silicide film 363. In the core area CORE, a portion of the conductive barrier film and a portion of the conductive layer may remain as a second conductive barrier film 364B and a second conductive layer 366B filling the inside of the contact holes H1 and H2.

In some embodiments, each of the first conductive barrier film 364A and the second conductive barrier film 364B may have a Ti/TiN stack structure. In some embodiments, each of the first conductive layer 366A and the second conductive layer 366B may be formed of doped polysilicon, metal, metal silicide, conductive metal nitride, or a combination thereof.

Thereafter, in the cell array area CA, a mask pattern (not shown) exposing a portion of the first conductive layer 366A is formed on the first conductive layer 366A, and then, by using the mask pattern as an etch mask, the first conductive barrier film 364A, the first conductive layer 366A, and the surrounding insulating films are etched to form a plurality of landing pads LP, each including the first conductive barrier film 364A and the remaining portion of the first conductive layer 366A. In the core area CORE, the second conductive barrier film 364B and the second conductive layer 366B located inside each of the contact holes H1 and H2 constitute the direct contact plugs DCCP connected to the active area 310B.

The landing pads LP have, like the buried contacts BC illustrated in FIG. 7, a plurality of island-shape patterns that are spaced apart from each other.

In the cell array area CA, the landing pads LP may be formed by using a photolithography process. The landing pads LP may be formed by performing the same processes as explained to form the hard mask pattern 114P in connection with FIGS. 8C to 8F. When the method of forming patterns according to embodiments of the present disclosure is used, the adhesiveness between a photoresist pattern and an organic reflection-preventing film is improved, and accordingly, the collapse of the photoresist pattern may be prevented and the landing pads LP with desired shapes may be obtained without pattern defects.

Figure 8N:
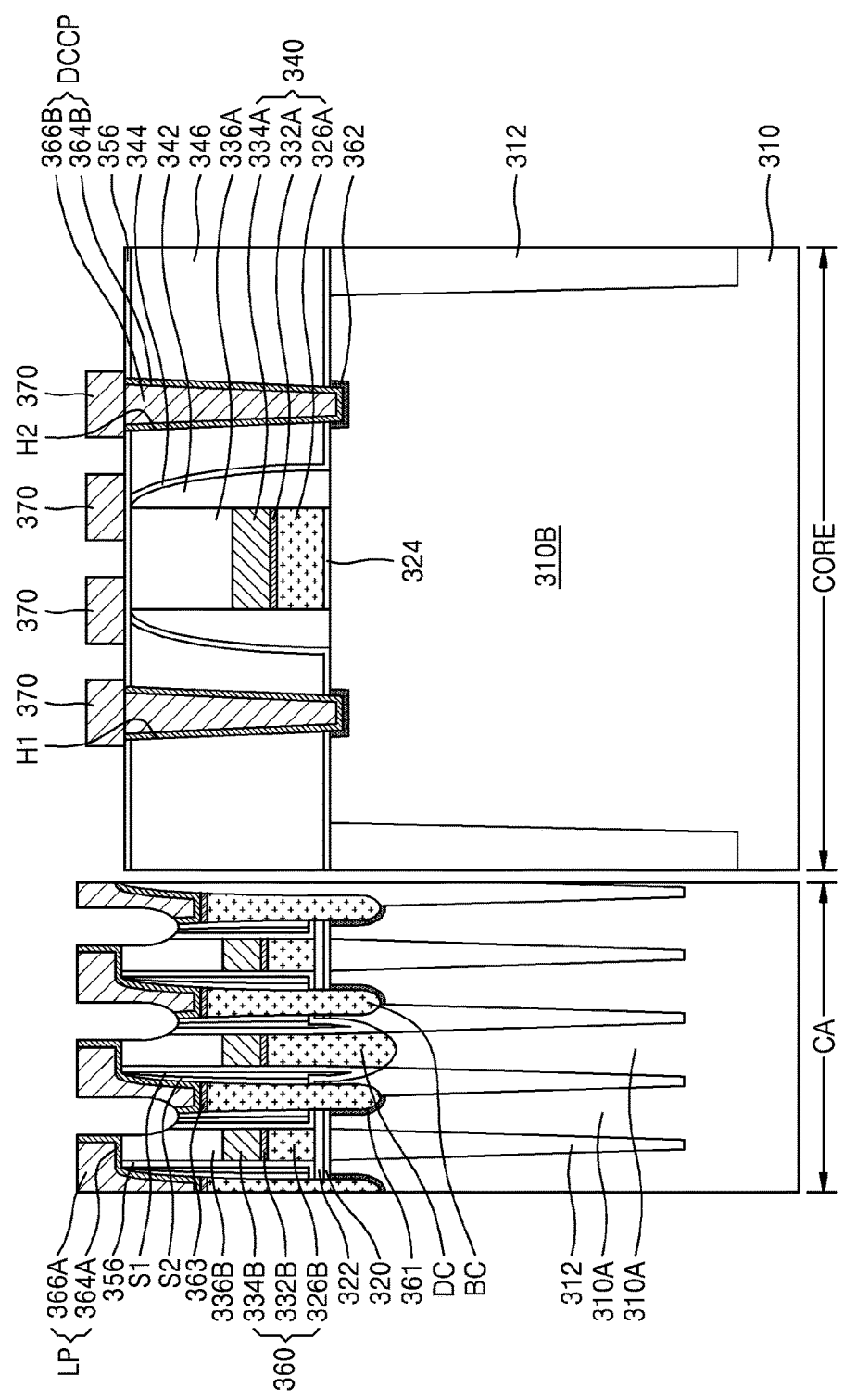
Figure 80:
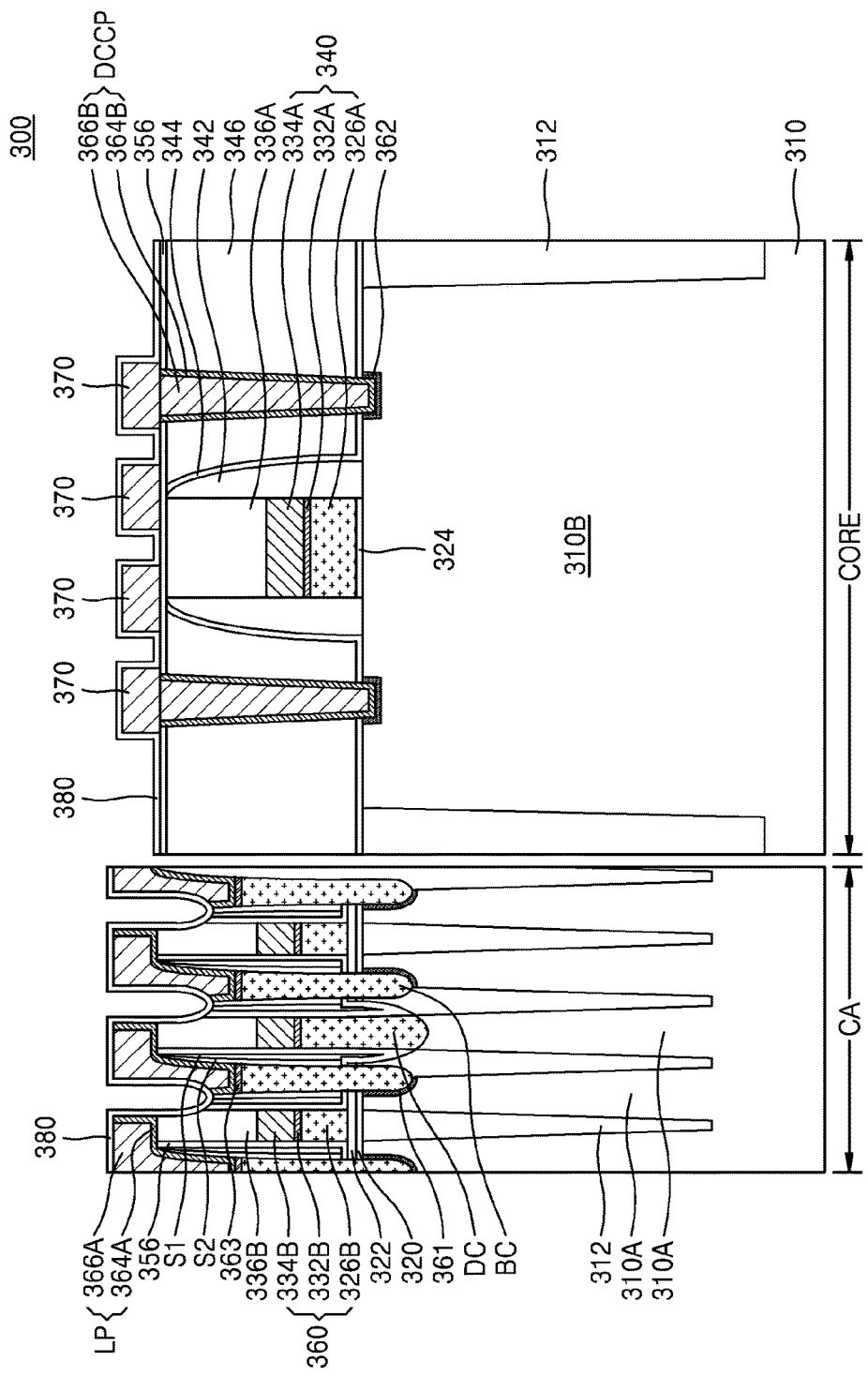

Referring to FIG. 8N, in the core area CORE, a plurality of interconnection layers 370 are formed on the resultant structure including the direct contact plugs DCCP.

Some of the interconnection layers 370 may be connected to the direct contact plugs DCCP, and others of the interconnection layers 370 may be located on the capping pattern 336A covering the gate electrode 340 for peripheral circuits.

In some embodiments, each of the interconnection layers 370 may include a single metal layer or a plurality of metal layers. In some embodiments, the interconnection layers 370 may include impurity-doped semiconductor, metal nitride, or metal silicide. For example, the interconnection layers 370 may be formed of tungsten.

The interconnection layers 370 may be formed by using a photolithography process. During the photolithography process for the forming the interconnection layers 370, the processes explained to form the hard mask pattern 114P in connection with FIGS. 8C to 8F may be used. When the method of forming patterns according to embodiments of the present disclosure is used, the adhesiveness between a photoresist pattern and an organic reflection-preventing film is improved, and accordingly, the collapse of the photoresist pattern may be prevented and the interconnection layers 370 may be formed in desired shapes without pattern defects.

Referring to FIG. 8O, an insulating thin film 380 is formed on an upper surface of the resultant structure including the conductive landing pads LP in the cell array area CA and the interconnection layers 370 in the core area CORE. The insulating thin film 380 may include, e.g. a nitride film, but the inventive concept is not limited thereto.

Thereafter, in the cell array area CA and the core area CORE, another insulating film (not shown) is formed on the insulating thin film 380; in the cell array area CA, a plurality of capacitor lower electrodes (corresponding to the lower electrode ST of FIG. 7) that are electrically connectable to the conductive landing pads LP are formed; and in the core area CORE, a multi-layered interconnection structure is formed, thereby completing manufacturing of the integrated circuit device 300 according to some embodiments of the present disclosure.

Hereinafter, examples of a method of preparing polymers that are used to form an organic reflection-preventing film used in a method of forming patterns according to embodiments of the present disclosure, a method of preparing a composition for forming an organic reflection-preventing film, and a method of preparing an organic reflection-preventing film will now be described.

Preparation of Polymer Represented by Formula 1

A method of preparing polymers that are used to form an organic reflection-preventing film used in a method of forming patterns according to embodiments of the present disclosure will be described.

A polymer represented by Formula 1 may be subjected to the following processes.

In a first reaction process, a heterocyclic compound containing sulfur (S) is reacted with (meth)acrylic acid or (meth)acrylic acid halide to obtain an unsaturated ethylene monomer including $R_2$ and $R_3$.

In a second reaction process, a compound having a hydroxyl group (—OH) is reacted with (meth)acrylic acid or (meth)acrylic acid halide to obtain an unsaturated ethylene monomer having $R_2$ and $R_4$.

In a third reaction process, a compound having a phenyl group is reacted with (meth)acrylic acid or (meth)acrylic acid halide to obtain an unsaturated ethylene monomer having $R_2$ and $R_5$.

Thereafter, a product of the first reaction process, a product of the second reaction process, and a product of the third reaction process are polymerized to obtain the polymer of Formula 1.

Examples of the heterocyclic compound containing sulfur (S) used in the first reaction process are illustrated below:

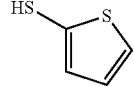

[Formula 4a]

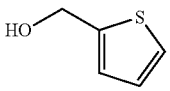

[Formula 4b]

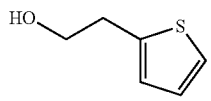

[Formula 4c]

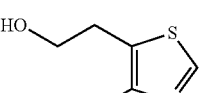

[Formula 4d]

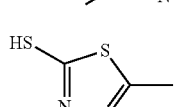

[Formula 4e]

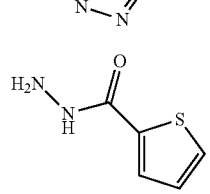

[Formula 4f]

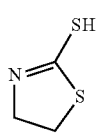

[Formula 4g]

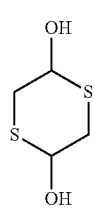

[Formula 4h]

Examples of the unsaturated ethylene monomer of the heterocyclic compound containing sulfur (S) obtainable from the first reaction process are illustrated below:

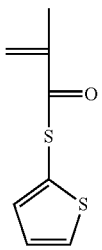

[Formula 5a]

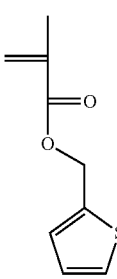

[Formula 5b]

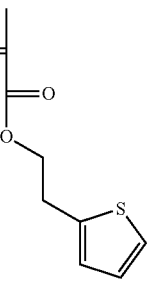

[Formula 5c]

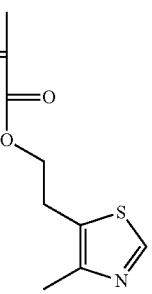

[Formula 5d]

[Formula 5e]

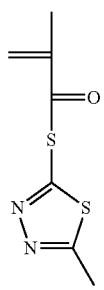

[Formula 5f]

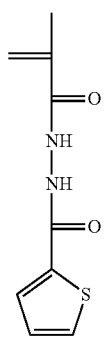

[Formula 5g]

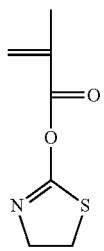

[Formula 5h]

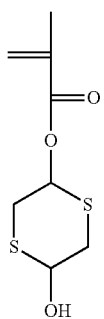

Examples of the compound containing a hydroxyl group (—OH) used in the second reaction process are illustrated below:

[Formula 6a]

[Formula 6b]

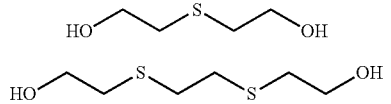

Examples of the unsaturated ethylene monomer of the heterocyclic compound containing a hydroxyl group (—OH) obtainable from the second reaction process are illustrated below:

[Formula 7a]

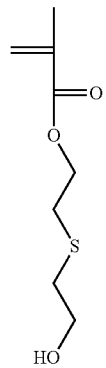

[Formula 7b]

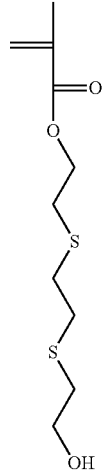

Examples of the compound containing a phenyl group used in the third reaction process are illustrated below:

[Formula 8a]

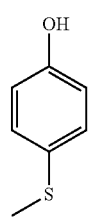

[Formula 8b]

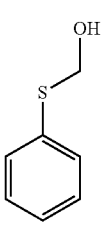

[Formula 8c]

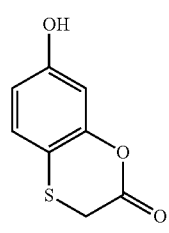

[Formula 8d]

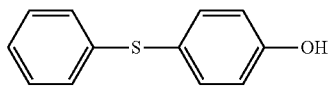

Examples of the unsaturated ethylene monomer of the compound containing a phenyl group obtainable from the third reaction process are illustrated below:

[Formula 9a]

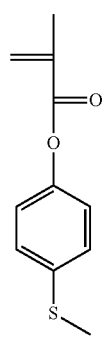

[Formula 9b]

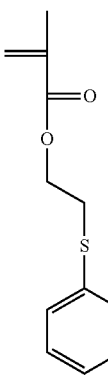

[Formula 9c]

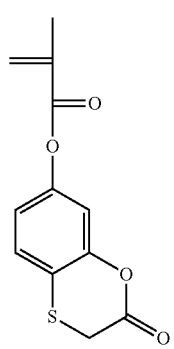

[Formula 9d]

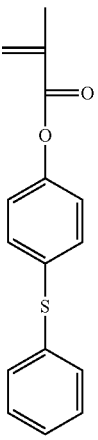

[Monomer Preparation Example 1-1] Preparation of Monomer Represented by Formula 5a

[Reaction Scheme 1]

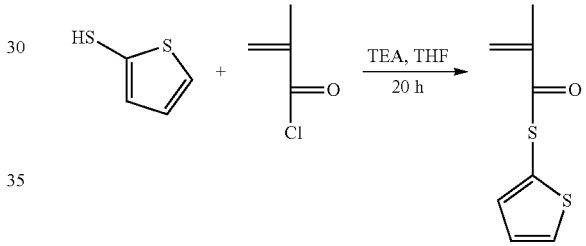

As shown in Reaction Scheme 1, a magnet stirring bar was placed in a 500 ml 2-neck flask, and 30 g (0.256 mol) of thiophenethiol represented by Formula 4a, 27 g (0.268 mol) of triethylamine (TEA), and 340 ml of tetrahydrofurane (THF) were added thereto, and the result was cooled with iced water, and then, 25.43 ml (0.253 mol) of methacryoyl chloride was slowly added dropwise thereto. When the dropping was completed, the temperature of the reaction product was raised and the reaction as performed for 20 hours. When the reaction stopped, the reaction product was filtered to remove salt, which is a by-product, therefrom. Then, the result was washed several times with deionized water (DIW) to remove residual triethylamine and methacryoyl chloride. Then, the result was dried by using magnesium sulfate, and tetrahydrofurane was removed therefrom under reduced pressure, and vacuum drying was performed to obtain 25 g of a monomer represented by Formula 5a (yield: 83%).

[Monomer Preparation Example 1-2] Preparation of Monomer Represented by Formula 5b A monomer represented by Formula 5b was prepared in an amount of 28 g in the same manner as in Monomer Preparation Example 1-1, except that 30 g of a compound represented by Formula 4b was used instead of 30 g of the compound represented by Formula 4a (yield: 93%).

[Monomer Preparation Example 1-3] Preparation of Monomer Represented by Formula 5c A monomer represented by Formula 5c was prepared in an amount of 27 g in the same manner as in Monomer Preparation Example 1-1, except that 30 g of a compound represented by Formula 4c was used instead of 30 g of the compound represented by Formula 4a (yield: 90%).

[Monomer Preparation Example 1-4] Preparation of Monomer Represented by Formula 5d A monomer represented by Formula 5d was prepared in an amount of 25 g in the same manner as in Monomer Preparation Example 1-1, except that 30 g of a compound represented by Formula 4d was used instead of 30 g of the compound represented by Formula 4a (yield: 83%).

[Monomer Preparation Example 1-5] Preparation of Monomer Represented by Formula 5e A monomer represented by Formula 5e was prepared in an amount of 20 g in the same manner as in Monomer Preparation Example 1-1, except that 30 g of a compound represented by Formula 4e was used instead of 30 g of the compound represented by Formula 4a (yield: 60%).

[Monomer Preparation Example 1-6] Preparation of Monomer Represented by Formula 5f A monomer represented by Formula 5f was prepared in an amount of 25 g in the same manner as in Monomer Preparation Example 1-1, except that 30 g of a compound represented by Formula 4f was used instead of 30 g of the compound represented by Formula 4a (yield: 70%).

[Monomer Preparation Example 1-7] Preparation of Monomer Represented by Formula 5g A monomer represented by Formula 5 g was prepared in an amount of 25 g in the same manner as in Monomer Preparation Example 1-1, except that 30 g of a compound represented by Formula 4 g was used instead of 30 g of the compound represented by Formula 4a (yield: 70%).

[Monomer Preparation Example 1-8] Preparation of Monomer Represented by Formula 5h A monomer represented by Formula 5h was prepared in an amount of 26 g in the same manner as in Monomer Preparation Example 1-1, except that 30 g of a compound represented by Formula 4h was used instead of 30 g of the compound represented by Formula 4a (yield: 87%).

[Monomer Preparation Example 2-1] Preparation of Monomer Represented by Formula 7a A monomer represented by Formula 7a was prepared in an amount of 22 g in the same manner as in Monomer Preparation Example 1-1, except that 30 g of a compound represented by Formula 6a was used instead of 30 g of the compound represented by Formula 4a (yield: 73%).

[Monomer Preparation Example 2-2] Preparation of Monomer Represented by Formula 7b A monomer represented by Formula 7b was prepared in an amount of 22 g in the same manner as in Monomer Preparation Example 1-1, except that 30 g of a compound represented by Formula 6b was used instead of 30 g of the compound represented by Formula 4a (yield: 73%).

[Monomer Preparation Example 3-1] Preparation of Monomer Represented by Formula 9a A monomer represented by Formula 9a was prepared in an amount of 20 g in the same manner as in Monomer Preparation Example 1-1, except that 30 g of a compound represented by Formula 8a was used instead of 30 g of the compound represented by Formula 4a (yield: 67%).

[Monomer Preparation Example 3-2] Preparation of Monomer Represented by Formula 9b A monomer represented by Formula 9b was prepared in an amount of 24 g in the same manner as in Monomer Preparation Example 1-1, except that 30 g of a compound represented by Formula 8b was used instead of 30 g of the compound represented by Formula 4a (yield: 80%).

[Monomer Preparation Example 3-3] Preparation of Monomer Represented by Formula 9c A monomer represented by Formula 9c was prepared in an amount of 24 g in the same manner as in Monomer Preparation Example 1-1, except that 30 g of a compound represented by Formula 8c was used instead of 30 g of the compound represented by Formula 4a (yield: 80%).

[Monomer Preparation Example 3-4] Preparation of Monomer Represented by Formula 9d A monomer represented by Formula 9d was prepared in an amount of 20 g in the same manner as in Monomer Preparation Example 1-1, except that 30 g of a compound represented by Formula 8d was used instead of 30 g of the compound represented by Formula 4a (yield: 67%).

[Polymer Preparation Example 1-1] Preparation of Polymer 1A

[Reaction Scheme 2]

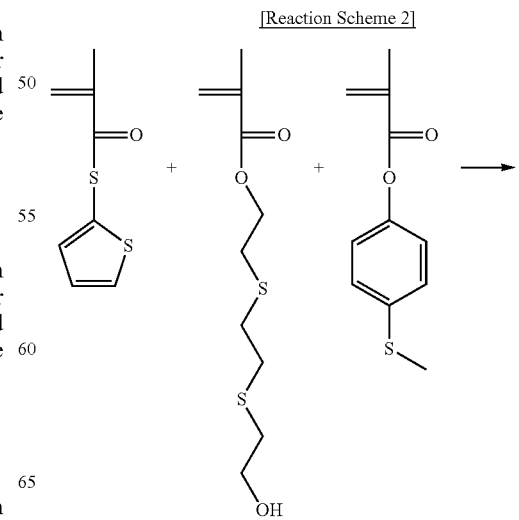

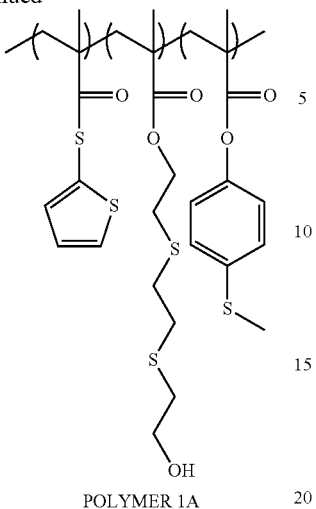

POLYMER 1A

As illustrated in Reaction Scheme 2, a magnet stirring bar was placed in a 500 ml 2-neck flask, and 12 g (0.067 mol) of a monomer represented by Formula 5a, 10 g (0.04 mol) of a monomer represented by Formula 7b, 5.5 g (0.027 mol) of a monomer represented by Formula 9a, and 1.4 g of an azobisisobutyronitrile (AIBN) initiator were added thereto, and dissolved in 140 g of tetrahydrofurane (THF). Then, while the reaction temperature was maintained at a temperature of 70° C., the reaction was performed for 15 hours. When the reaction stopped, the reaction product was precipitated in hexane, and vacuum-dried to obtain 20 g of Polymer 1A illustrated in Reaction Scheme 2 (yield: 72%).

[Polymer Preparation Example 1-2] Preparation of Polymer 1B

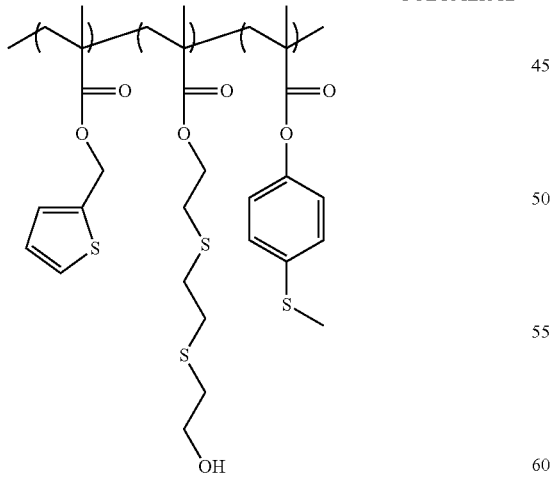

POLYMER 1B

Polymer 1B was prepared in an amount of 20 g in the same manner as in Monomer Preparation Example 1-1, except that 12 g of a compound represented by Formula 5b was used instead of the compound represented by Formula 5a (yield: 72%).

[Polymer Preparation Example 1-3] Preparation of Polymer 1C

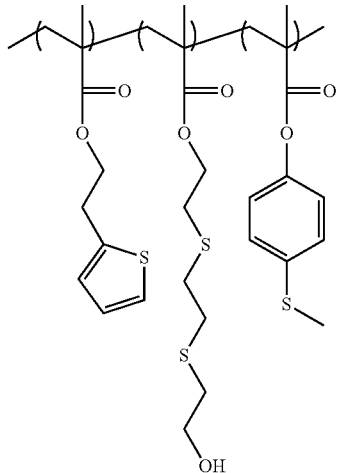

POLYMER 1C

Polymer 1C was prepared in an amount of 21 g in the same manner as in Monomer Preparation Example 1-1, except that 13 g of a compound represented by Formula 5c was used instead of the compound represented by Formula 5a (yield: 73%).

[Polymer Preparation Example 1-4] Preparation of Polymer 1D

POLYMER 1D

Polymer 1D was prepared in an amount of 23 g in the same manner as in Monomer Preparation Example 1-1, except that 14 g of a compound represented by Formula 5d was used instead of the compound represented by Formula 5a (yield: 77%).

[Polymer Preparation Example 1-5] Preparation of Polymer 1E

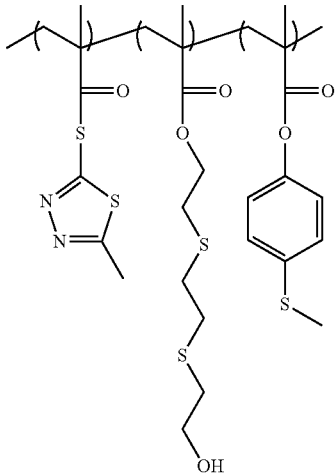

POLYMER 1E

Polymer 1E was prepared in an amount of 21 g in the same manner as in Monomer Preparation Example 1-1, except that 13 g of a compound represented by Formula 5e was used instead of the compound represented by Formula 5a (yield: 73%).

[Polymer Preparation Example 1-6] Preparation of Polymer 1F

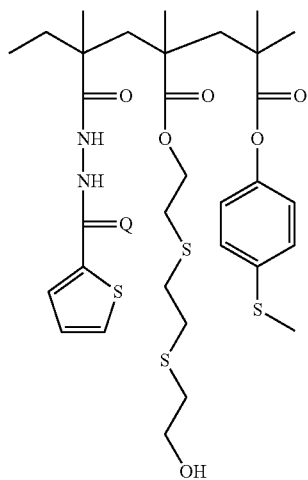

POLYMER 1F

Polymer 1F was prepared in an amount of 20 g in the same manner as in Monomer Preparation Example 1-1, except that 13 g of a compound represented by Formula 5f was used instead of the compound represented by Formula 5a (yield: 70%).

[Polymer Preparation Example 1-7] Preparation of Polymer 1G

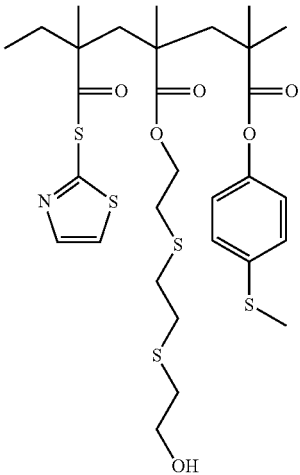

POLYMER 1G

Polymer 1G was prepared in an amount of 19 g in the same manner as in Monomer Preparation Example 1-1, except that 11 g of a compound represented by Formula 5g was used instead of the compound represented by Formula 5a (yield: 71%).

[Polymer Preparation Example 1-8] Preparation of Polymer 1H

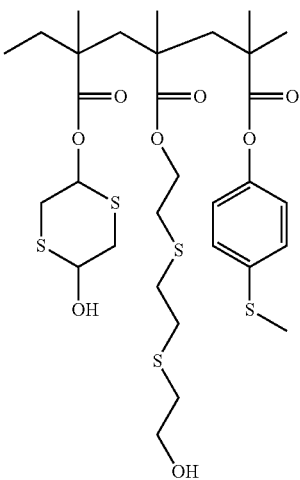

POLYMER 1H

Polymer 1H was prepared in an amount of 23 g in the same manner as in Monomer Preparation Example 1-1, except that 15 g of a compound represented by Formula 5h was used instead of the compound represented by Formula 5a (yield: 76%).

[Polymer Preparation Example 2-1] Preparation of Polymer 2A

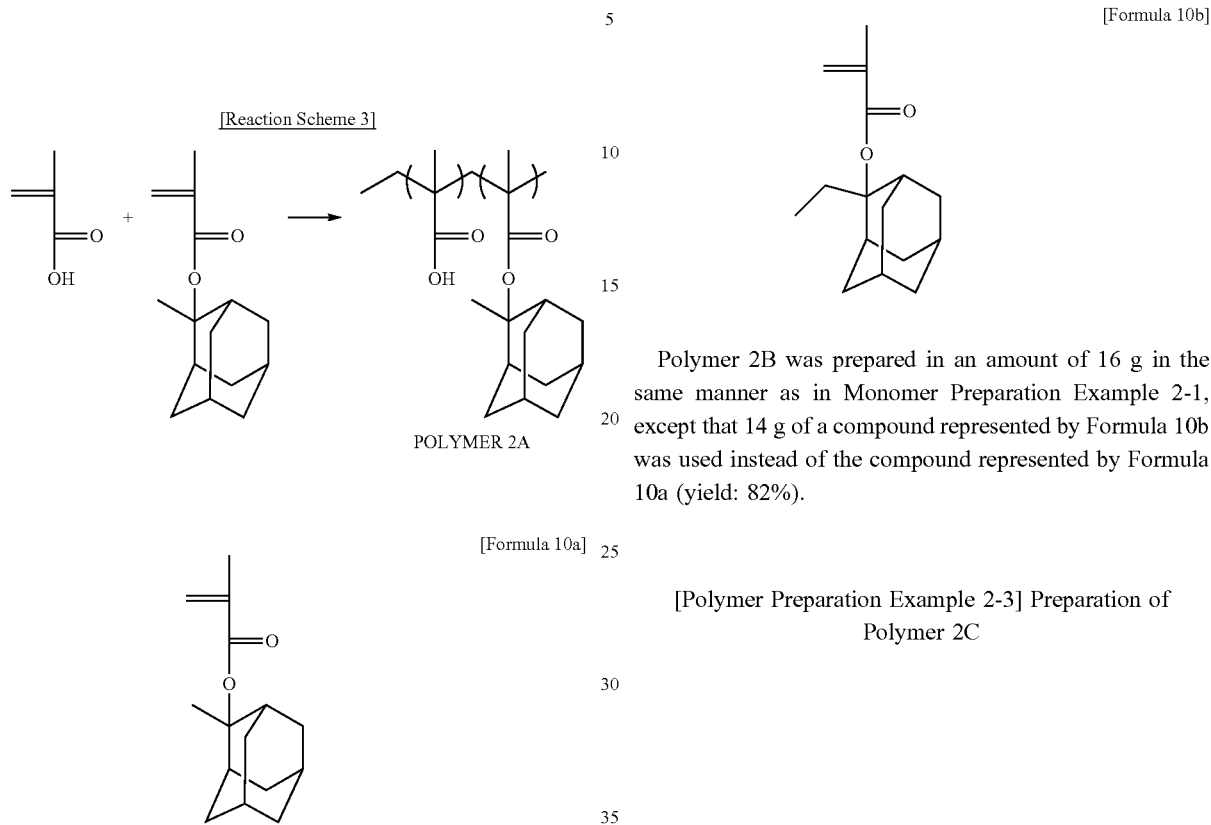

POLYMER 2A

[Formula 10a]

As illustrated in Reaction Scheme 3, a magnet stirring bar was added to a 500 ml 2-neck flask, and 5 g (0.058 mol) of a methacrylic acid (MAA), 13.5 g (0.058 mol) of a monomer represented by Formula 10a, and 1.2 g of azobisisobutyronitrile (AIBN) initiator were added thereto and dissolved in 80 g of tetrahydrofurane (THF). Then, while the reaction temperature was maintained at a temperature of 70° C., the reaction was performed for 15 hours. When the reaction stopped, the reaction product was precipitated in hexane, and vacuum-dried to obtain 15 g of Polymer 2A (yield: 80%).

[Polymer Preparation Example 2-2] Preparation of Polymer 2B

POLYMER 2B

[Formula 10b]

Polymer 2B was prepared in an amount of 16 g in the same manner as in Monomer Preparation Example 2-1, except that 14 g of a compound represented by Formula 10b was used instead of the compound represented by Formula 10a (yield: 82%).

[Polymer Preparation Example 2-3] Preparation of Polymer 2C

POLYMER 2C

[Formula 10c]

Polymer 2C was prepared in an amount of 13 g in the same manner as in Monomer Preparation Example 2-1, except that 11 g of a compound represented by Formula 10c was used instead of the compound represented by Formula 10a (yield: 83%).

[Polymer Preparation Example 2-4] Preparation of Polymer 2D

POLYMER 2D

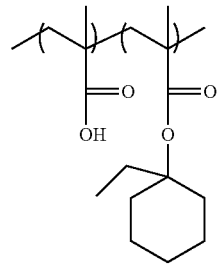

[Formula 10d]

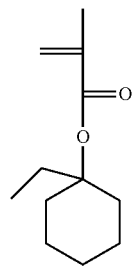

Polymer 2D was prepared in an amount of 13 g in the same manner as in Monomer Preparation Example 2-1, except that 14 g of a compound represented by Formula 10d was used instead of the compound represented by Formula 10a (yield: 79%).

[Polymer Preparation Example 3-1] Preparation of Polymer 3A

[Reaction Scheme 4]

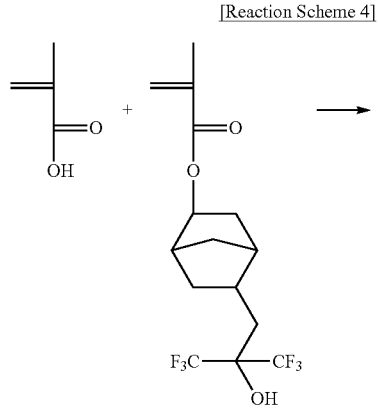

→

POLYMER 3A

[Formula 11a]

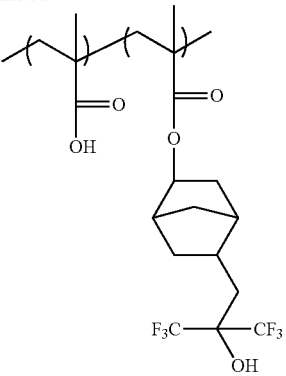

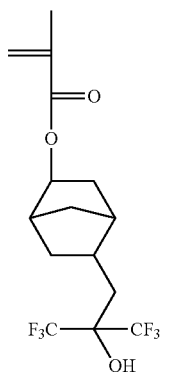

As illustrated in Reaction Scheme 4, a magnet stirring bar was added to a 500 ml 2-neck flask, and 5 g (0.058 mol) of a methacrylic acid (MAA), 20.9 g (0.058 mol) of a monomer represented by Formula 11a, and 1.2 g of azobisisobutyronitrile (AIBN) initiator were added thereto and dissolved in 80 g of tetrahydrofurane (THF). Then, while the reaction temperature was maintained at a temperature of 70° C., the reaction was performed for 15 hours. When the reaction stopped, the reaction product was precipitated in hexane, and vacuum-dried to obtain 13 g of Polymer 3B (yield: 50%).

[Polymer Preparation Example 3-2] Preparation of Polymer 3B

POLYMER 3B

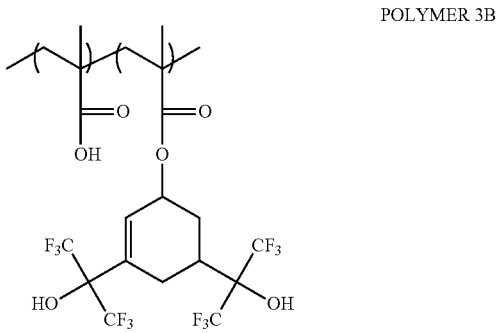

-continued

[Formula 11b]

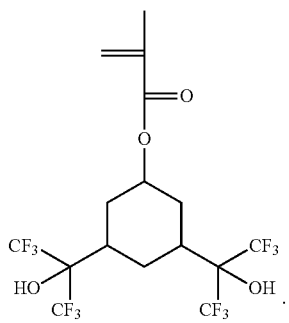

Polymer 3B was prepared in an amount of 18.5 g in the same manner as in Monomer Preparation Example 3-1, except that 29 g of a compound represented by Formula 11b was used instead of the compound represented by Formula 11a (yield: 54%).

[Composition Preparation Examples 4-1 to 4-8]
Preparation for Forming a Composition for Forming Organic Reflection-Preventing Film 0.1 g of a polymer for forming an organic reflection-preventing film (Polymer 1A to Polymer 1H), 0.06 g of a cross-linking agent, 0.01 g of a photo generator, and 0.01 g of an acid generator were dissolved in 13.7 g of propyleneglycol monomethyletheracetate (PGMEA), and then, the mixture was stirred to prepare a composition for forming an organic reflection-preventing film.

[Composition Preparation Examples 4-9 to 4-12]
Preparation for Forming a Composition for Forming Organic Reflection-Preventing Film Each of a mixture of 0.09 g of Polymer 1A and 0.01 g of Polymer 2A, a mixture of 0.09 g of Polymer 1A and 0.01 g of Polymer 2B, a mixture of 0.09 g of Polymer 1A and 0.01 g of Polymer 2C, and a mixture of 0.09 g of Polymer 1A and 0.01 g of Polymer 2D; 0.06 g of a cross-linking agent, 0.01 g of photogenerator, and 0.01 g of an acid generator were dissolved in 13.7 g of propyleneglycol monomethyletheracetate (PGMEA), and then stirred to form a composition for forming an organic reflection-preventing film. Herein, Polymer 1A and Polymer 2A to 2D are polymers for forming an organic reflection-preventing film.

[Composition Preparation Examples 4-13 to 4-16]
Preparation for Forming Composition for Forming Organic Reflection-Preventing Film Each of mixtures of Polymer 1A and Polymer 3A for forming an organic reflection-preventing film (0.09 g+0.01 g; 0.08 g+0.02 g; 0.07 g+0.03 g; and 0.06 g+0.04 g), 0.06 g of a cross-linking agent, and 0.01 g of an acid generator were dissolved in 13.7 g of propyleneglycol monomethyletheracetate (PGMEA), and then, the mixture was dissolved to prepare a composition for forming an organic reflection-preventing film.

[Composition Preparation Examples 4-17 to 4-20]
Preparation for Forming Composition for Forming Organic Reflection-Preventing Film Each of mixtures of Polymer 1A and Polymer 3B for forming an organic reflection-preventing film (0.09 g+0.01 g; 0.08 g+0.02 g; 0.07 g+0.03 g; and 0.06 g+0.04 g), 0.06 g of a cross-linking agent, and 0.01 g of an acid generator were dissolved in 13.7 g of propyleneglycol monomethyletheracetate (PGMEA), and then, the mixture was dissolved to prepare a composition for forming an organic reflection-preventing film.

[Thin Film Formation Example 5-1] Formation of Organic Reflection-Preventing Film The compositions for forming an organic reflection-preventing film prepared according to Composition Preparation Examples 4-1 to 4-12 were spin-coated on a to-be-etched film constituted of a silicon wafer and baked at a temperature of 205° C. for 60 seconds to form an organic reflection-preventing film having a thickness of about 230 Å. The formed organic reflection-preventing film was bulk-exposed by using an ArF exposing device and then developed using n-butyl acetate (nBA).

[Thin Film Formation Example 5-2] Formation of Organic Reflection-Preventing Film The compositions for forming an organic reflection-preventing film prepared according to Composition Preparation Examples 4-13 to 4-20 were spin-coated on a to-be-etched film constituted of a silicon wafer and baked at a temperature of 205° C. for 60 seconds to form an organic reflection-preventing film having a thickness of about 230 Å.

Evaluation Example 1

In the case of the organic reflection-preventing films formed according to Thin Film Formation Example 5-1, contact angles of an exposed portion and a non-exposed portion were measured. Results thereof are shown in Table 1.

Contact angles of samples of the organic reflection-preventing films were measured using a contact angle equipment (equipment name: ISA-100, manufacturer KRUSS). In this experiment, advancing contact angles of a non-exposed portion and an exposed portion were measured according to a general method disclosed in a reference (Burnett et al., J. Vac. Sci. Techn. B, 23(6), Pages 2721-2727 (November/December 2005)).

TABLE 1

| | | ADVANCING CONTACT ANGLE(°) | |
|---|---|---|---|
| | POLYMER | NON-EXPOSED PORTION | EXPOSED PORTION |
| PREPARATION EXAMPLE 4-1 | POLYMER 1A | 64 | 58 |
| PREPARATION EXAMPLE 4-2 | POLYMER 1B | 63 | 57 |
| PREPARATION EXAMPLE 4-3 | POLYMER 1C | 64 | 57 |
| PREPARATION EXAMPLE 4-4 | POLYMER 1D | 63 | 56 |
| PREPARATION EXAMPLE 4-5 | POLYMER 1E | 63 | 58 |
| PREPARATION EXAMPLE 4-6 | POLYMER 1F | 64 | 58 |
| PREPARATION EXAMPLE 4-7 | POLYMER 1G | 63 | 57 |
| PREPARATION EXAMPLE 4-8 | POLYMER 1H | 63 | 56 |

TABLE 1-continued

|  | POLYMER | ADVANCING CONTACT ANGLE(°) | |
|---|---|---|---|
|  |  | NON-EXPOSED PORTION | EXPOSED PORTION |
| PREPARATION EXAMPLE 4-9 | POLYMER 1A + POLYMER 2A | 59 | 53 |
| PREPARATION EXAMPLE 4-10 | POLYMER 1A + POLYMER 2B | 60 | 53 |
| PREPARATION EXAMPLE 4-11 | POLYMER 1A + POLYMER 2C | 61 | 54 |
| PREPARATION EXAMPLE 4-12 | POLYMER 1A + POLYMER 2D | 60 | 54 |

Evaluation Example 2

Contact angles of samples of the organic reflection-preventing films formed according to Thin Film Formation Example 5-1 were measured without being subjected to an exposing process, and results thereof are shown in Table 2. Contact angles were measured in the same manner as explained in connection with Evaluation Example 1.

TABLE 2

|  | POLYMER | ADVANCING CONTACT ANGLE(°) BEFORE EXPOSURE |
|---|---|---|
| PREPARATION EXAMPLE 4-13 | POLYMER 1A + POLYMER 3A (0.09 g + 0.01 g) | 87 |
| PREPARATION EXAMPLE 4-14 | POLYMER 1A + POLYMER 3A (0.08 g + 0.02 g) | 87 |
| PREPARATION EXAMPLE 4-15 | POLYMER 1A + POLYMER 3A (0.07 g + 0.03 g) | 88 |
| PREPARATION EXAMPLE 4-16 | POLYMER 1A + POLYMER 3A (0.06 g + 0.04 g) | 89 |
| PREPARATION EXAMPLE 4-17 | POLYMER 1A + POLYMER 3B (0.09 g + 0.01 g) | 83 |
| PREPARATION EXAMPLE 4-18 | POLYMER 1A + POLYMER 3B (0.08 g + 0.02 g) | 84 |
| PREPARATION EXAMPLE 4-19 | POLYMER 1A + POLYMER 3B (0.07 g + 0.03 g) | 84 |
| PREPARATION EXAMPLE 4-20 | POLYMER 1A + POLYMER 3B (0.06 g + 0.04 g) | 85 |

Evaluation Example 3

Figure 9:
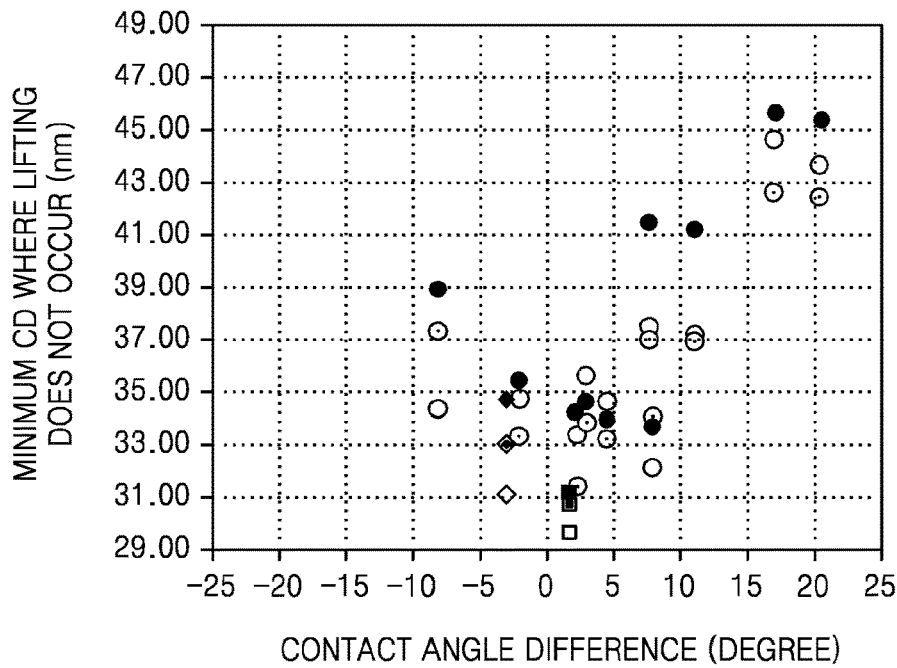
FIG. 9 is a graph showing minimum critical dimension (CD) values where lifting of a photoresist pattern does not occur after exposing and development present processes in a method of forming patterns according to embodiments of the disclosure, according to the difference between a contact angle of an organic reflection-preventing film and a contact angle of a photoresist film.

FIG. 9 shows minimum critical dimension (CD) measurements where lifting of a photoresist pattern does not occur after exposing and development processes in a method of forming pattern according to embodiments of the present disclosure, according to the difference between a contact angle of an organic reflection-preventing film and a contact angle of a photoresist film.

For the evaluation shown in FIG. 9, each of the photoresist film and the organic reflection-preventing film was subjected to an exposing process using an ArF eximer laser (193 nm) and then a development process using n-butyl acetate (nBA), and contact angles of the photoresist film and the organic reflection-preventing film with respect to deionized water were measured.

To vary the contact angles of the photoresist film and the organic reflection-preventing film, a source composition content ratio of each of the photoresist film and the organic reflection-preventing film was variably adjusted.

For the evaluation shown in FIG. 9, a photoresist pattern having a line-and-space pattern shape having a varying pitch was formed on each of the organic reflection-preventing films formed according to Thin Film Formation Examples 5-1 and 5-2.

With respect to a line end space photoresist pattern having a pitch of 76 nm (○), 80 nm (◉), or 90 nm (●) on samples A of some of the organic reflection-preventing films formed according to Thin Film Formation Examples 5-1 and 5-2 at varying contact angles of a photoresist film and an organic reflection-preventing film, minimum CD values where lifting of the photoresist pattern does not occur after exposing and development processes were measured according to the difference between a contact angle of the organic reflection-preventing film and a contact angle of the photoresist film.

Similarly, with respect to a line end space photoresist pattern having a pitch of 76 nm (◇), 80 nm (◆), or 90 nm (♦) on samples B of some of the organic reflection-preventing films formed according to Thin Film Formation Examples 5-1 and 5-2, minimum CD values where lifting of the photoresist pattern does not occur were measured according to the difference between a contact angle of the organic reflection-preventing film and a contact angle of the photoresist film. With respect to a line end space photoresist pattern having a pitch of 76 nm (□), 80 nm (▣), or 90 nm (■) on samples C of some of the organic reflection-preventing films formed according to Thin Film Formation Examples 5-1 and 5-2, minimum CD values where lifting of the photoresist pattern does not occur were measured according to the difference between a contact angle of the organic reflection-preventing film and a contact angle of the photoresist film.

From the results shown in FIG. 9, it was confirmed that the smaller the difference between the contact angle of an organic reflection-preventing film and the contact angle of a photoresist film is the smaller the CD value. For example, to embody a fine pattern having smaller CD, the difference between a contact angle of an organic reflection-preventing film and a contact angle of a photoresist film may be controlled to be between about −5° to +5° or even to be between about −3° and about +3°. It should be noted, however, that improved critical dimensions may also be achieved at larger contact angle differences, such as less than about 10 degrees.

Evaluation Example 4

Figure 10:
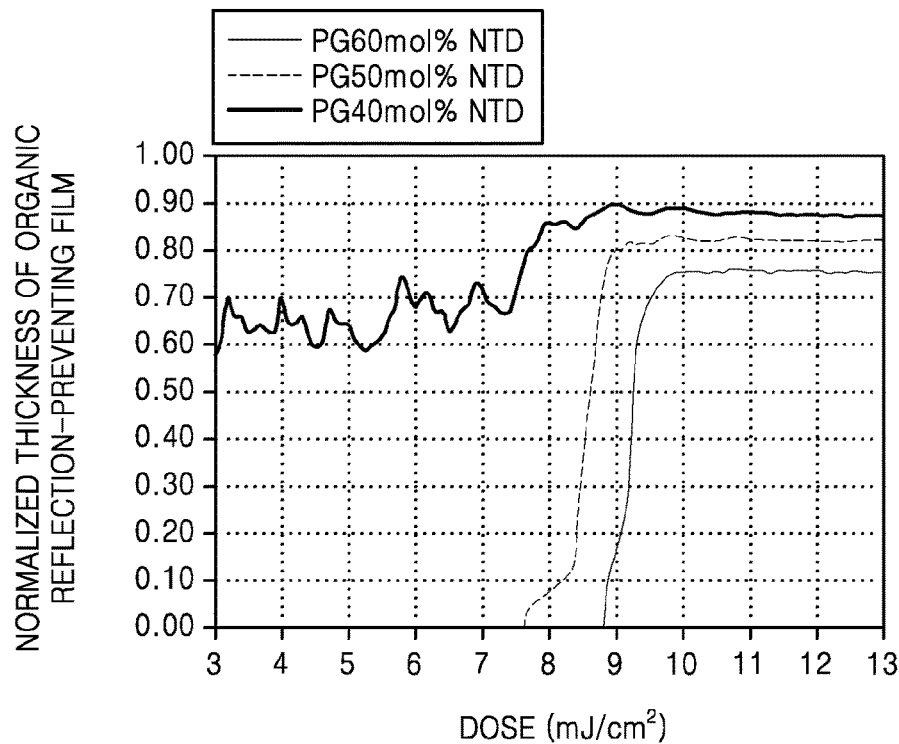
FIG. 10 is a graph of a removal rate of an organic reflection-preventing film used in methods of forming patterns according to embodiments of the present disclosure with respect to a developer.

FIG. 10 is a graph of a removal rate of an organic reflection-preventing film used in methods of forming patterns according to embodiments of the present disclosure with respect to a developer, evaluated in consideration of a photoresist film. The region of relatively low dose (for example, the region of about 3 mJ/cm$^2$ through about 8 mJ/cm$^2$) may correspond to a non-exposed area, and the region of relatively high dose (for example, the region of about 8 mJ/cm$^2$ through about 13 mJ/cm$^2$) may correspond to an exposed area.

For the evaluation of FIG. 10, an organic reflection-preventing film sample D having 60 mol % of a repeating unit including an acid-labile group ("PG 60 mol % NTD"), an organic reflection-preventing film sample E ("PG 50 mol % NTD") having 50 mol % of the repeating unit, and an organic reflection-preventing film sample F ("PG 40 mol % NTD") having 40 mol % of the repeating unit, based on a total polymer amount of an organic reflection-preventing film, were each developed by using n-butyl acetate (nBA), which is a negative tone developer, and the remaining thickness for each was measured. The y-axis of FIG. 10, i.e. normalized thickness of organic reflection-preventing film, provides examples of a remaining thickness of each of the organic reflection-preventing film samples D, E, and F after development of a photoresist film using n-butyl acetate (nBA). FIG. 10 provides an example of at least a portion of the organic reflection-preventing film sample F indicated as "PG 40 mol % NTD" that remains in the non-exposed area after the development of the photoresist film by virtue of its substantially low solubility with respect to a negative tone developer nBA.

Referring to results shown in FIG. 10, it was confirmed that the organic reflection-preventing film sample F in which the amount of the repeating unit including an acid-labile group is 40 mol % based on the total polymer amount of an organic reflection-preventing film, compared to other samples having higher amounts of the repeating unit including an acid-labile group, has a substantially low solubility with respect to a developer so that only a portion of the surface thereof is removed although the organic reflection-preventing film samples D and E were completely removed by using the developer.

As confirmed in FIG. 10, when a photoresist film is developed to form a photoresist pattern, even when a portion of an organic reflection-preventing film disposed under the photoresist film exposed by the photoresist pattern contacts the developer, the exposed portion may remain. Accordingly, in addition to the step formed by the photoresist pattern, an additional step corresponding to a thickness of the organic reflection-preventing film may not be formed. Thus, the collapse of patterns due to the increase in an aspect ratio during a development process may be prevented.

Figure 11:
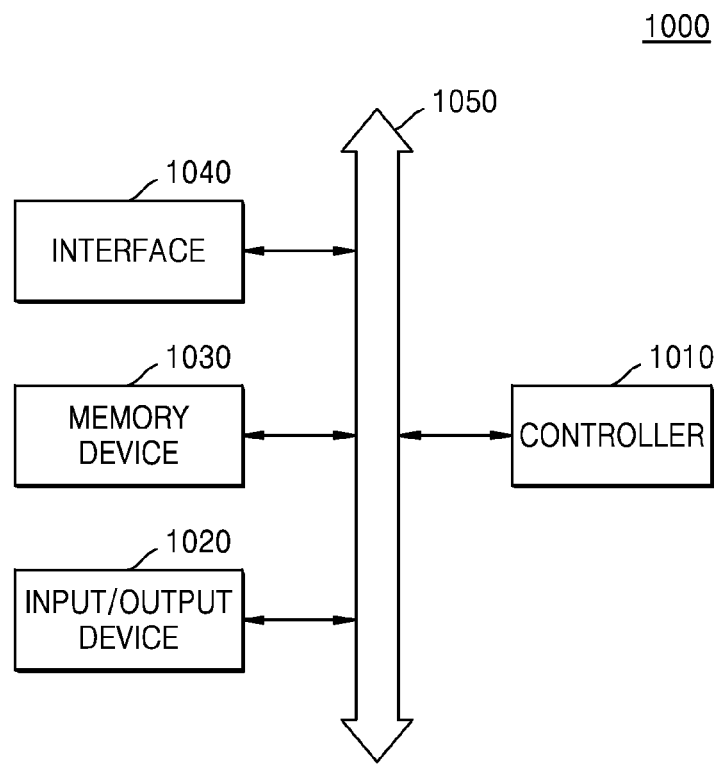
FIG. 11 is a schematic view of a system including an integrated circuit device according to exemplary embodiments of the present disclosure.

FIG. 11 is a block diagram of a system 1000, according to an example embodiment of the present disclosure.

The system 1000 includes a controller 1010, an input/output device 1020, a memory device 1030, and an interface unit 1040. The system 1000 may be a mobile system and/or a system that transmits or receives information. In some embodiments, the mobile system is a personal digital assistant (PDA), a portable computer, a web tablet, a wireless phone, a mobile phone, a digital music player, a memory card, and the like. The controller 1010 for controlling an execution program of the system 1000 may be at least one microprocessor, a digital signal processor, a microcontroller, or a similar device. The input/output device 1020 may be used to input or output data of the system 1000. The system 1000 may be connected to an external device, for example, a personal computer (PC) or a network, and may exchange data with the external device, by using the input/output device 1020. The input/output device 1020 may be, for example, a keypad, a keyboard, or a display device.

The memory device 1030 may store codes and/or data for operating the controller 1010, or store data processed by the controller 1010. The memory device 1030 may include at least one integrated circuit device that is obtained by using a method of forming patterns or a method of manufacturing an integrated circuit device according as described herein. For example, the memory device 1030 includes at least one integrated circuit device obtained by using any one of methods of forming patterns explained in connection with FIGS. 1A to 1C and 2A to 2G or any one of methods of manufacturing an integrated circuit device explained in connection with FIGS. 4 and 8A to 8O.

The interface unit 1040 may be a data transmission path between the system 1000 and an external device. The controller 1010, the input/output device 1020, the memory device 1030, and the interface unit 1040 may communicate with one another via a bus 1050. The system 1000 may be a mobile phone, an MP3 player, a navigation system, a portable multimedia player (PMP), a solid-state disk (SSD), a household appliance, and the like.

Figure 12:
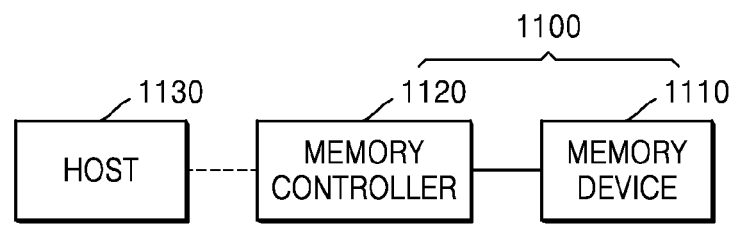
FIG. 12 is a schematic view of a memory card including an integrated circuit device according to exemplary embodiments of the present disclosure.

FIG. 12 is a block diagram of a memory card 1100, according to an embodiment of the present disclosure.

The memory card 1100 may include a memory device 1110 and a memory controller 1120.

The memory device 1110 may store data. In some embodiments, the memory device 1110 may have nonvolatile characteristics and thus may retain stored data even when power supply thereto is cut off. The memory device 1110 may include at least one integrated circuit device that is obtained by using a method of forming patterns or a method of manufacturing an integrated circuit device as described herein. For example, the memory device 1110 includes at least one integrated circuit device obtained by using any one of methods of forming patterns explained in connection with FIGS. 1A to 1C and 2A to 2G or any one of methods of manufacturing an integrated circuit device explained in connection with FIGS. 4 and 8A to 8O.

The memory controller 1120 may read data from the memory device 1110 or write data to the memory device 1110 in response to a read/write request of a host 1130. The memory controller 1120 includes at least one integrated circuit device manufactured by using methods described herein. For example, the memory controller 1120 includes at least one integrated circuit device obtained by using any one of methods of forming patterns explained in connection with FIGS. 1A to 1C and 2A to 2G or any one of methods of manufacturing an integrated circuit device explained in connection with FIGS. 4 and 8A to 8O.

While the present disclosure has been particularly shown and described with reference to exemplary embodiments thereof, it will be understood that various changes in form and details may be made therein without departing from the spirit and scope of the following claims.

What is claimed is:

1. A method of manufacturing patterns, the method comprising:
    forming an organic reflection-preventing film, comprising a polymer having an acid-labile group, on a target layer,
    forming a photoresist film comprising a photoacid generator (PAG) on the organic reflection-preventing film,
    selectively exposing the photoresist film to a light source including exposing at least a first area of the photoresist film to the light source while not exposing at least a second area of the photoresist film to the light source to generate an acid in the first area, thereby increasing hydrophilicity of a first surface of the organic reflection-preventing film facing the first area of the photoresist film using the acid,
    developing the photoresist film having the exposed first area to remove the second area of the photoresist film therefrom, and
    anisotropically etching the organic reflection-preventing film and the target layer by using the first area of the photoresist film as an etch mask,
    wherein after the developing, a bottom surface of the photoresist film has a first contact angle with respect to deionized water and the first surface of the organic reflection-preventing film has a second contact angle with respect to deionized water, and
    wherein a difference between the first contact angle and the second contact angle is in a range of −3° to +3°.

2. The method of claim 1, wherein
the increasing of hydrophilicity of the first surface comprises deprotecting the polymer by removing the acid-labile group at the first surface of the organic reflection-preventing film by using an acid generated from the PAG.

3. The method of claim 1, wherein
the developing comprises using a negative tone developer to remove the second area of the photoresist film.

4. The method of claim 1, wherein
the polymer of the organic reflection-preventing film comprises a repeating unit comprising an acrylate derivative having the acid-labile group.

5. The method of claim 1, wherein
the polymer of the organic reflection-preventing film comprises a repeating unit having the acid-labile group, and
an amount of the repeating unit having the acid-labile group is in a range of 1 to 40 mol % based on a total amount of the polymer.

6. The method of claim 1, wherein
the organic reflection-preventing film comprises a second polymer having a protecting group substituted with fluorine.

7. The method of claim 1, wherein
the exposing is performed by immersion lithography.

8. The method of claim 1, wherein
in the developing of the photoresist film, at least a portion of a portion of the organic reflection-preventing film under the second area of the photoresist film is not removed by the developing.

9. The method of claim 1, wherein
after the developing of the photoresist film, prior to the anisotropic etching of the organic reflection-preventing film and the target layer using the first area of the photoresist film as a mask, the target layer is completely covered by the organic reflection-preventing film so that an upper surface of the target layer is not exposed to an outside atmosphere.

10. A method of manufacturing patterns, the method comprising:
forming an organic reflection-preventing film comprising a first polymer having an acid-labile group on a target layer,
forming a photoresist film on the organic reflection-preventing film,
selectively exposing at least a first area of the photoresist film to a light source while not exposing at least a second area of the photoresist film to the light source and increasing hydrophilicity of a first surface of the organic reflection-preventing film facing the first area of the photoresist film, and
forming an opening exposing a portion of the organic reflection-preventing film by removing a second area of the photoresist film,
wherein after the hydrophilicity of the first surface of the organic reflection-preventing film is increased, a first contact angle of the first surface of the organic reflection-preventing film with respect to deionized water and a second contact angle of a bottom surface of the photoresist film with respect to deionized water differ no more than five degrees.

11. The method of claim 10, wherein
the increasing of hydrophilicity in the first surface comprises deprotecting the first polymer by removing the acid-labile group from the first polymer of the organic reflection-preventing film.

12. The method of claim 10,
wherein the first polymer of the organic reflection-preventing film is represented by

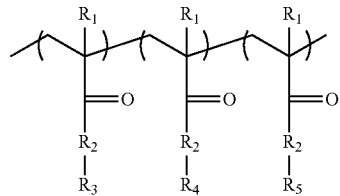

and
wherein the organic reflection-preventing film further comprises a second polymer represented by

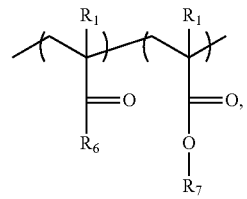

wherein $R_1$ is a hydrogen (H) or a methyl group (—$CH_3$),
$R_2$ is S, O, or NH,
$R_3$ is a heterocyclic group comprising sulfur (S),
$R_4$ is a hydroxyl group (—OH),
$R_5$ is a phenyl group,
$R_6$ is a hydroxyl group (—OH) or a methoxy group (—$OCH_3$), and
$R_7$ is a deprotecting group obtained from at least one of the following monomers represented by

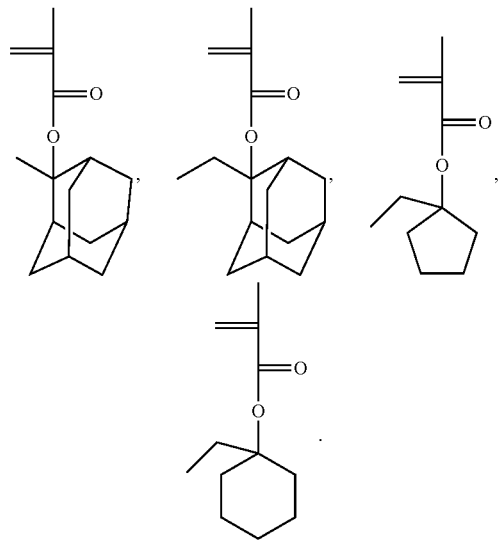

13. The method of claim 12,
wherein the organic reflection-preventing film further comprises a third polymer represented by

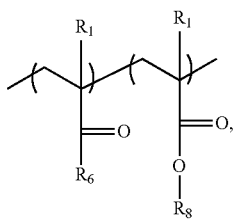

wherein $R_8$ is a fluoro group.

14. The method of claim 12, wherein the first polymer is prepared to form an organic reflection-preventing film, the preparation comprising:
   a first reaction process, wherein a heterocyclic compound containing sulfur (S) is reacted with (meth)acrylic acid or (meth)acrylic acid halide to obtain an unsaturated ethylene monomer including R2 and R3;
   a second reaction process, wherein a compound having a hydroxyl group (—OH) is reacted with (meth)acrylic acid or (meth)acrylic acid halide to obtain an unsaturated ethylene monomer having R2 and R4; and
   a third reaction process, wherein a compound having a phenyl group is reacted with (meth)acrylic acid or (meth)acrylic acid halide to obtain an unsaturated ethylene monomer having R2 and R5.

15. The method of claim 12,
wherein the organic reflection-preventing film further comprises a third polymer obtained from at least one of the following monomers represented by

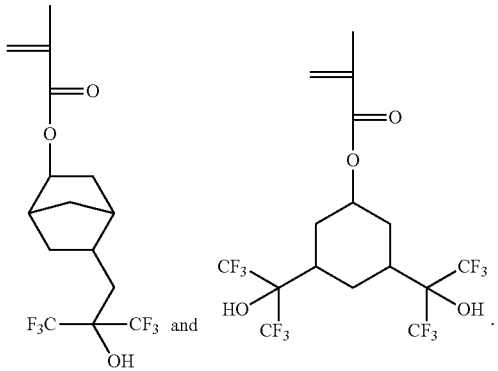 [SMILES: C=C(C)C(=O)OC1CC2CC1CC2CC(O)(C(F)(F)F)C(F)(F)F ; "and" ; C=C(C)C(=O)OC1CC(C(O)(C(F)(F)F)C(F)(F)F)CC(C(O)(C(F)(F)F)C(F)(F)F)C1 ; "."]

16. The method of claim 10, wherein
an amount of the first polymer comprising the acid-labile group in the organic reflection-preventing film is in a range of 1 to 40 mol % based on a total polymer amount of the organic reflection-preventing film.

17. The method of claim 10, wherein
in the forming of the opening, a negative tone developer is used to remove the second area of the photoresist film, and
the organic reflection-preventing film has a first solubility with respect to the negative tone developer, and the first solubility is smaller than a second solubility of the photoresist film with respect to the negative tone developer.

18. A method of manufacturing patterns, the method comprising:
   forming an organic reflection-preventing film comprising an acid-labile group on a target layer,
   forming a photoresist film covering the organic reflection-preventing film,
   changing hydrophilicity of at least a surface of a first portion of the organic reflection-preventing film in such a way that the hydrophilicity of the surface of the first portion is different from hydrophilicity of a surface of a second portion of the organic reflection-preventing film, by exposing the first portion of the photoresist film to a light source while not exposing the second portion of the photoresist film to the light source,
   forming an opening exposing the organic reflection-preventing film by using a developer to remove a second area of the photoresist film, and
   anisotropically etching the organic reflection-preventing film and the target layer through the opening,
   wherein after the hydrophilicity of the surface of the first portion of the organic reflection-preventing film is increased, a first contact angle of the surface of the first portion of the organic reflection-preventing film with respect to deionized water and a second contact angle of a bottom surface of the photoresist film with respect to deionized water differ no more than five degrees.

19. The method of claim 18, wherein
in the changing of hydrophilicity of the surface of the first portion, hydrophilicity of the surface of the first portion increases.

20. The method of claim 18, wherein
the changing of hydrophilicity of the surface of the first portion comprises deprotecting the surface of the first portion of the organic reflection-preventing film by using an acid generated from the photoresist film by exposing the first portion of the photoresist film.

21. The method of claim 20, wherein
the photoresist film includes a resin having a polarity that increases due to an action of the acid.

22. The method of claim 18, wherein the organic reflection-preventing film comprises:
   a polymer having a first repeating unit having an acid-labile group, and
   a polymer having a second repeating unit having an acrylate derivative substituent.

23. The method of claim 22, wherein the organic reflection-preventing film further comprises a cross-linking agent.

24. The method of claim 22, wherein the organic reflection-preventing film further comprises at least one of:
   a polymer having a third repeating unit having a protecting group substituted with a fluorine, and
   a polymer having a fourth repeating unit having a chromophore group having an aromatic group.

25. A method of manufacturing an integrated circuit device, the method comprising:
   forming a target layer on a substrate having an active area,
   forming a mask layer on the target layer,
   forming a reflection-preventing film on the mask layer,
   forming a photoresist film on an upper surface of the reflection-preventing film, the upper surface of the reflection-preventing film comprising at least a first surface portion and a second surface portion,
   changing a hydrophilicity of the first surface portion of the upper surface of the reflection-preventing film in such a way that the hydrophilicity of the first surface portion is different from hydrophilicity of the second surface portion of the reflection-preventing film by exposing at least a first area of the photoresist film above the first surface portion to a light source while not exposing a second area of the photoresist film above the second surface portion to the light source, removing the second area of the photoresist film by using a developing solution to form a photoresist pattern exposing the reflection-preventing film, and forming a fine pattern from the target layer by anisotropically etching the exposed reflection-preventing film and the target layer by using the photoresist pattern as an etch mask, wherein after changing the hydrophilicity of the first surface portion of the upper surface of the reflection-preventing film, a first contact angle of the first surface portion of the upper surface of the reflection-preventing film with respect to deionized water and a second contact angle of a bottom surface of the photoresist film with respect to deionized water differ no more than five degrees.

26. The method of claim 25, wherein the changing of hydrophilicity of the first surface portion is in such a way that the hydrophilicity of the first surface portion is different from hydrophilicity of the second surface portion of the reflection-preventing film by exposing the first area of the photoresist film.

27. The method of claim 25, wherein
the photoresist film comprises a photoacid generator (PAG), and
the reflection-preventing film comprises an organic reflection-preventing film comprising a polymer having an acid-labile group.

28. The method of claim 27, wherein
the changing of hydrophilicity of the first surface portion comprises
increasing hydrophilicity of the first surface portion by deprotecting the acid-labile group in the first surface portion by using an acid generated in the first area by exposing the photoresist film.

29. The method of claim 28, wherein the increasing of hydrophilicity of the first surface portion results in a hydrophilicity more similar to that of the first area of the photoresist film as compared to prior to the increasing.

30. The method of claim 27, wherein the reflection-preventing film further comprises an inorganic reflection-preventing film.

31. The method of claim 25, wherein
in the forming of the fine pattern, a conductive fine pattern having a line-and-space pattern shape is formed.

32. The method of claim 25, wherein
the forming of the fine pattern comprises forming a conductive fine pattern having a hole exposing the active area, and
after the formation of the conductive fine pattern, filling the hole with a conductive layer to form a contact connected to the active area.

33. A method of manufacturing an integrated circuit device, the method comprising:
forming a bottom antireflective coating (BARC) on a target layer of the integrated circuit device, the BARC comprising an upper surface including a first surface portion and a second surface portion;
forming a photoresist film including a photoacid generator on the BARC, the photoresist film including a first area over the first surface portion of the BARC and a second area over the second surface portion of the BARC;
exposing at least the first area of the photoresist film to light to generate an acid to improve an adhesiveness between the first surface portion and the photoresist film while not exposing at least the second area of the photoresist film under the second area of the photoresist film;
removing at least the second area of the photoresist film outside the first area by using a negative tone developer to expose the second surface portion of the BARC thereby forming a photoresist pattern; and
patterning the target layer by etching the second surface portion and the target layer using the photoresist pattern as an etching mask,
wherein after exposing the first area of the photoresist film to light, a first contact angle of the first surface portion of the upper surface of the BARC with respect to deionized water and a second contact angle of a bottom surface of the photoresist film with respect to deionized water differ no more than five degrees.

34. The method of claim 33, wherein target layer comprises a hard mask layer.

35. The method of claim 33, wherein the BARC comprises:
a polymer including a repeating unit comprising an acrylate derivative having an acid-labile group.

36. The method of claim 33, wherein the BARC comprises:
a first polymer including a repeating unit with an acid-labile group, an amount of the repeating unit being in a range of 1 to 40 mol % based on a total polymer amount of the BARC.

37. The method of claim 36, wherein the BARC comprises a protecting group substituted with fluorine either as part of the first polymer or as part of a second polymer.

* * * * *